US011688793B2

(12) United States Patent
Lu et al.

(10) Patent No.: US 11,688,793 B2
(45) Date of Patent: Jun. 27, 2023

(54) INTEGRATED CIRCUIT STRUCTURE AND MANUFACTURING METHOD THEREOF

(71) Applicant: TAIWAN SEMICONDUCTOR MANUFACTURING COMPANY, LTD., Hsinchu (TW)

(72) Inventors: Wei-Hao Lu, Taoyuan (TW); Chien-I Kuo, Chiayi County (TW); LI-Li Su, Hsinchu County (TW); Wei-Yang Lee, Taipei (TW); Yee-Chia Yeo, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 75 days.

(21) Appl. No.: 17/225,786

(22) Filed: Apr. 8, 2021

(65) Prior Publication Data

US 2022/0328657 A1 Oct. 13, 2022

(51) Int. Cl.

| H01L 29/161 | (2006.01) |
|---|---|
| H01L 27/092 | (2006.01) |
| H01L 29/66 | (2006.01) |
| H01L 29/423 | (2006.01) |
| H01L 29/786 | (2006.01) |
| H01L 21/8234 | (2006.01) |
| H01L 29/417 | (2006.01) |
| H01L 29/40 | (2006.01) |

(52) U.S. Cl.
CPC ........... *H01L 29/66636* (2013.01); *H01L 21/823418* (2013.01); *H01L 21/823475* (2013.01); *H01L 29/401* (2013.01); *H01L 29/41733* (2013.01); *H01L 29/42392* (2013.01); *H01L 29/66545* (2013.01); *H01L 29/78696* (2013.01)

(58) Field of Classification Search
None
See application file for complete search history.

(56) References Cited

U.S. PATENT DOCUMENTS

| 9,209,247 B2 | 12/2015 | Colinge et al. |
|---|---|---|
| 9,236,267 B2 | 1/2016 | De et al. |
| 9,412,817 B2 | 8/2016 | Yang et al. |
| 9,412,828 B2 | 8/2016 | Ching et al. |
| 9,472,618 B2 | 10/2016 | Oxland |

(Continued)

*Primary Examiner* — Joseph C. Nicely
*Assistant Examiner* — Lamont B Koo
(74) *Attorney, Agent, or Firm* — Maschoff Brennan

(57) ABSTRACT

A method for manufacturing an integrated circuit (IC) structure is provided. The method includes: etching a first recess and a second recess in a substrate; forming a sacrificial epitaxial plug in the first recess in the substrate; forming a first epitaxial feature and a second epitaxial feature respectively in the first recess and the second recess, wherein the first epitaxial feature is over the sacrificial epitaxial plug; forming a first source/drain epitaxial structure and a second source/drain epitaxial structure over the first epitaxial feature and the second epitaxial feature respectively; forming a gate structure laterally between the first source/drain epitaxial structure and the second source/drain epitaxial structure; removing the sacrificial epitaxial plug and the first epitaxial feature to form a backside via opening exposing a backside of the first source/drain epitaxial structure; and forming a backside via in the backside via opening.

20 Claims, 41 Drawing Sheets

(56) References Cited

U.S. PATENT DOCUMENTS

| | | |
|---|---|---|
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 2021/0035975 A1* | 2/2021 | Kim ................ H01L 21/823418 |

* cited by examiner

INTEGRATED CIRCUIT STRUCTURE AND MANUFACTURING METHOD THEREOF

BACKGROUND

The electronics industry has experienced an ever increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far, these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
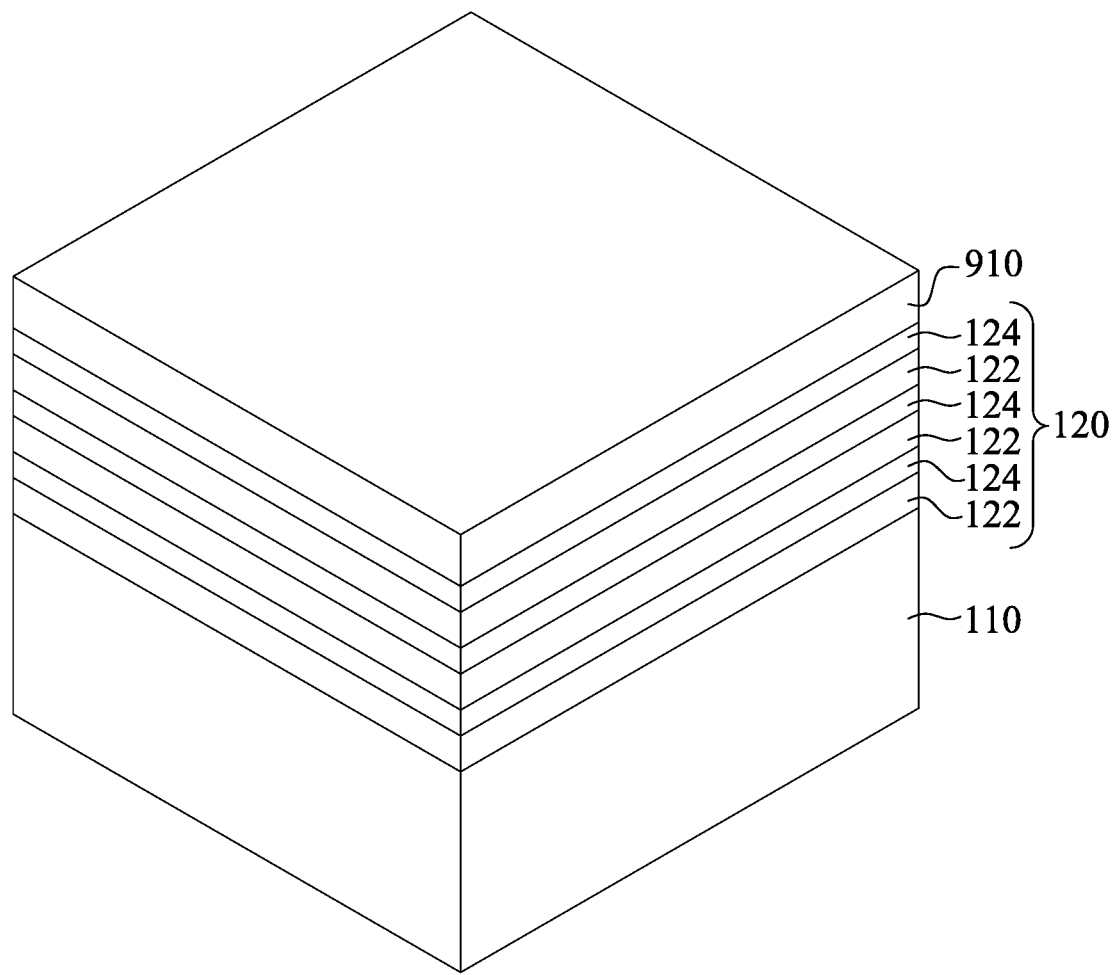
FIGS. 1 to 26 illustrate a semiconductor device at various stages of manufacturing in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Embodiments of the present disclosure are related to integrated circuit structures and methods of forming the same, and more particularly to fabricating gate-all-around (GAA) transistors with backside vias below source regions and/or drain regions of the GAA transistors. It is also noted that the present disclosure presents embodiments in the form of multi-gate transistors. Multi-gate transistors include those transistors whose gate structures are formed on at least two-sides of a channel region. These multi-gate devices may include a p-type metal-oxide-semiconductor device or an n-type metal-oxide-semiconductor device. Specific examples may be presented and referred to herein as FINFET, on account of their fin-like structure. Also presented herein are embodiments of a type of multi-gate transistor referred to as a gate-all-around (GAA) device. A GAA device includes any device that has its gate structure, or portion thereof, formed on 4-sides of a channel region (e.g., surrounding a portion of a channel region). Devices presented herein also include embodiments that have channel regions disposed in nanosheet channel(s), nanowire channel(s), and/or other suitable channel configuration. Presented herein are embodiments of devices that may have one or more channel regions (e.g., nanosheets) associated with a single, contiguous gate structure. However, one of ordinary skill would recognize that the teaching can apply to a single channel (e.g., single nanosheet) or any number of channels. One of ordinary skill may recognize other examples of semiconductor devices that may benefit from aspects of the present disclosure.

As scales of the fin width in fin field effect transistors (FinFET) decreases, channel width variations might cause mobility loss. GAA transistors, such as nanosheet transistors are being studied as an alternative to fin field effect transistors. In a nanosheet transistor, the gate of the transistor is made all around the channel (e.g., a nanosheet channel or a nanowire channel) such that the channel is surrounded or encapsulated by the gate. Such a transistor has the advantage of improving the electrostatic control of the channel by the gate, which also mitigates leakage currents.

In order to create more routing space for an integrated circuit (IC) structure having a large number of GAA transistors, backside power rails connected to backside of source regions of GAA transistors using backside metal vias are being studied as an alternative to front-side power rails formed on front-side of source regions of transistors.

FIGS. 1-6A are perspective views of an integrated circuit structure having multi-gate devices at intermediate stages of a manufacturing method in accordance with some embodiments of the present disclosure. FIGS. 6B-25 are cross-sectional views of the integrated circuit structure at intermediate stages of the manufacturing method along a first cut (e.g., cut X-X in FIG. 6A), which is along a lengthwise direction of the channel and perpendicular to a top surface of the substrate. FIG. 17B is a cross-sectional view of some embodiments of the integrated circuit structure at intermediate stages of the manufacturing method along a second cut (e.g., cut Y-Y in FIG. 6A), which is in the gate region and perpendicular to the lengthwise direction of the channel.

As used herein, the term "multi-gate device" is used to describe a device (e.g., a semiconductor transistor) that has at least some gate material disposed on multiple sides of at least one channel of the device. In some examples, the multi-gate device may be referred to as a GAA device or a nanosheet device having gate material disposed on at least four sides of at least one channel of the device. The channel region may be referred to as a "nanowire," which as used herein includes channel regions of various geometries (e.g., cylindrical, bar-shaped) and various dimensions.

As with the other method embodiments and exemplary devices discussed herein, it is understood that parts of the integrated circuit structure may be fabricated by a CMOS technology process flow, and thus some processes are only briefly described herein. Further, the exemplary integrated circuit structure may include various other devices and features, such as other types of devices such as additional transistors, bipolar junction transistors, resistors, capacitors, inductors, diodes, fuses, static random access memory (SRAM) and/or other logic circuits, etc., but is simplified for a better understanding of the concepts of the present disclosure. In some embodiments, the exemplary integrated circuit structure includes a plurality of semiconductor devices (e.g., transistors), including PFETs, NFETs, etc., which may be interconnected. Moreover, it is noted that the manufacturing method, including any descriptions given with reference to FIGS. 1-26, as with the remainder of the method and exemplary figures provided in this disclosure, are merely exemplary and are not intended to be limiting beyond what is specifically recited in the claims that follow.

Referring to FIG. 1, where one or more epitaxial layers are grown on a substrate, thereby forming an epitaxial stack 120 over a substrate 110. In some embodiments, the substrate 110 may include silicon (Si). Alternatively, the substrate 110 may include germanium (Ge), silicon germanium (SiGe), a III-V material (e.g., GaAs, GaP, GaAsP, AlInAs, AlGaAs, GaInAs, InAs, GaInP, InP, InSb, and/or GaInAsP; or a combination thereof) or other appropriate semiconductor materials. In some embodiments, the substrate 110 may include a semiconductor-on-insulator (SOI) structure such as a buried dielectric layer. Also alternatively, the substrate 110 may include a buried dielectric layer such as a buried oxide (BOX) layer, such as that formed by a method referred to as separation by implantation of oxygen (SIMOX) technology, wafer bonding, selective epitaxial growth (SEG), or another appropriate method.

The epitaxial stack 120 includes epitaxial layers 122 of a first composition interposed by epitaxial layers 124 of a second composition. The first and second compositions can be different. In some embodiments, the epitaxial layers 122 are SiGe and the epitaxial layers 124 are silicon (Si). However, other embodiments are possible including those that provide for a first composition and a second composition having different oxidation rates and/or etch selectivity. In some embodiments, the epitaxial layers 122 include SiGe and where the epitaxial layers 124 include Si, the Si oxidation rate of the epitaxial layers 124 is less than the SiGe oxidation rate of the epitaxial layers 122.

The epitaxial layers 124 or portions thereof may form nanosheet channel(s) of the multi-gate transistor. The term nanosheet is used herein to designate any material portion with nanoscale, or even microscale dimensions, and having an elongate shape, regardless of the cross-sectional shape of this portion. Thus, this term designates both circular and substantially circular cross-section elongate material portions, and beam or bar-shaped material portions including for example a cylindrical in shape or substantially rectangular cross-section. The use of the epitaxial layers 124 to define a channel or channels of a device is further discussed below.

It is noted that three layers of the epitaxial layers 122 and three layers of the epitaxial layers 124 are alternately arranged as illustrated in FIG. 1, which is for illustrative purposes only and not intended to be limiting beyond what is specifically recited in the claims. It can be appreciated that any number of epitaxial layers can be formed in the epitaxial stack 120; the number of layers depending on the desired number of channels regions for the transistor. In some embodiments, the number of epitaxial layers 124 is between 2 and 10.

In some embodiments, each epitaxial layer 122 has a thickness ranging from about 1 nanometers (nm) to about 10 nm, but other ranges are within the scope of various embodiments of the present disclosure. The epitaxial layers 122 may be substantially uniform in thickness. In some embodiments, each epitaxial layer 124 has a thickness ranging from about 1 nm to about 10 nm, but other ranges are within the scope of various embodiments of the present disclosure. In some embodiments, the epitaxial layers 124 of the stack are substantially uniform in thickness. As described in more detail below, the epitaxial layers 124 may serve as channel region(s) for a subsequently-formed multi-gate device and the thickness is chosen based on device performance considerations. The epitaxial layers 122 in channel regions(s) may eventually be removed and serve to define a vertical distance between adjacent channel region(s) for a subsequently-formed multi-gate device and the thickness is chosen based on device performance considerations. Accordingly, the epitaxial layers 122 may also be referred to as sacrificial layers, and epitaxial layers 124 may also be referred to as channel layers.

By way of example, epitaxial growth of the layers of the stack 120 may be performed by a molecular beam epitaxy (MBE) process, a metalorganic chemical vapor deposition (MOCVD) process, and/or other suitable epitaxial growth processes. In some embodiments, the epitaxially grown layers such as, the epitaxial layers 124 include the same material as the substrate 110. In some embodiments, the epitaxially grown layers 122 and 124 include a different material than the substrate 110. As stated above, in at least some examples, the epitaxial layers 122 include an epitaxially grown silicon germanium (SiGe) layer and the epitaxial layers 124 include an epitaxially grown silicon (Si) layer. Alternatively, in some embodiments, either of the epitaxial layers 122 and 124 may include other materials such as germanium, a compound semiconductor such as silicon carbide, gallium arsenide, gallium phosphide, indium phosphide, indium arsenide, and/or indium antimonide, an alloy semiconductor such as SiGe, GaAsP, AlInAs, AlGaAs, InGaAs, GaInP, and/or GaInAsP, or combinations thereof. As discussed, the materials of the epitaxial layers 122 and 124 may be chosen based on providing differing oxidation and/or etching selectivity properties. In some embodiments, the epitaxial layers 122 and 124 are substantially dopant-free (i.e., having an extrinsic dopant concentration from about 0 $cm^{-3}$ to about $1\times10^{18}$ $cm^{-3}$), where for example, no intentional doping is performed during the epitaxial growth process.

Figure 2:
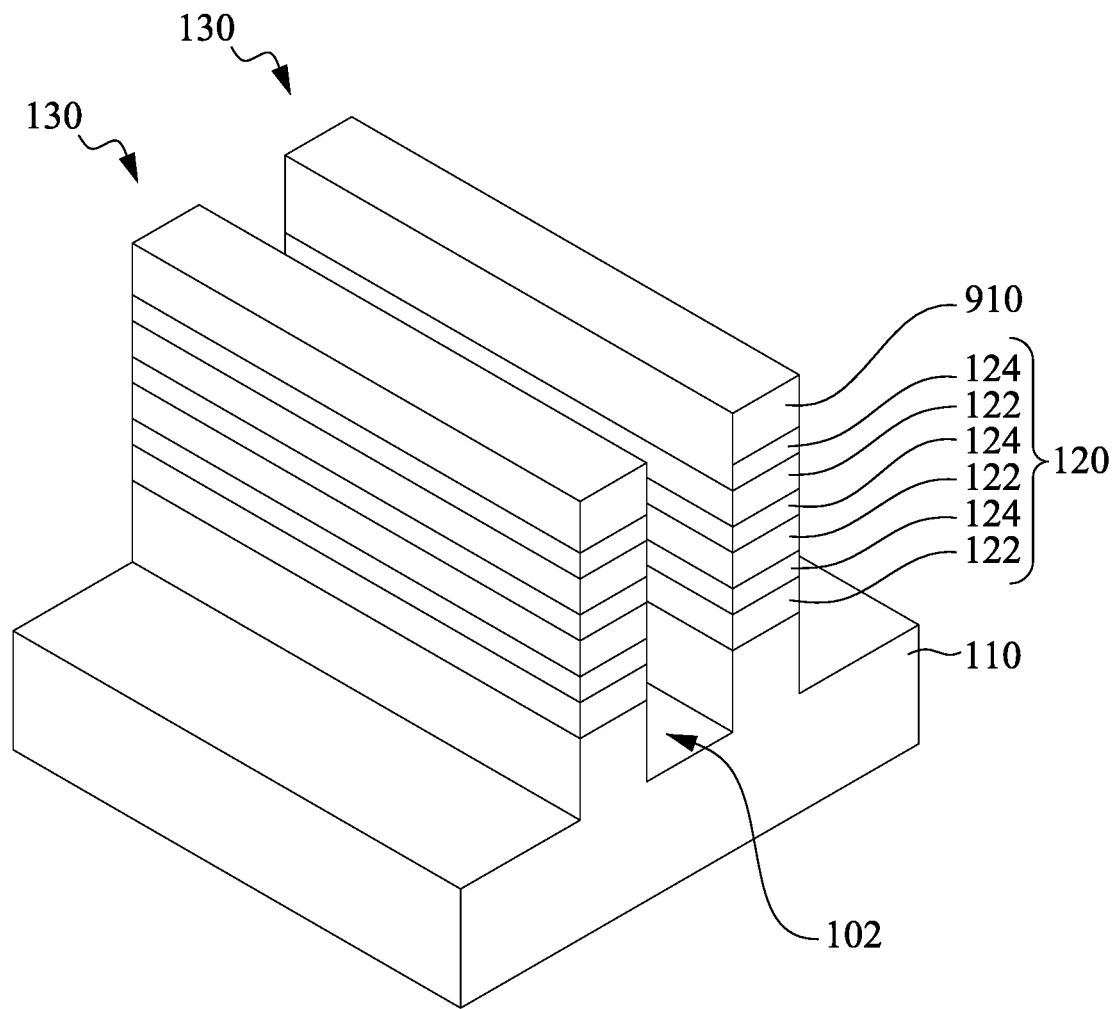

Referring to FIG. 2, the epitaxial stack 120 and the substrate 110 are patterned to form plural semiconductor fins 130. In various embodiments, each of the semiconductor fins 130 includes a substrate portion 112 formed from the substrate 110 and portions of each of the epitaxial layers of the epitaxial stack including epitaxial layers 122 and 124. The semiconductor fins 130 may be fabricated using suitable processes including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the semiconductor fins 130 by etching initial epitaxial stack 120. The etching process can include dry etching, wet etching, reactive ion etching (RIE), and/or other suitable processes.

In the illustrated embodiments as illustrated in FIGS. 1 and 2, a hard mask (HM) layer 910 is formed over the epitaxial stack 120 prior to the formation of the semiconductor fins 130. In some embodiments, the HM layer includes an oxide layer (e.g., a pad oxide layer that may include $SiO_2$) and a nitride layer (e.g., a pad nitride layer that may include $Si_3N_4$) formed over the oxide layer. The oxide layer may act as an adhesion layer between the epitaxial stack and the nitride layer and may act as an etch stop layer for etching the nitride layer. In some examples, the HM oxide layer includes thermally grown oxide, chemical vapor deposition (CVD)-deposited oxide, and/or atomic layer deposition (ALD)-deposited oxide. In some embodiments, the HM nitride layer is deposited on the HM oxide layer by CVD and/or other suitable techniques.

The semiconductor fins 130 may subsequently be fabricated using suitable processes including photolithography and etch processes. The photolithography process may include forming a photoresist layer (not shown) over the HM layer 910, exposing the photoresist to a pattern, performing post-exposure bake processes, and developing the resist to form a patterned mask including the resist. In some embodiments, patterning the resist to form the patterned mask element may be performed using an electron beam (e-beam) lithography process or an extreme ultraviolet (EUV) lithography process using light in EUV region, having a wavelength of, for example, about 1-100 nm. The patterned mask may then be used to protect regions of the semiconductor substrate 110, and layers formed thereupon, while an etch process forms trenches 102 in unprotected regions through the HM layer 910, through the epitaxial stack 120, and into the substrate 110, thereby leaving the plurality of extending fins 130. The trenches 102 may be etched using a dry etch (e.g., reactive ion etching), a wet etch, and/or combination thereof. Numerous other embodiments of methods to form the fins on the substrate may also be used including, for example, defining the fin region (e.g., by mask or isolation regions) and epitaxially growing the epitaxial stack 120 in the form of the semiconductor fins 130.

Figure 3:
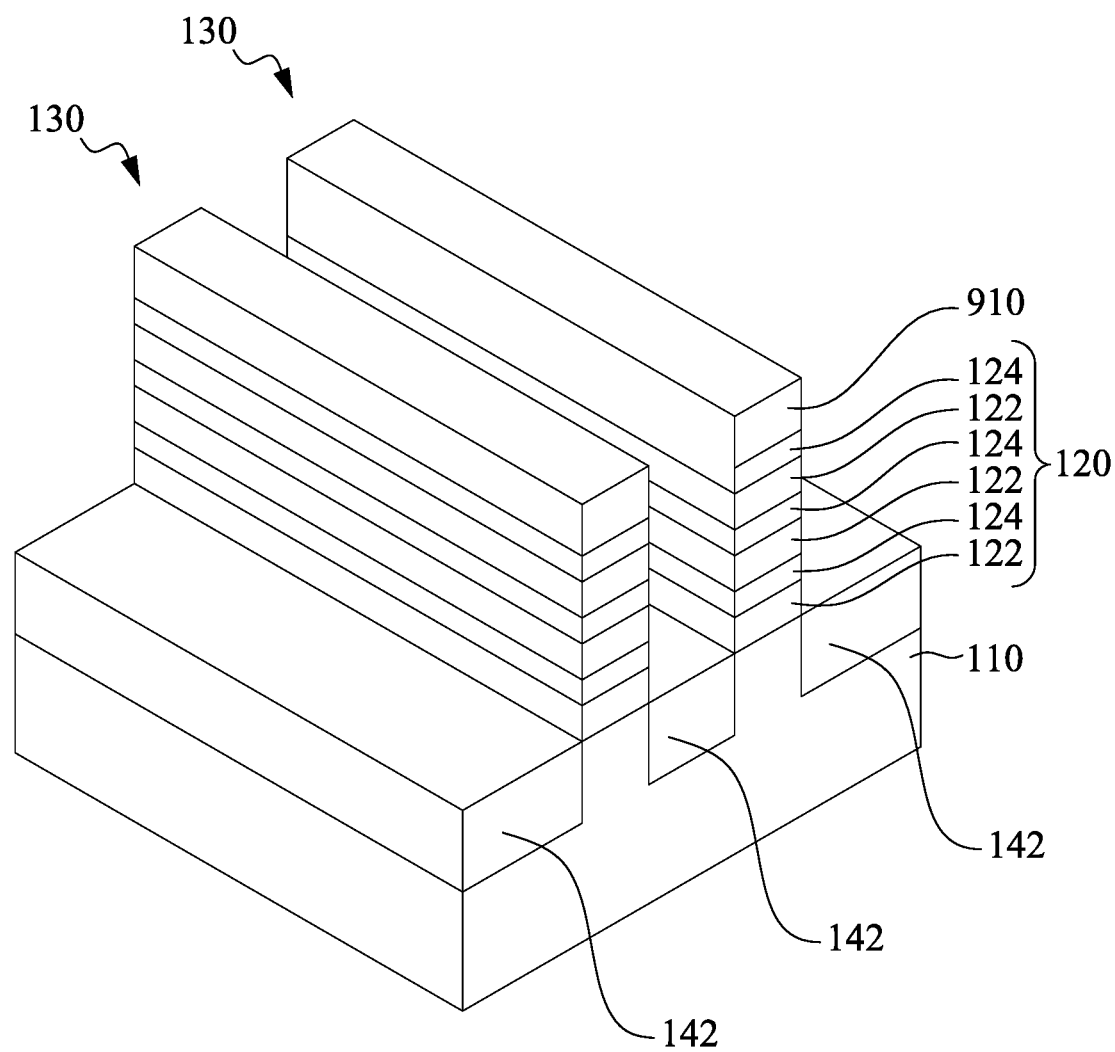

Referring to FIG. 3, shallow trench isolation (STI) features 142 are formed interposing the semiconductor fins 130. By way of example and not limitation, a dielectric layer is first deposited over the substrate 110, filling the trenches 102 with the dielectric material. In some embodiments, the dielectric layer may include silicon oxide, silicon nitride, silicon oxynitride, fluorine-doped silicate glass (FSG), a low-k dielectric, combinations thereof, and/or other suitable materials. In various examples, the dielectric layer may be deposited by a CVD process, a subatmospheric CVD (SACVD) process, a flowable CVD process, an ALD process, a physical vapor deposition (PVD) process, and/or other suitable process. In some embodiments, after deposition of the dielectric layer, the integrated circuit structure may be annealed, for example, to improve the quality of the dielectric layer. In some embodiments, the dielectric layer (and subsequently formed STI features 142) may include a multi-layer structure, for example, having one or more liner layers.

In some embodiments of forming the isolation (STI) features, after deposition of the dielectric layer, the deposited dielectric material is thinned and planarized, for example by a chemical mechanical polishing (CMP) process. In some embodiments, the HM layer 910 functions as a CMP stop layer. The STI features 142 interposing the fins 130 are recessed. Referring to the example of FIG. 4, the STI features 142 are recessed providing the fins 130 extending above the STI features 142. In some embodiments, the recessing process may include a dry etching process, a wet etching process, and/or a combination thereof. The HM layer 910 may also be removed before, during, and/or after the recessing of the STI features 142. The nitride layer 914 of the HM layer 910 may be removed, for example, by a wet etching process using $H_3PO_4$ or other suitable etchants. In some embodiments, the oxide layer 912 of the HM layer 910 is removed by the same etchant used to recess the STI features 142. In some embodiments, a recessing depth is controlled (e.g., by controlling an etching time) so as to result in a desired height of the exposed upper portion of the fins 130. In the illustrated embodiment, the desired height exposes each of the layers of the epitaxial stack 120 in the fins 130.

Figure 4:
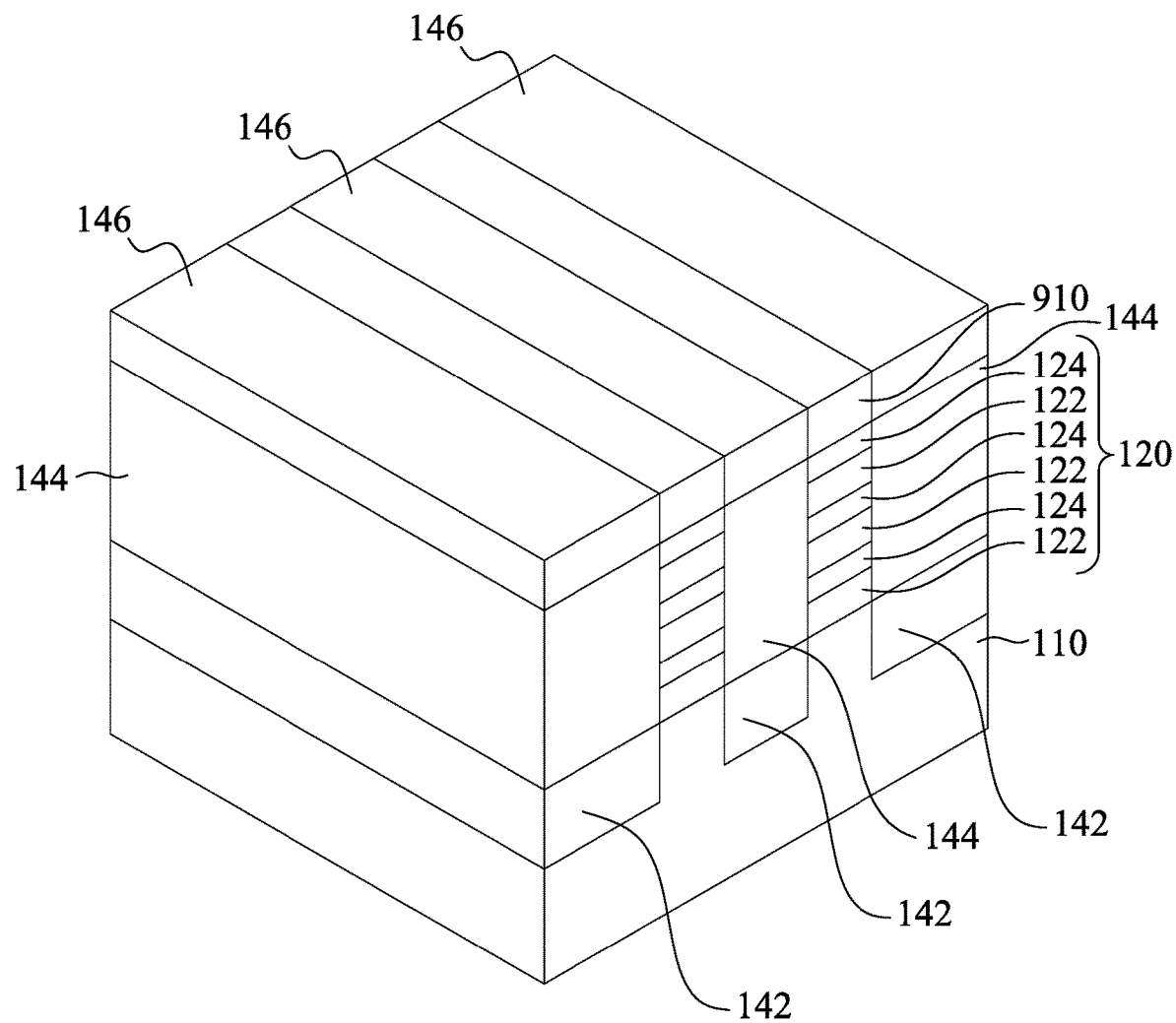

Referring to FIG. 4, dielectric fin structures 144 are formed over the STI features 142 and interposing the semiconductor fins 130. In some embodiments, a dielectric layer is conformally formed above the structure in FIG. 3, and a filling material is filled in the trenches 102. A planarization (e.g., CMP) process is then performed to remove excess portions of the dielectric layer and the filling material to form the dielectric fin structures 144 respectively in the trenches 102. As such, each of the dielectric fin structures 144 includes a dielectric layer and a filling dielectric fin above the dielectric layer. In some embodiments, the dielectric layer is deposited with an ALD process or other suitable processes. In some embodiments, the dielectric layer and the filling dielectric fin include silicon nitride, silicon oxide, silicon oxynitride, SiCN, SiCON, SiOC, or other suitable materials. For example, the dielectric layer includes silicon nitride, and the filling dielectric fin includes silicon dioxide.

Figure 14:
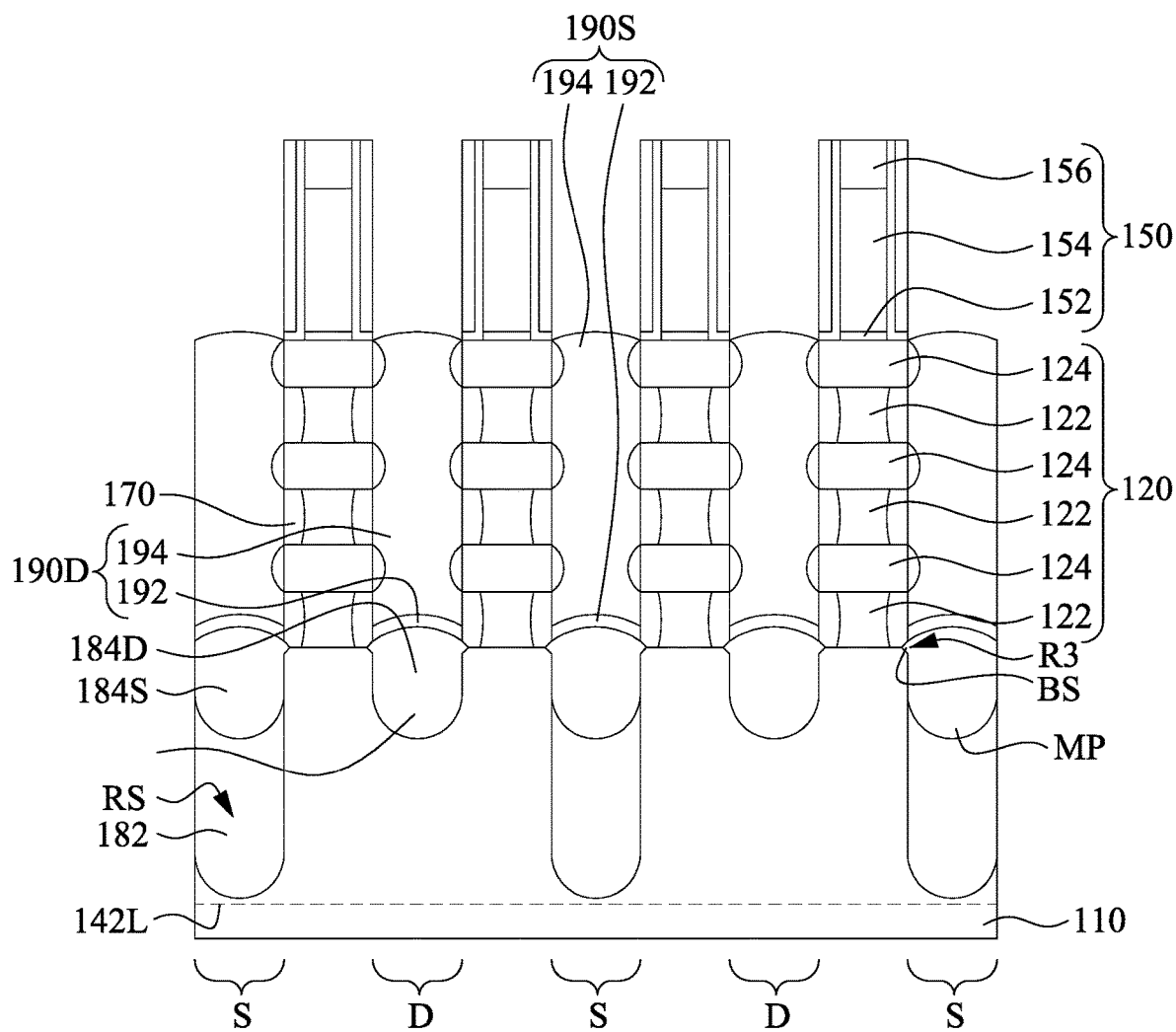

The dielectric fin structures 144 are configured to limit the space for epitaxially growing the source/drain epitaxial structures 190S/190D (referring to FIG. 14). As a result, the source/drain epitaxial structures 190S/190D (referring to FIG. 14) are confined between the dielectric fin structures 144. This can be used to produce any desirable size of the source/drain epitaxial structures 190S/190D (referring to FIG. 14), for reducing parasitic capacitances.

In some embodiments, the dielectric fin structures 144 may be recessed by suitable etching process. The recessed dielectric fin structures 144 may have a top surface substantially level with the top surface of the stack 120, or may be at an intermediate level between the top surface and the bottom surface of the topmost epitaxial layer 124. In some embodiments, mask layers 146 are then respectively formed on the recessed dielectric fin structures 144. In some embodiments, the mask layers 146 are formed of silicon nitride, silicon oxynitride, silicon carbide, silicon carbonitride, or the like. For example, a mask material is formed above the recessed dielectric fin structures 144, and a planarization (e.g., CMP) process is performed to remove excess portion of the mask material to form the mask layers 146.

Figure 5:
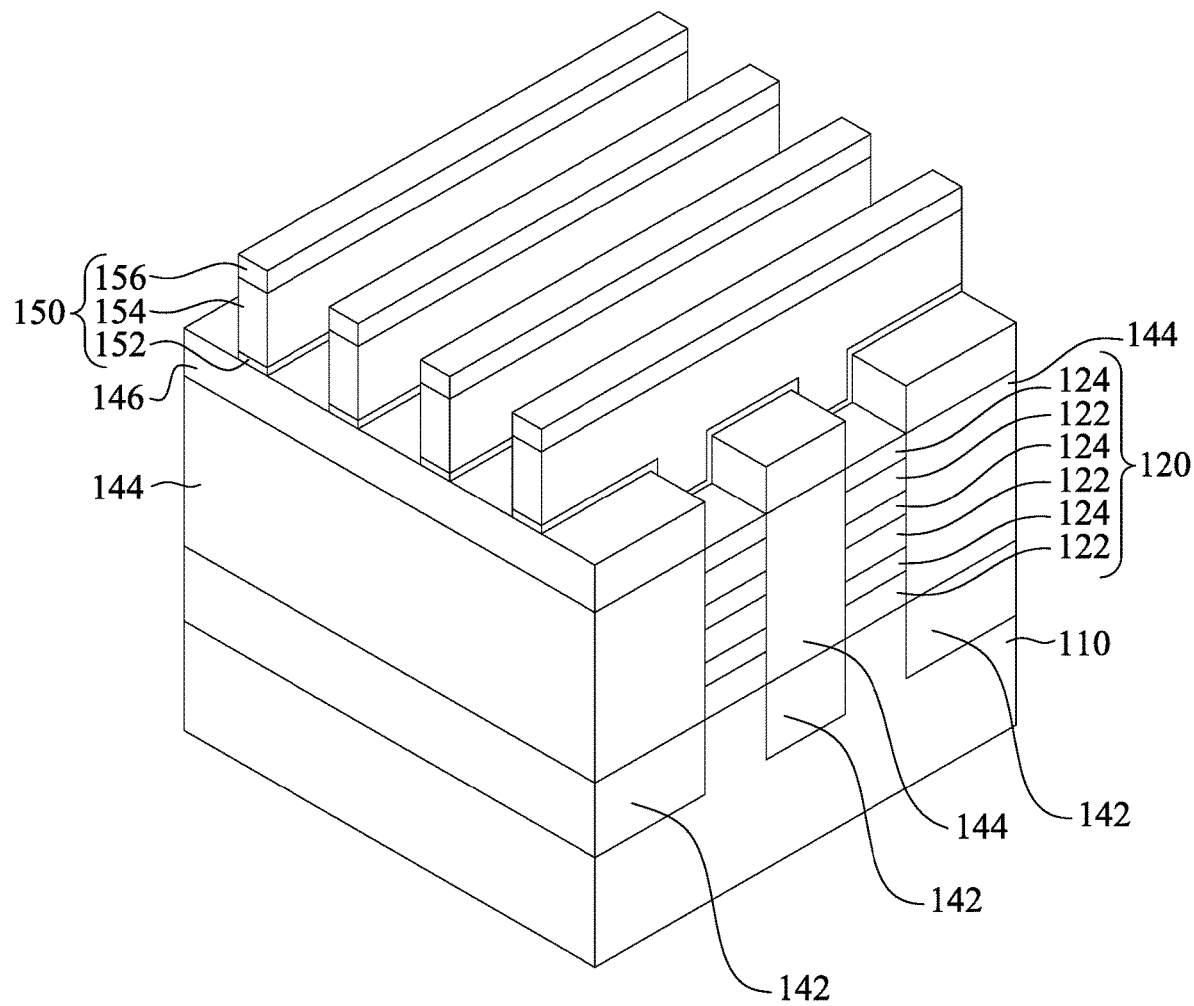

Referring to FIG. 5, a gate structure 150 is formed. In some embodiments, the gate structure 150 is a dummy (sacrificial) gate structure that is subsequently removed. Thus, in some embodiments using a gate-last process, the gate structure 150 is a dummy gate structure and will be replaced by the final gate structure at a subsequent processing stage of the integrated circuit structure. In particular, the dummy gate structure 150 may be replaced at a later processing stage by a high-k dielectric layer (HK) and metal gate electrode (MG) as discussed below. While the present discussion is directed to a replacement gate process whereby a dummy gate structure is formed and subsequently replaced, other configurations may be possible.

In some embodiments, the dummy gate structure 150 is formed over the substrate 110 and is at least partially disposed over the fins 130. The portion of the fins 130 underlying the dummy gate structure 150 may be referred to as the channel region. The dummy gate structure 150 may also define a source/drain (S/D) region of the fins 130, for example, the regions of the fin 130 adjacent and on opposing sides of the channel region.

In the illustrated embodiment, a dummy gate dielectric layer 152 is first formed over the fins 130. In some embodiments, the dummy gate dielectric layer 152 may include $SiO_2$, silicon nitride, a high-k dielectric material and/or other suitable material. In various examples, the dummy gate dielectric layer 152 may be deposited by a CVD process, a subatmospheric CVD (SACVD) process, a flowable CVD process, an ALD process, a PVD process, or other suitable process. By way of example, the dummy gate dielectric layer 152 may be used to prevent damages to the fins 130 by subsequent processes (e.g., subsequent formation of the dummy gate structure). Subsequently, step S104 forms other portions of the dummy gate structure 150, including a dummy gate electrode layer 154 and a hard mask 156 which may include multiple layers (e.g., an oxide layer and a nitride layer). In some embodiments, the dummy gate structure 150 is formed by various process steps such as layer deposition, patterning, etching, as well as other suitable processing steps. Exemplary layer deposition processes include CVD (including both low-pressure CVD and plasma-enhanced CVD), PVD, ALD, thermal oxidation, e-beam evaporation, or other suitable deposition techniques, or combinations thereof. In forming the gate structure for example, the patterning process includes a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etching process may include dry etching (e.g., RIE etching), wet etching, and/or other etching methods. In some embodiments, the dummy gate electrode layer 154 may include polycrystalline silicon (polysilicon). In some embodiments, the hard mask 156 includes an oxide layer such as a pad oxide layer that may include $SiO_2$, and a nitride layer such as a pad nitride layer that may include $Si_3N_4$ and/or silicon oxynitride. In some embodiments, after patterning the dummy gate electrode layer 154, the dummy gate dielectric layer 152 is removed from the S/D regions of the fins 130. The etch process may include a wet etch, a dry etch, and/or a combination thereof. The etch process is chosen to selectively etch the dummy gate dielectric layer 152 without substantially etching the fins 130, the dummy gate electrode layer 154, and the hard mask 156.

Figure 6A:
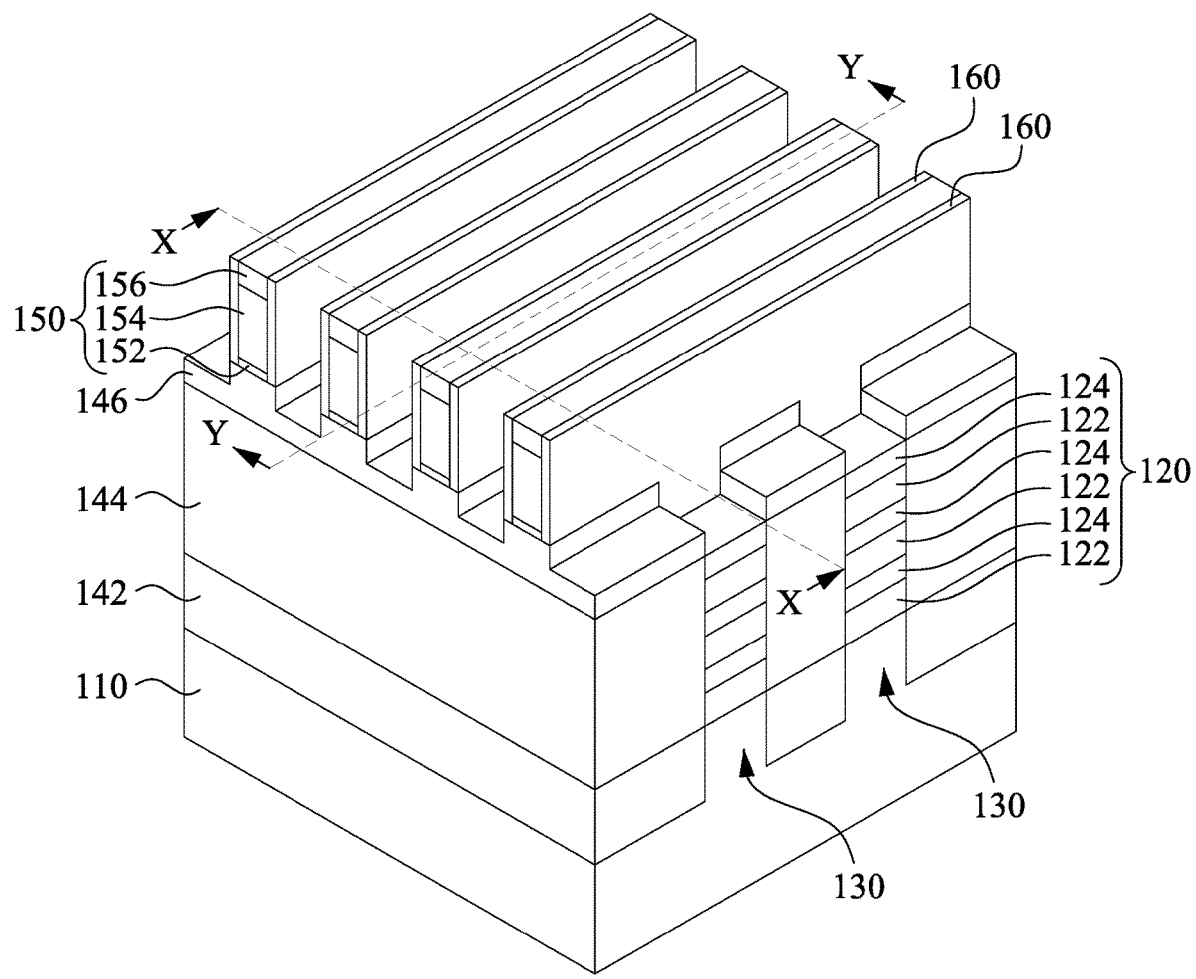
Figure 6B:
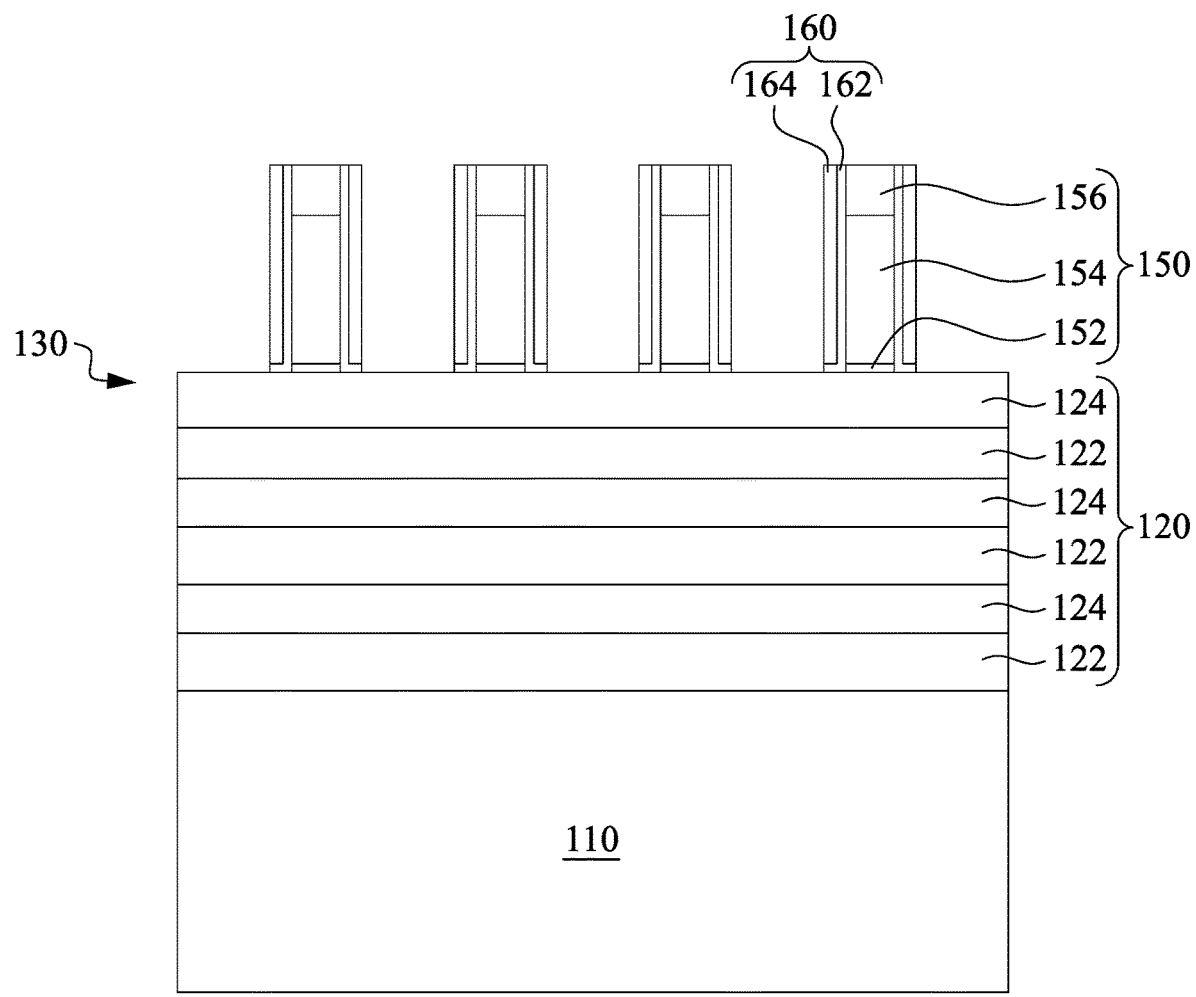

Referring to FIGS. 6A and 6B, gate sidewall spacers 160 are formed on sidewalls of the dummy gate structures 150. In some embodiments, a spacer material layer is deposited on the substrate, for example, on top and sidewalls of the dummy gate structure 150. The spacer material layer may be a conformal layer that is subsequently etched back to form gate sidewall spacers. The spacer material layer may include a dielectric material such as silicon oxide, silicon nitride, silicon carbide, silicon oxynitride, SiCN films, silicon oxycarbide, SiOCN films, and/or combinations thereof. In some embodiments, the spacer material layer includes multiple layers. By way of example, the spacer material layer may be formed by depositing a dielectric material over the gate structure 150 using processes such as, CVD process, a subatmospheric CVD (SACVD) process, a flowable CVD process, an ALD process, a PVD process, or other suitable process. An anisotropic etching process is then performed on the deposited spacer material layer to expose portions of the fins 130 not covered by the dummy gate structure 150 (e.g., in source/drain regions of the fins 130). Portions of the spacer material layer directly above the dummy gate structure 150 may be completely removed by this anisotropic etching process. Portions of the spacer material layer on sidewalls of the dummy gate structure 150 may remain, forming gate sidewall spacers, which is denoted as the gate sidewall spacers 160, for the sake of simplicity. It is noted that although the gate sidewall spacers 160 are multi-layer structures (e.g. first spacer 162 and second spacer 168) in the cross-sectional view of FIG. 6B, they are illustrated as single-layer structures in the perspective view of FIG. 6A for the sake of simplicity.

Figure 7:
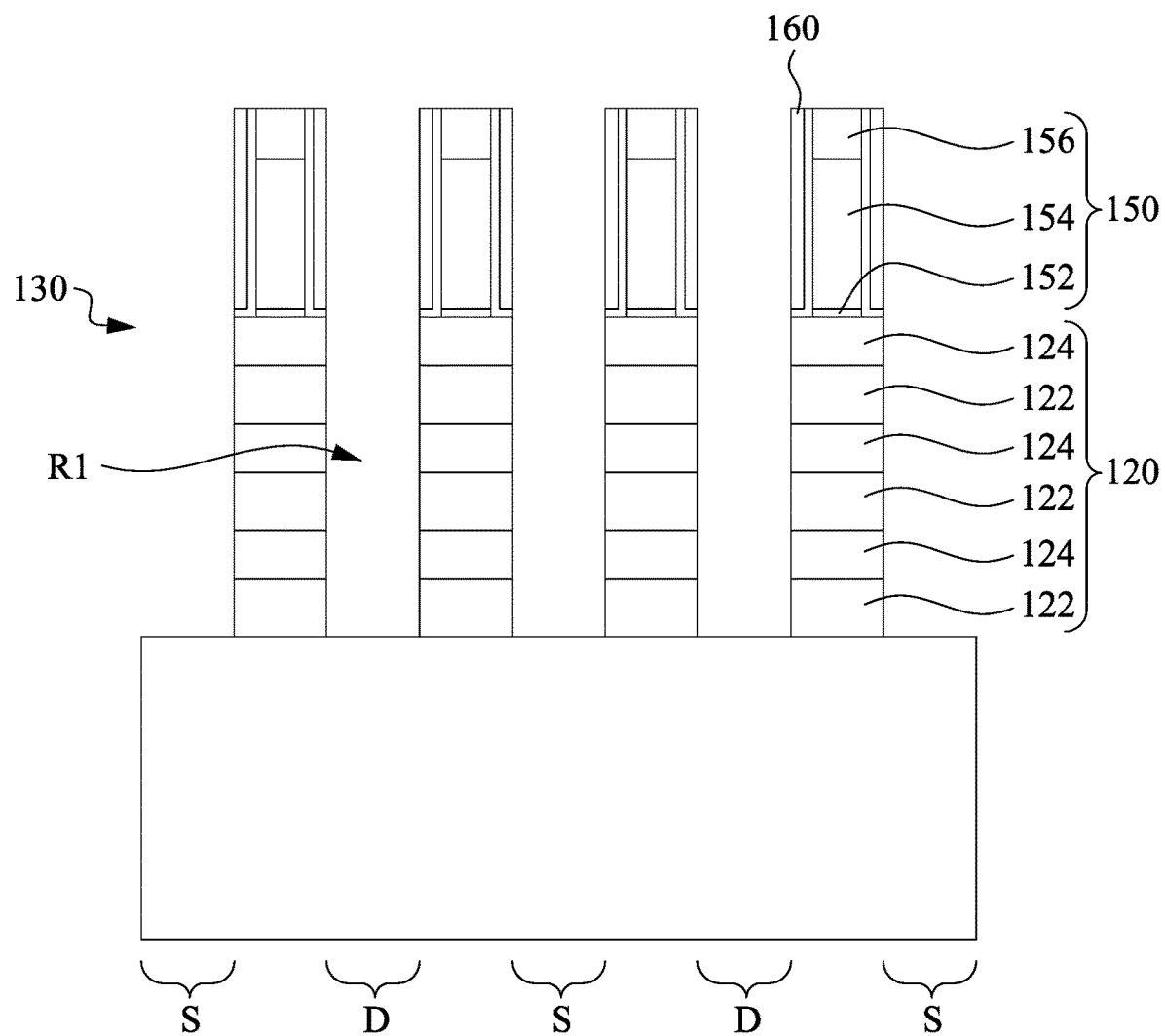

Referring to FIG. 7, exposed portions of the semiconductor fins 130 that extend laterally beyond the gate sidewall spacers 160 (e.g., in source/drain regions of the fins 130) are etched by using, for example, an anisotropic etching process that uses the dummy gate structure 150 and the gate sidewall spacers 160 as an etch mask, resulting in recesses R1 into the semiconductor fins 130 and between corresponding dummy gate structures 150. After the anisotropic etching, end surfaces of the sacrificial layers 122 and channel layers 124 are aligned with respective outermost sidewalls of the gate sidewall spacers 160, due to the anisotropic etching. In some embodiments, the anisotropic etching may be performed by a dry chemical etch with a plasma source and a reaction gas. The plasma source may be an inductively coupled plasma (ICR) source, a transformer coupled plasma (TCP) source, an electron cyclotron resonance (ECR) source or the like, and the reaction gas may be, for example, a fluorine-based gas (such as $SF_6$, $CH_2F_2$, $CH_3F$, $CHF_3$, or the like), chloride-based gas (e.g., $Cl_2$), hydrogen bromide gas (HBr), oxygen gas ($O_2$), the like, or combinations thereof.

Figure 8:
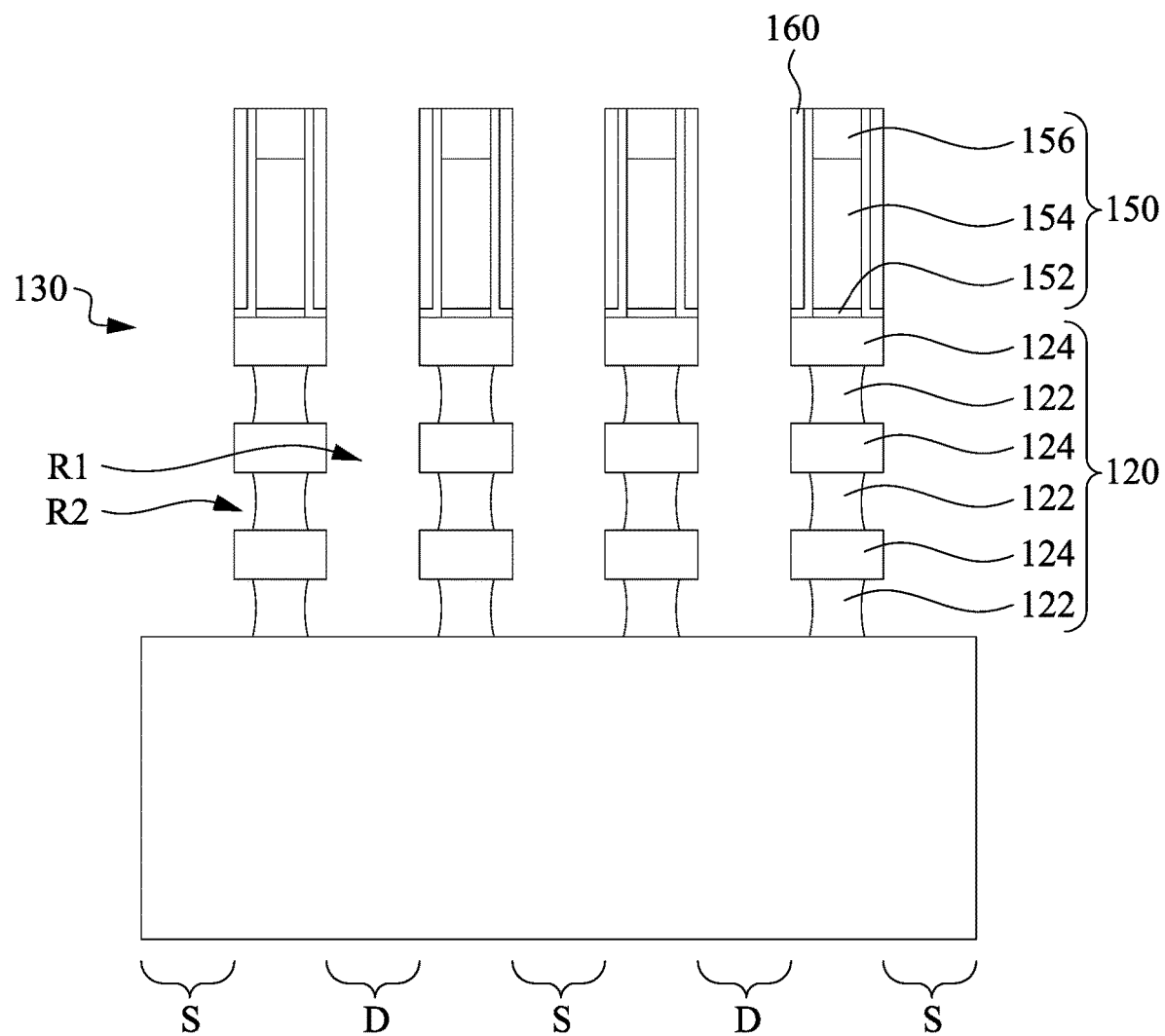

Referring to FIG. 8, the sacrificial layers 122 are laterally recessed. The sacrificial layers 122 are laterally or horizontally recessed by using suitable etch techniques, resulting in lateral recesses R2 each vertically between corresponding channel layers 124. For example, a selective etching process may be used. By way of example and not limitation, the sacrificial layers 122 are SiGe and the channel layers 124 are silicon allowing for the selective etching of the sacrificial layers 122. In some embodiments, the selective wet etching includes an APM etch (e.g., ammonia hydroxide-hydrogen peroxide-water mixture) that etches SiGe at a faster etch rate than it etches Si. In some embodiments, the selective etching includes SiGe oxidation followed by a $SiGeO_x$ removal. For example, the oxidation may be provided by $O_3$ clean and then $SiGeO_x$ removed by an etchant such as $NH_4OH$ that selectively etches $SiGeO_x$ at a faster etch rate than it etches Si. Moreover, because oxidation rate of Si is much lower (sometimes 30 times lower) than oxidation rate of SiGe, the channel layers 124 is not significantly etched by the process of laterally recessing the sacrificial layers 122. As a result, the channel layers 124 laterally extend past opposite end surfaces of the sacrificial layers 122.

Figure 9:
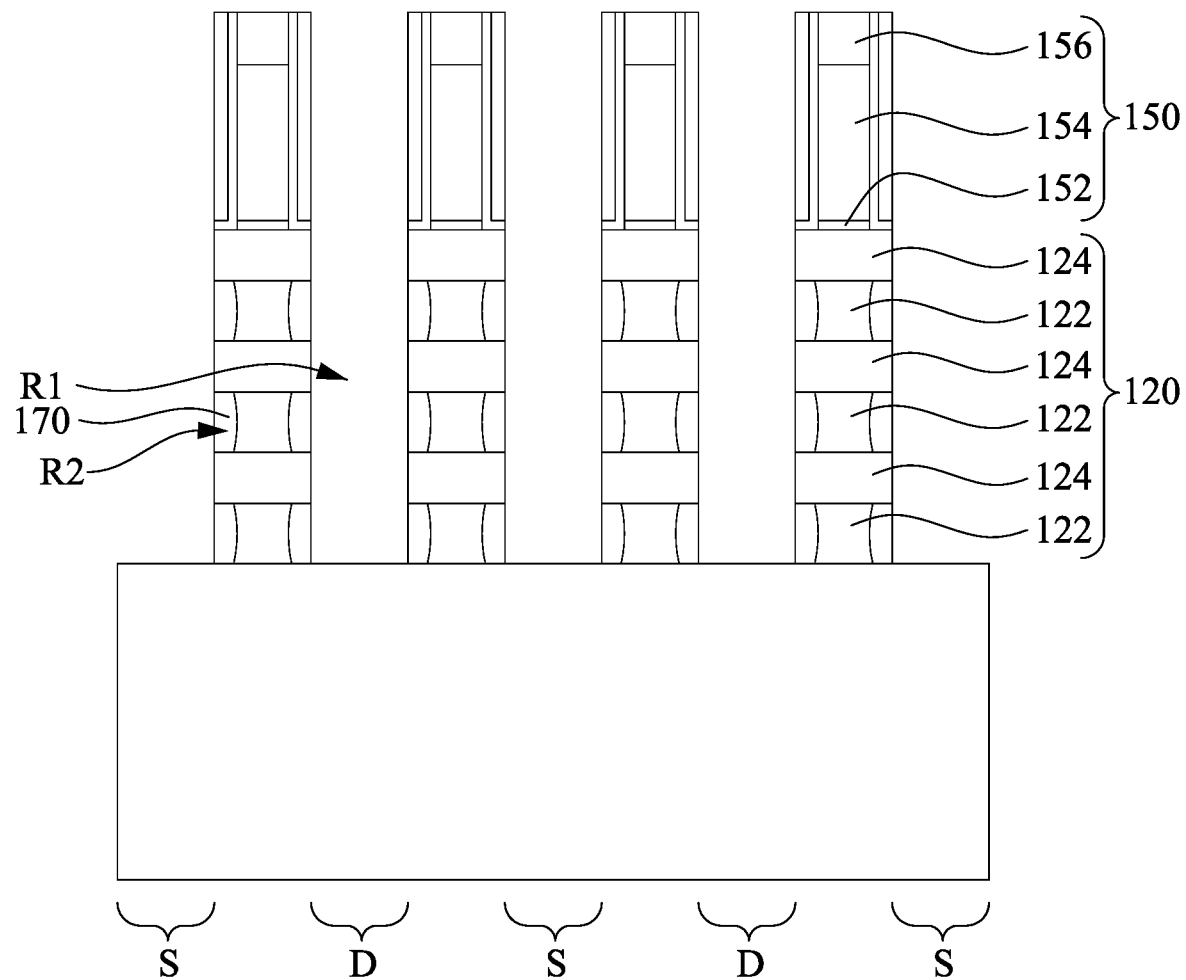

Referring to FIG. 9, inner spacers 170 are formed on opposite end surfaces of the laterally recessed sacrificial layers 122. In some embodiments, an inner spacer material layer is formed to fill the recesses R2 left by the lateral etching of the sacrificial layers 122 discussed above with reference to FIG. 8. The inner spacer material layer may be a low-K dielectric material, such as $SiO_2$, SiN, SiCN, or SiOCN, and may be formed by a suitable deposition method, such as ALD. After the deposition of the inner spacer material layer, an anisotropic etching process may be performed to trim the deposited inner spacer material layer, such that only portions of the deposited inner spacer material layer that fill the recesses R2 left by the lateral etching of the sacrificial layers 122 are left. After the trimming process, the remaining portions of the deposited inner spacer material layer are denoted as inner spacers 170, for the sake of simplicity. The inner spacers 170 serve to isolate metal gates from source/drain regions formed in subsequent processing. In the example of FIG. 9, sidewalls of the inner spacers 170 are aligned with sidewalls of the channel layers 124.

Figure 10:
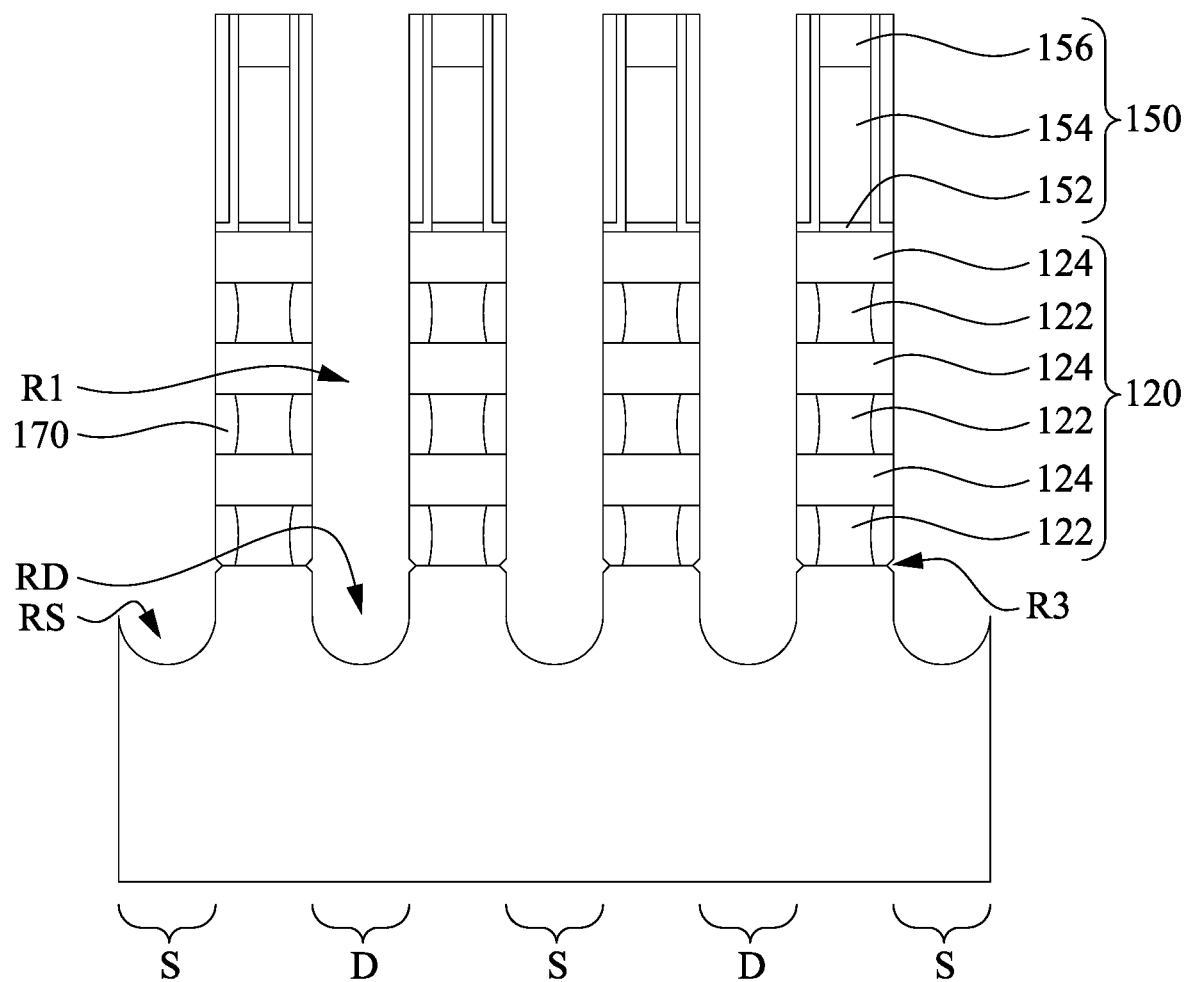

Referring to FIG. 10, source regions S and drain regions D of the fins 130 are recessed, thereby forming source-region recesses RS and drain-region recesses RD in the source and drain regions S and D, respectively. In some embodiments, the recesses RS and RD can be formed in the source and drain regions S and D using, for example, an anisotropic etching process. In some embodiments, the anisotropic etching may be performed by a dry chemical etch with a plasma source and a reaction gas. By way of example and not limitation, the plasma source may be an inductively coupled plasma (ICR) source, a transformer coupled plasma (TCP) source, an electron cyclotron resonance (ECR) source or the like, and the reaction gas may be a fluorine-based gas (such as $SF_6$, $CH_2F_2$, $CH_3F$, $CHF_3$, or the like), chloride-based gas (e.g., $Cl_2$), hydrogen bromide gas (HBr), oxygen gas (02), the like, or combinations thereof.

In some embodiments, the etching process for forming the source-region recesses RS and drain-region recesses RD may also form side recesses R3 between the substrate 110 and the inner spacers 170. In some embodiments, the side recesses R3 may have a shape of bird's beak. For example, a size of the side recesses R3 shrinks as approaching the sacrificial layers 122. In some embodiments, the side recesses R3 may not expose the sacrificial layers 122. Alternatively, in some other embodiments the side recesses R3 may expose the sacrificial layers 122.

Figure 11:
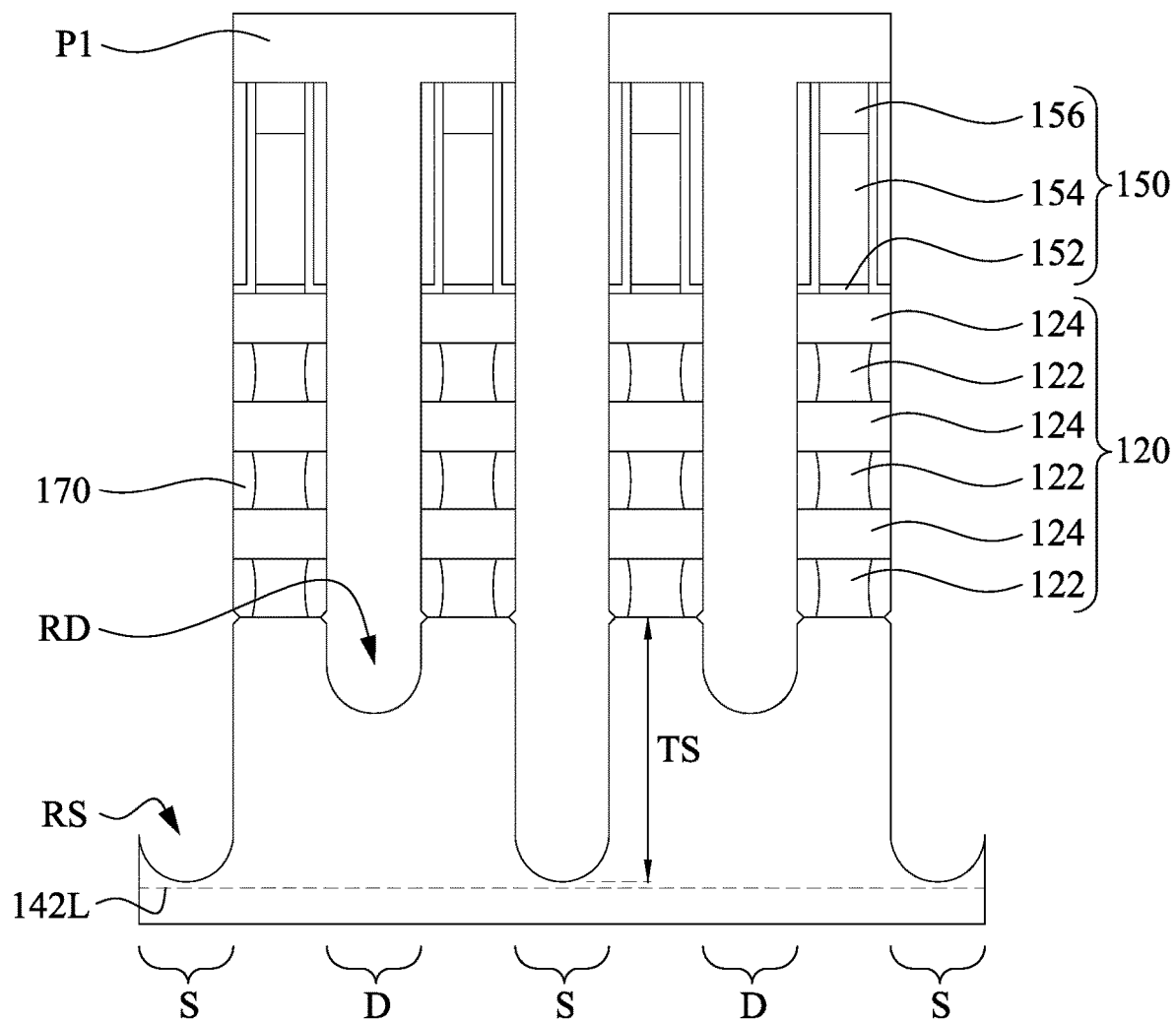

Referring to FIG. 11, source regions S of the fins 130 are further recessed. In some embodiments, a patterned mask P1 is first formed to cover the drain regions D of the fins 130 but not cover the source regions S of the fins 130, and then the source regions S of the fins 130 are further recessed, thereby deepening the recesses RS.

In some embodiments, the patterned mask P1 may be a photoresist mask formed by suitable photolithography process. For example, the photolithography process may include spin-on coating a photoresist layer over the structure as illustrated in FIG. 8, performing post-exposure bake processes, and developing the photoresist layer to form the patterned mask P1. In some embodiments, patterning the resist to form the patterned mask element may be performed using an electron beam (e-beam) lithography process or an extreme ultraviolet (EUV) lithography process.

Once the patterned mask P1 is formed and covering the recesses RD, the recesses RS can be deepened, for example, an anisotropic etching process. In some embodiments, the anisotropic etching may be performed by a dry chemical etch with a plasma source and a reaction gas. By way of example and not limitation, the plasma source may be an inductively coupled plasma (ICR) source, a transformer coupled plasma (TCP) source, an electron cyclotron resonance (ECR) source or the like, and the reaction gas may be a fluorine-based gas (such as $SF_6$, $CH_2F_2$, $CH_3F$, $CHF_3$, or the like), chloride-based gas (e.g., $Cl_2$), hydrogen bromide gas (HBr), oxygen gas (02), the like, or combinations thereof.

The source-region recesses RS has a depth TS from a top surface of the substrate 110, and the depth TS is large enough to allow a formation of backside contacts, as will be discussed in greater detail below. In some embodiments, by the deepening process, the source-region recesses RS is deeper than the drain-region recesses RD. For example, a bottom surface of the source-region recesses RS may be lower than a bottom surface of the drain-region recesses RD. That is, the depth TS is larger than a depth of the drain-region recesses RD from a top surface of the substrate 110. In some embodiments, after the deepening process, the bottom surface of the source-region recesses RS may be higher than a bottom surface of the STI features 142 (indicated by dash lines 142L in the figure).

Figure 12:
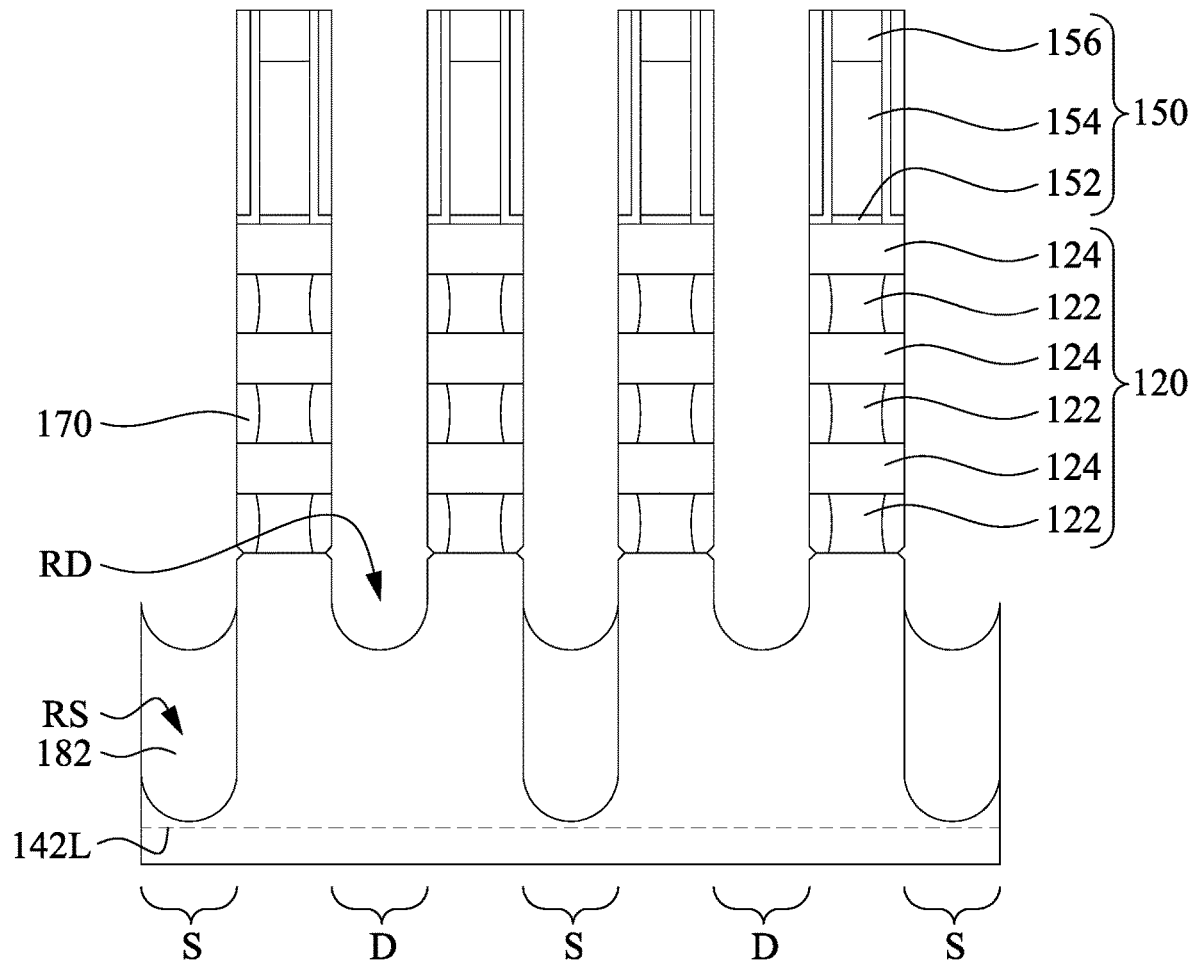

Referring to FIG. 12, sacrificial epitaxial plugs 182 are formed in the respective source-region recesses RS. In some embodiments, with the patterned mask P1 in place, an epitaxial growth process is performed to grow an epitaxial material in the source-region recesses RS. The epitaxial material has a different composition than the substrate 110, thus resulting in different etch selectivity between the sacrificial epitaxial plugs 182 and the substrate 110. For example, the substrate 110 is Si and the sacrificial epitaxial plugs 182 are SiGe. In some embodiments, the sacrificial epitaxial plugs 182 are SiGe free from p-type dopants (e.g., boron) and n-type dopants (e.g., phosphorous), because the sacrificial epitaxial plugs 182 will be removed in subsequent processing and not serve as source terminals of transistors in a final IC product. Once formation of the sacrificial epitaxial plugs 182 is complete, the patterned mask P1 is removed by, for example, ashing.

In order to prevent SiGe from being inadvertently formed on end surfaces of the Si channel layers 124, the SiGe plugs 182 can be grown in a bottom-up fashion, in accordance with some embodiments of the present disclosure. By way of example and not limitation, the SiGe plugs 182 can be grown by an epitaxial deposition/partial etch process, which repeats the epitaxial deposition/partial etch process at least once. Such repeated deposition/partial etch process is also called a cyclic deposition-etch (CDE) process. In some embodiments, these SiGe plugs 182 are grown by selective epitaxial growth (SEG), where an etching gas is added to promote the selective growth of silicon germanium from the bottom surface of the source-region recesses RS that has a first crystal plane, but not from the vertical end surfaces of the channel layers 124 that have a second crystal plane different from the first crystal plane. For example, the SiGe plugs 182 are epitaxially grown using reaction gases such as HCl as an etching gas, $GeH_4$ as a Ge precursor gas, DCS and/or $SiH_4$ as a Si precursor gas, $H_2$ and/or $N_2$ as a carrier gas. In some embodiments, the etching gas may be other chlorine-containing gases or bromine-containing gases such as $Cl_2$, $BCl_3$, $BiCl_3$, $BiBr_3$ or the like.

SiGe deposition conditions are controlled (e.g., by tuning flow rate ratio among Ge precursor gas, Si precursor gas and carrier gas) in such a way that SiGe growth rate on the bottom surfaces of the source-region recesses RS is faster than SiGe growth rate on the vertical end surfaces of the channel layers 124, because the bottom surfaces of the source-region recesses RS and the vertical end surfaces of the channel layers 124 have different crystal orientation planes. Accordingly, the SiGe deposition step incorporating the etching step promotes bottom-up SiGe growth. For example, SiGe is grown from the bottom surface of the source-region recesses RS at a faster rate than that from the end surfaces of the channel layers 124. The etching gas etches SiGe grown from the end surfaces of the channel layers 124 as well as SiGe grown from the bottom surface of the source-region recesses RS at comparable etch rates. However, since the SiGe growth rate from the bottom surfaces of the source-region recesses RS is faster than from the end surfaces of the channel layers 124, the net effect is that SiGe will substantially grow from the bottom surfaces of source-region recesses RS in the bottom-up fashion. By way of example and not limitation, in each deposition-etch cycle of the CDE process, the etching step stops once the end surfaces of the channel layers 124 are exposed, and the SiGe grown from the bottom surfaces of the source-region recesses RS remains in the source-region recesses RS because it is thicker than the SiGe grown from the end surfaces of the channel layers 124. In this way, the bottom-up growth can be realized. The CDE process as discussed above is merely one example to explain how to form SiGe plugs 182 in source-region recesses RS but absent from end surfaces of Si channel layers 124, and other suitable techniques may also be used to form the SiGe plugs 182.

Figure 13:
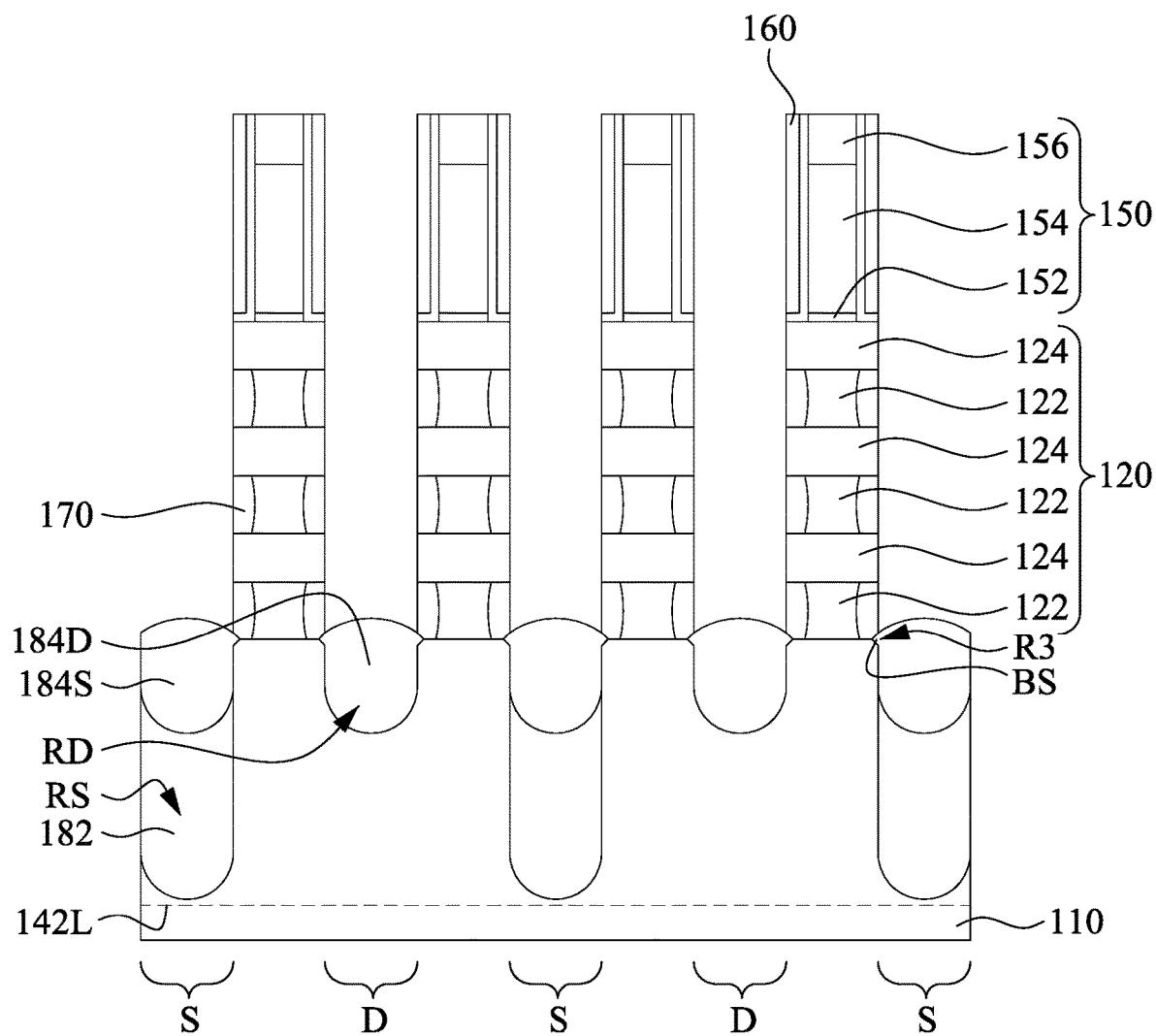

Referring to FIG. 13, epitaxial features 184S and 184D are formed in the respective source-region recesses RS and drain-region recesses RD. In some embodiments, an epitaxial growth process is performed to grow an epitaxial material in the source-region recesses RS and the drain-region recesses RD until filling the source-region recesses RS and drain-region recesses RD. The epitaxial material has a different composition than the substrate 110, thus resulting in different etch selectivity between the epitaxial features 184S and 184D and the substrate 110. For example, the substrate 110 is Si and the epitaxial features 184S and 184D are SiGe. Also, the epitaxial material has a different composition than the sacrificial epitaxial plugs 182, thus resulting in different etch selectivity between the epitaxial features 184S and 184D and the sacrificial epitaxial plugs 182.

The sacrificial epitaxial plugs 182 and epitaxial features 184S/184D are different at least in germanium atomic percentage (Ge %), which in turn allows for different etch selectivity between the sacrificial epitaxial plugs 182 and epitaxial features 184S/184D. In certain embodiments, the sacrificial epitaxial plugs 182 has a higher germanium atomic percentage than the epitaxial features 184S/184D. By way of example and not limitation, the germanium atomic percentage in the sacrificial epitaxial plugs 182 is in a range from about 20% to about 50%, and the germanium atomic percentage in the epitaxial features 184S/184D is in a range from about 5% to about 20%. To achieve different germanium atomic percentages in the sacrificial epitaxial plugs 182 and the epitaxial features 184S/184D, a ratio of a flow rate of the Ge precursor gas (e.g., $GeH_4$) to a flow rate of the Si precursor gas (e.g., $SiH_4$) is varied for their respective growth processes. For example, a Ge-to-Si precursor flow rate ratio during the epitaxial growth of the sacrificial epitaxial plugs 182 is greater than that of the epitaxial features 184S/184D. In this way, the germanium atomic percentage of the sacrificial epitaxial plugs 182 is greater than that of the epitaxial features 184S/184D.

In some embodiments, the epitaxial features 184S and 184D are SiGe free from p-type dopants (e.g., boron) and n-type dopants (e.g., phosphorous), because the epitaxial features 184S will be removed in subsequent processing and not serve as source terminals of transistors in a final IC product. Alternatively, the epitaxial features 184S and 184D may be SiGe doped with p-type dopants (e.g., boron). In some embodiments, the sacrificial epitaxial plugs 182 and the epitaxial features 184S and 184D are free from p-type dopants (e.g., boron) and n-type dopants (e.g., phosphorous). In some embodiments, the sacrificial epitaxial plugs 182 is free from p-type dopants (e.g., boron) and n-type dopants (e.g., phosphorous), and the epitaxial features 184S and 184D are doped with p-type dopants (e.g., boron).

In some embodiments, the epitaxial features 184S/184D may be formed to fill up the side recesses R3, and therefore having a beak portion BS according to the shape of the recess R3. For example, each of the epitaxial features 184S/184D has a body portion MP in the recess RS and a beak portion BS connected with the body portion MP in the side recesses R3. The beak portion BS of the epitaxial features 184S/184D is between the substrate 110 and the inner spacer 170, and the beak portion BS tapers away from the body portion MP. The epitaxial features 184S/184D may be used for stop subsequent via opening etching process, and the beak portion BS enlarges the cross-sectional area of the epitaxial features 184S/184D, which can enlarge etching stop process window.

Like the formation of the SiGe plugs 182, in order to prevent SiGe from being inadvertently formed on end surfaces of the Si channel layers 124, the epitaxial features 184S/184D can be grown in a bottom-up fashion, in accordance with some embodiments of the present disclosure. By way of example and not limitation, the epitaxial features 184S/184D can be grown by an epitaxial deposition/partial etch process, which repeats the epitaxial deposition/partial etch process at least once. Such repeated deposition/partial etch process is also called a cyclic deposition-etch (CDE) process. In some embodiments, these epitaxial features 184S/184D are grown by selective epitaxial growth (SEG), where an etching gas is added to promote the selective growth of silicon germanium from the bottom surface of the source-region recesses RS and the drain-region recesses RD that has a first crystal plane, but not from the vertical end surfaces of the channel layers 124 that have a second crystal plane different from the first crystal plane. For example, the epitaxial features 184S/184D are epitaxially grown using reaction gases such as HCl as an etching gas, GeH$_4$ as a Ge precursor gas, DCS and/or SiH$_4$ as a Si precursor gas, H$_2$ and/or N$_2$ as a carrier gas. In some embodiments, the etching gas may be other chlorine-containing gases or bromine-containing gases such as Cl$_2$, BCl$_3$, BiCl$_3$, BiBr$_3$ or the like.

SiGe deposition conditions are controlled (e.g., by tuning flow rate ratio among Ge precursor gas, Si precursor gas and carrier gas) in such a way that SiGe growth rate on the bottom surfaces of the recesses RS/RD is faster than SiGe growth rate on the vertical end surfaces of the channel layers 124, because the bottom surfaces of the recesses RS/RD and the vertical end surfaces of the channel layers 124 have different crystal orientation planes. Accordingly, the SiGe deposition step incorporating the etching step promotes bottom-up SiGe growth. For example, SiGe is grown from the bottom surface of the recesses RS/RD at a faster rate than that from the end surfaces of the channel layers 124. The etching gas etches SiGe grown from the end surfaces of the channel layers 124 as well as SiGe grown from the bottom surface of the recesses RS/RD at comparable etch rates. However, since the SiGe growth rate from the bottom surfaces of the recesses RS/RD is faster than from the end surfaces of the channel layers 124, the net effect is that SiGe will substantially grow from the bottom surfaces of recesses RS/RD in the bottom-up fashion. By way of example and not limitation, in each deposition-etch cycle of the CDE process, the etching step stops once the end surfaces of the channel layers 124 are exposed, and the SiGe grown from the bottom surfaces of the recesses RS/RD remains in the recesses RS/RD because it is thicker than the SiGe grown from the end surfaces of the channel layers 124. In this way, the bottom-up growth can be realized. The CDE process as discussed above is merely one example to explain how to form epitaxial features 184S/184D in the recesses RS/RD but absent from end surfaces of Si channel layers 124, and other suitable techniques may also be used to form the epitaxial features 184S/184D.

Referring to FIG. 14, source epitaxial structures 190S are formed over the epitaxial features 184S over the source regions S of the semiconductor fins 130, and drain epitaxial structures 190D are formed over the epitaxial features 184D over the drain regions D of the semiconductor fins 130. The formation of the source/drain epitaxial structures 190S/190D may be formed by performing an epitaxial growth process that provides an epitaxial material on the epitaxial features 184S/184D. During the epitaxial growth process, the dummy gate structures 150, the gate sidewall spacers 160, and the dielectric fin structures 144 (referring to FIG. 6A) limit the source/drain epitaxial structures 190S/190D to the source/drain regions S/D. Suitable epitaxial processes include CVD deposition techniques (e.g., vapor-phase epitaxy (VPE) and/or ultra-high vacuum CVD (UHV-CVD)), molecular beam epitaxy, and/or other suitable processes. The epitaxial growth process may use gaseous and/or liquid precursors, which interact with the composition of semiconductor materials of the fins 130, the epitaxial features 184S/184D, and the channel layers 124.

In some embodiments, the source/drain epitaxial structures 190S/190D may include Ge, Si, GaAs, AlGaAs, SiGe, GaAsP, SiP, or other suitable material. The source/drain epitaxial structures 190S/190D may be in-situ doped during the epitaxial process by introducing doping species including: p-type dopants, such as boron or BF$_2$; n-type dopants, such as phosphorus or arsenic; and/or other suitable dopants including combinations thereof. If the source/drain epitaxial structures 190S/190D are not in-situ doped, an implantation process (i.e., a junction implant process) is performed to dope the source/drain epitaxial structures 190S/190D. In some exemplary embodiments, the source/drain epitaxial structures 190S/190D in an NFET device include SiP, while those in a PFET device include GeSnB and/or SiGeSnB.

In some embodiments, the source/drain epitaxial structures 190S/190D each include a first epitaxial layer 192 and a second epitaxial layer 194 over the first epitaxial layer 192. In some embodiments where the source/drain epitaxial structures 190S/190D are for forming NFETs, the first and second epitaxial layers 192 and 194 may include silicon doped with different phosphorus concentrations. In furtherance of the embodiments, the first epitaxial layers 192 may include lightly phosphorus-doped silicon (SiP), in which a phosphorus concentration in the first epitaxial layers 192 may be equal to or less than about $10^{20}$ cm$^{-3}$. In some embodiments, the second epitaxial layers 194 may include heavily phosphorus-doped silicon (SiP), in which a phosphorus concentration in the second epitaxial layers 194 may be greater than about $10^{20}$ cm$^{-3}$. The low doping concentration in the first epitaxial layers 192 helps in reducing Schottky barrier with the un-doped Si in the fins 130. The high doping concentration in the second epitaxial layers 194 helps in reducing source/drain contact resistance. In some alternative embodiments where the source/drain epitaxial structures 190S/190D are for forming NFETs, the first and second epitaxial layers 192 and 194 may include different materials. For example, the first epitaxial layers 192 may include SiCP, SiAs, SiC, and the second epitaxial layers 194 may include heavily doped SiP. In some embodiments, the second epitaxial layers 194 may have a gradient phosphorous concentration. For example, the phosphorous concentration in the second epitaxial layers 194 increases as a distance from the first epitaxial layer 192 increases.

In the depicted embodiment, the first epitaxial layer 192 may be not only grown from top surfaces of the epitaxial features 184S/184D, but also grown from end surfaces of the channel layers 124. This is because formation of the source/drain epitaxial structures 190S/190D does not require the bottom-up approach as discussed previously with respect to sacrificial epitaxial plugs 182.

In some alternative embodiments the source/drain epitaxial structures 190S/190D are for forming PFETs, the first and second epitaxial layers 192 and 194 may be SiGe layers different at least in germanium atomic percentage (Ge %). In certain embodiments, the first epitaxial layer 192 has a lower germanium atomic percentage than the second epitaxial layer 194. Low germanium atomic percentage in the first epitaxial layer 192 helps in reducing Schottky barrier with the un-doped Si in the fins 130. High germanium atomic percentage in the second epitaxial layer 194 helps in reducing source/drain contact resistance. In some embodiments, the second epitaxial layer 194 may have a gradient germanium atomic percentage. For example, the germanium atomic percentage in the second epitaxial layer 194 increases as a distance from the first epitaxial layer 192 increases.

Once the source/drain epitaxial structures 190S/190D are formed, an annealing process can be performed to activate the n-type or p-type dopants in the source/drain epitaxial structures 190S/190D. The annealing process may be, for example, a rapid thermal anneal (RTA), a laser anneal, a millisecond thermal annealing (MSA) process or the like.

Figure 15:
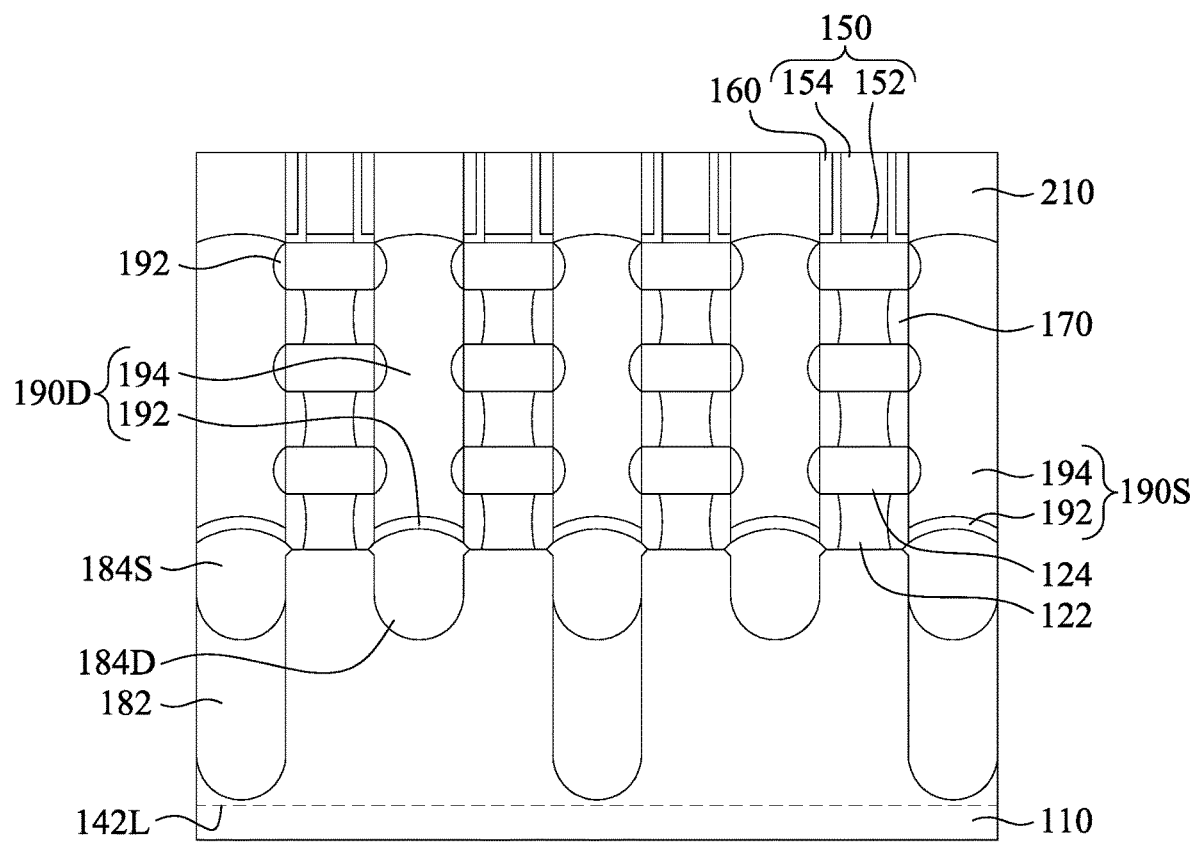

Referring to FIG. 15, a front-side ILD layer 210 is formed on the substrate 110. The ILD layer 210 is referred to a "front-side" ILD layer in this context because it is formed on a front-side of the multi-gate transistors (i.e., a side of the multi-gate transistors that gates protrude from source/drain regions 190S/190D). In some embodiments, a contact etch stop layer (CESL)(not shown) is also formed prior to forming the ILD layer 210. In some examples, the CESL includes a silicon nitride layer, silicon oxide layer, a silicon oxynitride layer, and/or other suitable materials having a different etch selectivity than the front-side ILD layer 210. The CESL may be formed by plasma-enhanced chemical vapor deposition (PECVD) process and/or other suitable deposition or oxidation processes. In some embodiments, the front-side ILD layer 210 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials having a different etch selectivity than the CESL. The front-side ILD layer 210 may be deposited by a PECVD process or other suitable deposition technique. In some embodiments, after formation of the front-side ILD layer 210, the integrated circuit structure may be subject to a high thermal budget process to anneal the front-side ILD layer 210.

In some examples, after depositing the front-side ILD layer, a planarization process may be performed to remove excessive materials of the front-side ILD layer. For example, a planarization process includes a chemical mechanical planarization (CMP) process which removes portions of the front-side ILD layer 210 overlying the dummy gate structures 150 and planarizes a top surface of the integrated circuit structure. In some embodiments, the CMP process also removes hard mask layers 156 (as shown in FIG. 14) and exposes the dummy gate electrode layer 154.

Figure 16:
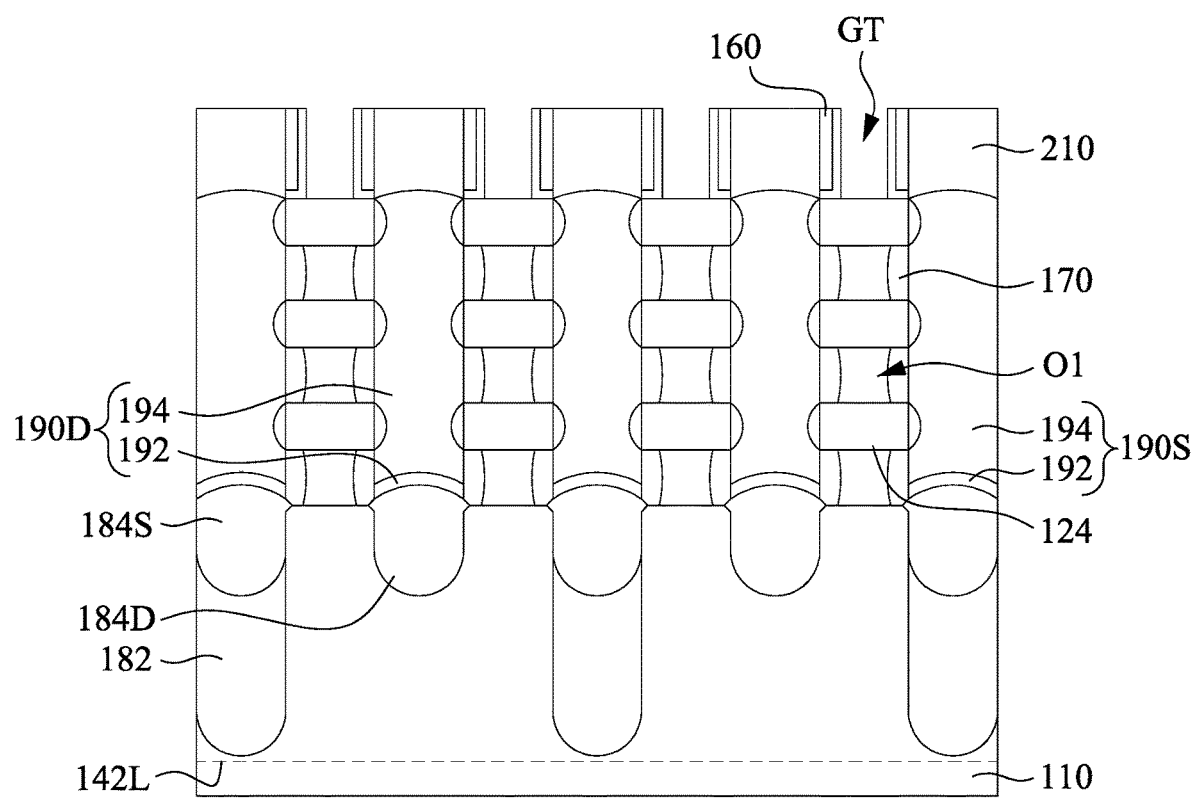
Figure 17:
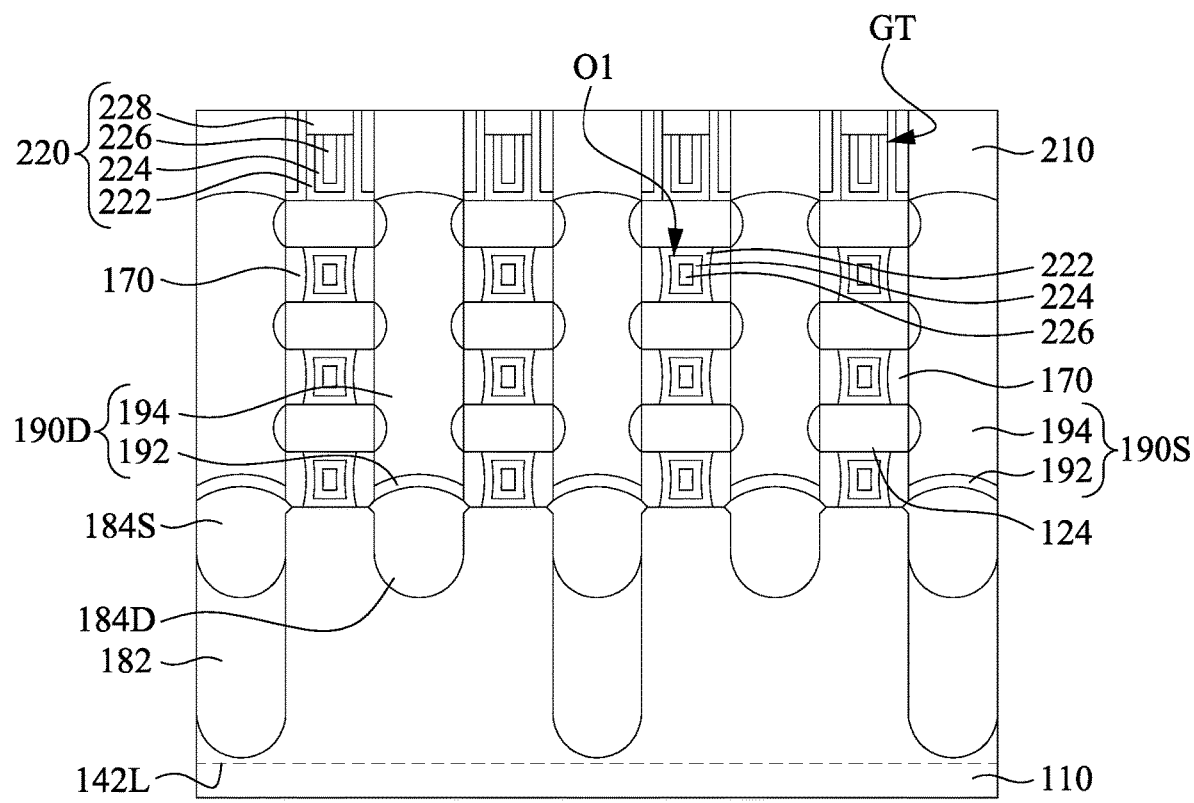

Referring to FIG. 16, the dummy gate structures 150 (as shown in FIG. 15) are removed first, and then the sacrificial layers 122 are removed. In the illustrated embodiments, a first selective etching process (e.g., selective dry etching, selective wet etching, or a combination thereof) is performed to remove the dummy gate structures 150. The selective etching process etches the materials in dummy gate structures 150 at a faster etch rate than it etches other materials (e.g., gate sidewall spacers 160, CESL 200 and/or front-side ILD layer 210), thus resulting in gate trenches GT between corresponding gate sidewall spacers 160, with the sacrificial layers 122 exposed in the gate trenches GT. Subsequently, a second selective etching process is performed to remove the sacrificial layers 122 in the gate trenches GT. The second selective etching process etches the sacrificial layers 122 at a faster etch rate than it etches the channel layers 124, thus forming openings O1 between neighboring channel layers 124. In this way, the channel layers 124 become nanosheets suspended over the substrate 110 and between the source/drain epitaxial structures 190S/190D. This step is also called a channel release process. At this interim processing step, the openings 119 between channel layers 124 may be filled with ambient environment conditions (e.g., air, nitrogen, etc). In some embodiments, the channel layers 124 can be interchangeably referred to as nanowires, nanosheets, nanoslabs and nanorings, depending on their geometry. For example, in some other embodiments the channel layers 124 may be trimmed to have a substantial rounded shape (i.e., cylindrical) due to the second selective etching process for completely removing the sacrificial layers 122. In that case, the resultant channel layers 124 can be called nanowires.

In some embodiments, the second selective etching process for removing the sacrificial layers 122 may be a selective wet etching process. In some embodiments, the sacrificial layers 122 are SiGe and the channel layers 124 are silicon allowing for the selective removal of the sacrificial layers 122. In some embodiments, the selective wet etching includes an APM etch (e.g., ammonia hydroxide-hydrogen peroxide-water mixture). In some embodiments, the selective removal includes SiGe oxidation followed by a $SiGeO_x$ removal. For example, the oxidation may be provided by $O_3$ clean and then $SiGeO_x$ removed by an etchant such as $NH_4OH$ that selectively etches $SiGeO_x$ at a faster etch rate than it etches Si. Moreover, because oxidation rate of Si is much lower (sometimes 30 times lower) than oxidation rate of SiGe, the channel layers 124 may not be significantly etched by the channel release process. It can be noted that both the channel release step and the previous step of laterally recessing sacrificial layers use a selective etching process that etches SiGe at a faster etch rate than etching Si, and therefore these two steps may use the same etchant chemistry in some embodiments. In this case, the etching time/duration of channel release step is longer than the etching time/duration of the previous step of laterally recessing sacrificial layers, so as to completely remove the sacrificial SiGe layers.

Referring to FIG. 17, replacement gate structures 220 are respectively formed in the gate trenches GT to surround each of the channel layers 124 124 suspended in the gate trenches GT. The gate structure 220 may be the final gate of a GAA FET. The final gate structure may be a high-k/metal gate stack, however other compositions are possible. In some embodiments, each of the gate structures 220 forms the gate associated with the multi-channels provided by the plurality of channel layers 124. For example, high-k/metal gate structures 220 are formed within the openings O1 (as illustrated in FIG. 16) provided by the release of channel layers 124. In various embodiments, the high-k/metal gate structure 220 includes a interfacial layer 222 formed around the channel layers 124, a high-k dielectric layer 224 formed around the interfacial layer 222, a work function metal layer 226 formed around the high-k dielectric layer 224, and a fill metal 228 formed around the work function metal layer 226 and filling a remainder of gate trenches GT. The interfacial layer 222 may be a silicon oxide layer. The high-k dielectric layer 224 may include dielectric materials having a high dielectric constant, for example, greater than that of thermal silicon oxide (~3.9). The work function metal layer 226 and/or fill metal 228 used within high-k/metal gate structures 220 may include a metal, metal alloy, or metal silicide. Formation of the high-k/metal gate structures 220 may include depositions to form various gate materials, one or more liner layers, and one or more CMP processes to remove excessive gate materials.

In some embodiments, the interfacial layer 222 may include a dielectric material such as silicon oxide ($SiO_2$), HfSiO, or silicon oxynitride (SiON). The interfacial layer may be formed by chemical oxidation, thermal oxidation, atomic layer deposition (ALD), chemical vapor deposition (CVD), and/or other suitable method. The high-k dielectric layer 224 may include hafnium oxide ($HfO_2$). Alternatively, the high-k dielectric layer 224 may include other high-k dielectrics, such as hafnium silicon oxide (HfSiO), hafnium silicon oxynitride (HfSiON), hafnium tantalum oxide (HfTaO), hafnium titanium oxide (HfTiO), hafnium zirconium oxide (HfZrO), lanthanum oxide (LaO), zirconium oxide (ZrO), titanium oxide (TiO), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), silicon nitride ($Si_3N_4$), oxynitrides (SiON), and combinations thereof.

The work function metal layer 226 may include work function metals to provide a suitable work function for the high-k/metal gate structures 220. For an n-type GAA FET, the work function metal layer 226 may include one or more n-type work function metals (N-metal). The n-type work function metals may exemplarily include, but are not limited to, titanium aluminide (TiAl), titanium aluminium nitride (TiAlN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, and/or other suitable materials. On the other hand, for a p-type GAA FET, the work function metal layer 226 may include one or more p-type work function metals (P-metal). The p-type work function metals may exemplarily include, but are not limited to, titanium nitride (TiN), tungsten nitride (WN), tungsten (W), ruthenium (Ru), palladium (Pd), platinum (Pt), cobalt (Co), nickel (Ni), conductive metal oxides, and/or other suitable materials.

In some embodiments, the fill metal 228 may exemplarily include, but are not limited to, tungsten, aluminum, copper, nickel, cobalt, titanium, tantalum, titanium nitride, tantalum nitride, nickel silicide, cobalt silicide, TaC, TaSiN, TaCN, TiAl, TiAlN, or other suitable materials.

Figure 18:
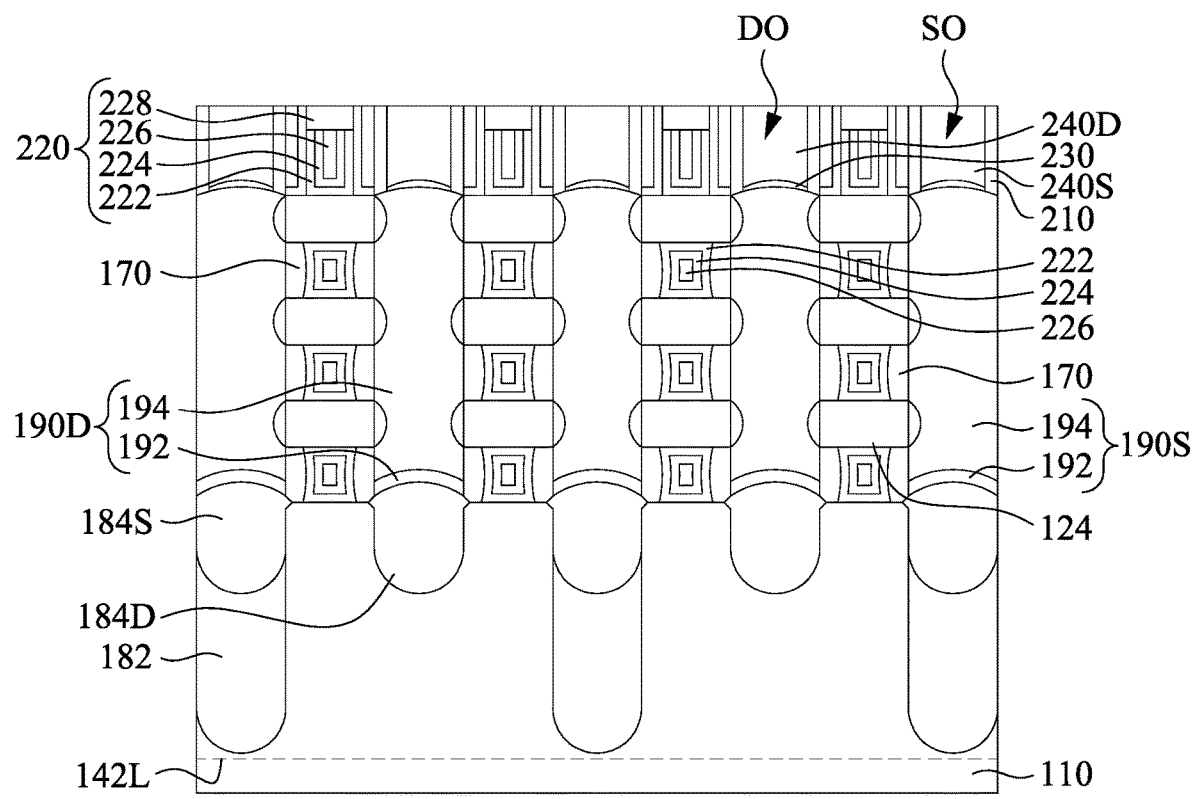

Referring to FIG. 18, drain contacts 240D are respectively formed over the drain epitaxial structures 190D. In some embodiments, drain contact openings DO are formed through the front-side ILD layer 210 to expose the drain epitaxial structures 190D by using suitable photolithography and etching techniques. Subsequently, a silicide region 230 is formed on the front side of the drain epitaxial structure 190D by using a silicidation process, followed by forming a drain contact 240D over the drain silicide region 230. Silicidation process may be performed by depositing a metal layer (e.g., nickel layer or cobalt layer) over the exposed drain epitaxial structure 190D, annealing the metal layer such that the metal layer reacts with silicon (and germanium if present) in the drain epitaxial structure 190D to form the metal silicide region 230 (e.g., nickel silicide or cobalt silicide), and thereafter removing the non-reacted metal layer. Drain contact 240D may be formed by depositing one or more metal materials (e.g., tungsten, cobalt, copper, the like or combinations thereof) to fill the drain contact hole by using suitable deposition techniques (e.g., CVD, PVD, ALD, the like or combinations thereof), followed by a CMP process to remove excess metal materials outside the drain contact opening.

In the present embodiments, along with the formation of the drain contact 240D, dummy source contacts 240S are the respectively formed over the source epitaxial structures 190S during the formation of the drain contacts 240D. For example, source contact openings SO are formed through the front-side ILD layer 210 to expose the source epitaxial structures 190S by using suitable photolithography and etching techniques. Subsequently, a silicide region 230 is formed on the front side of the source epitaxial structure 190S by using a silicidation process, followed by forming a dummy source contacts 240S over the silicide region 230. In some other embodiments, the dummy source contacts 240S may not be formed, and top surfaces of the source epitaxial structures 190S may be covered by the front-side ILD layer 210.

Figure 19:
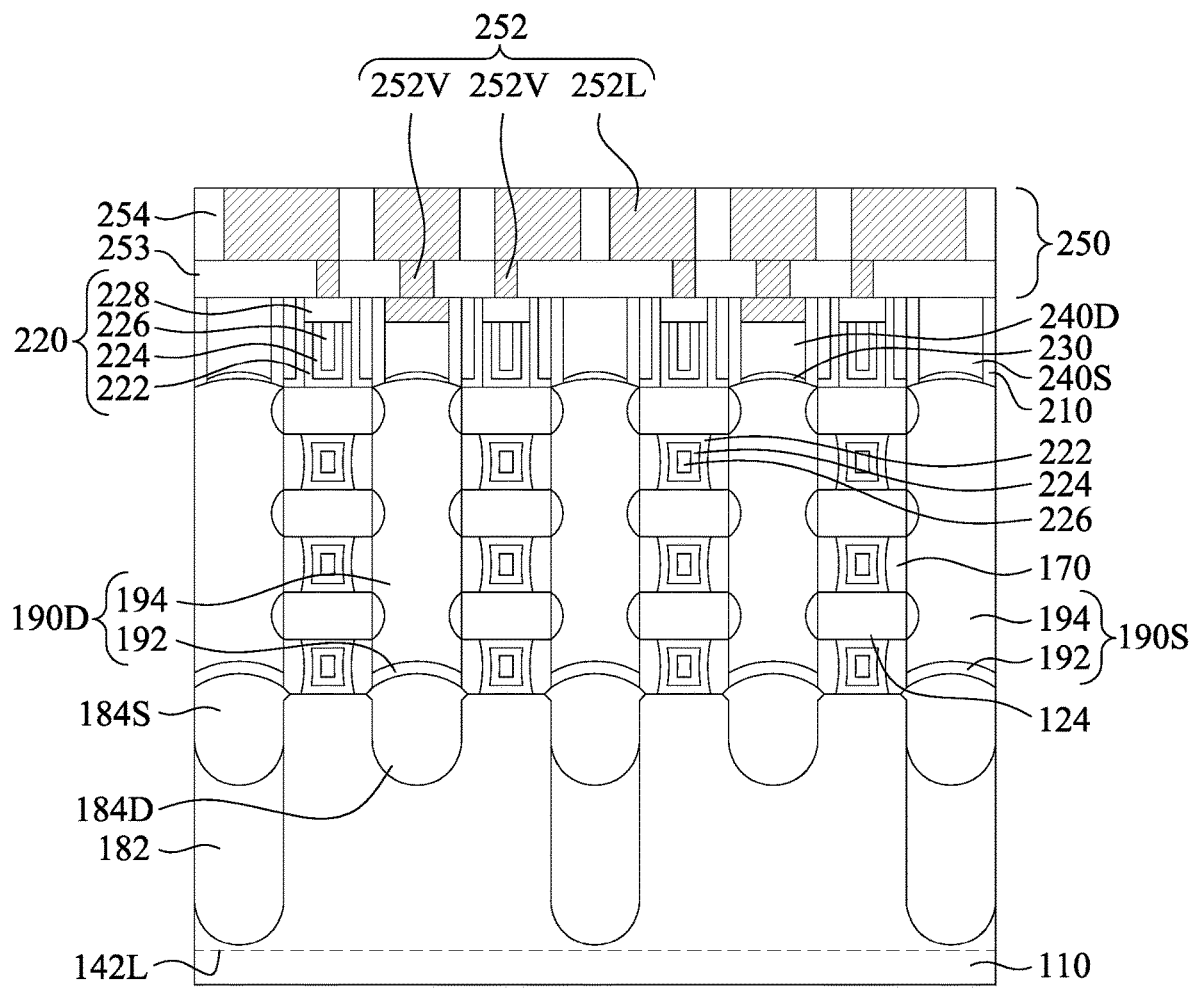

Referring to FIG. 19, a front-side multilayer interconnection (MLI) structure 250 is formed over the substrate 110. The front-side MLI structure 250 may comprises a plurality of front-side metallization layers 252. The number of front-side metallization layers 252 may vary according to design specifications of the integrated circuit structure. Only one front-side metallization layers 252 are illustrated in FIG. 19 for the sake of simplicity. The front-side metallization layers 252 comprise one or more horizontal interconnects, such as front-side metal lines 252L, respectively extending horizontally or laterally in front-side IMD layers 254 and/or vertical interconnects, such as front-side conductive vias 252V, respectively extending vertically in front-side IMD layers 253.

In some embodiments, a front-side conductive via 252V in a bottommost front-side metallization layer 252 is in contact with the gate structure 220 to make electrical connection to the gate structure 220, and a front-side conductive via 252V in the bottommost front-side metallization layer 252 is in contact with the drain contact 240D to make electrical connection to the drain epitaxial structure 190D.

The front-side metal lines 252L and front-side conductive vias 252V can be formed using, for example, a single damascene process, a dual damascene process, the like, or combinations thereof. In some embodiments, the front-side IMD layers 253-254 may include low-k dielectric materials having k values, for example, lower than about 4.0 or even 2.0 disposed between such conductive features. In some embodiments, the front-side IMD layers may be made of, for example, phosphosilicate glass (PSG), borophosphosilicate glass (BPSG), fluorosilicate glass (FSG), $SiO_xC_y$, Spin-On-Glass, Spin-On-Polymers, silicon oxide, silicon oxynitride, combinations thereof, or the like, formed by any suitable method, such as spin-on coating, chemical vapor deposition (CVD), plasma-enhanced CVD (PECVD), or the like. The front-side metal lines 252L and front-side conductive vias 252V may comprise metal materials such as copper, aluminum, tungsten, combinations thereof, or the like. In some embodiments, the front-side metal lines 252L and front-side conductive vias 252V may further comprise one or more barrier/adhesion layers (not shown) to protect the respective front-side IMD layers 253-254 from metal diffusion (e.g., copper diffusion) and metallic poisoning. The one or more barrier/adhesion layers may comprise titanium, titanium nitride, tantalum, tantalum nitride, or the like, and may be formed using physical vapor deposition (PVD), CVD, ALD, or the like.

Figure 20:
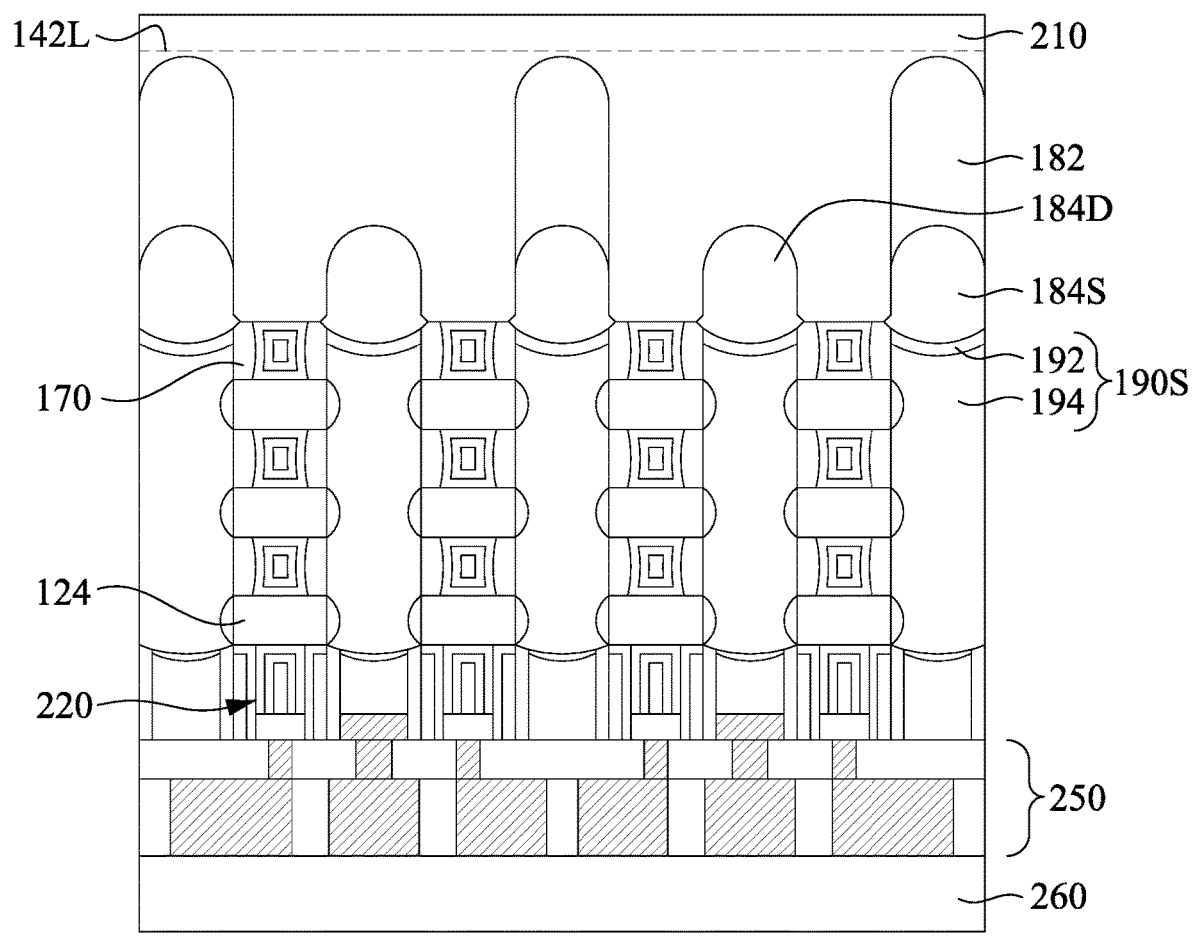

Referring to FIG. 20, a carrier substrate 260 is bonded to the front-side MLI structure 250 in accordance with some embodiments of the present disclosure. The carrier substrate 260 may be silicon, doped or undoped, or may include other semiconductor materials, such as germanium; a compound semiconductor; or combinations thereof. The carrier substrate 260 may provide a structural support during subsequent processing on backside of the integrated circuit structure and may remain in the final product in some embodiments. In some other embodiments, the carrier substrate 260 may be removed after the subsequent processing on backside of integrated circuit structure is complete. In some embodiments, the carrier substrate 260 is bonded to a topmost dielectric layer of the MLI structure 250 by, for example, fusion bonding. Afterwards, the integrated circuit structure is flipped upside down, such that a backside surface of the substrate 110 faces upwards.

Figure 21:
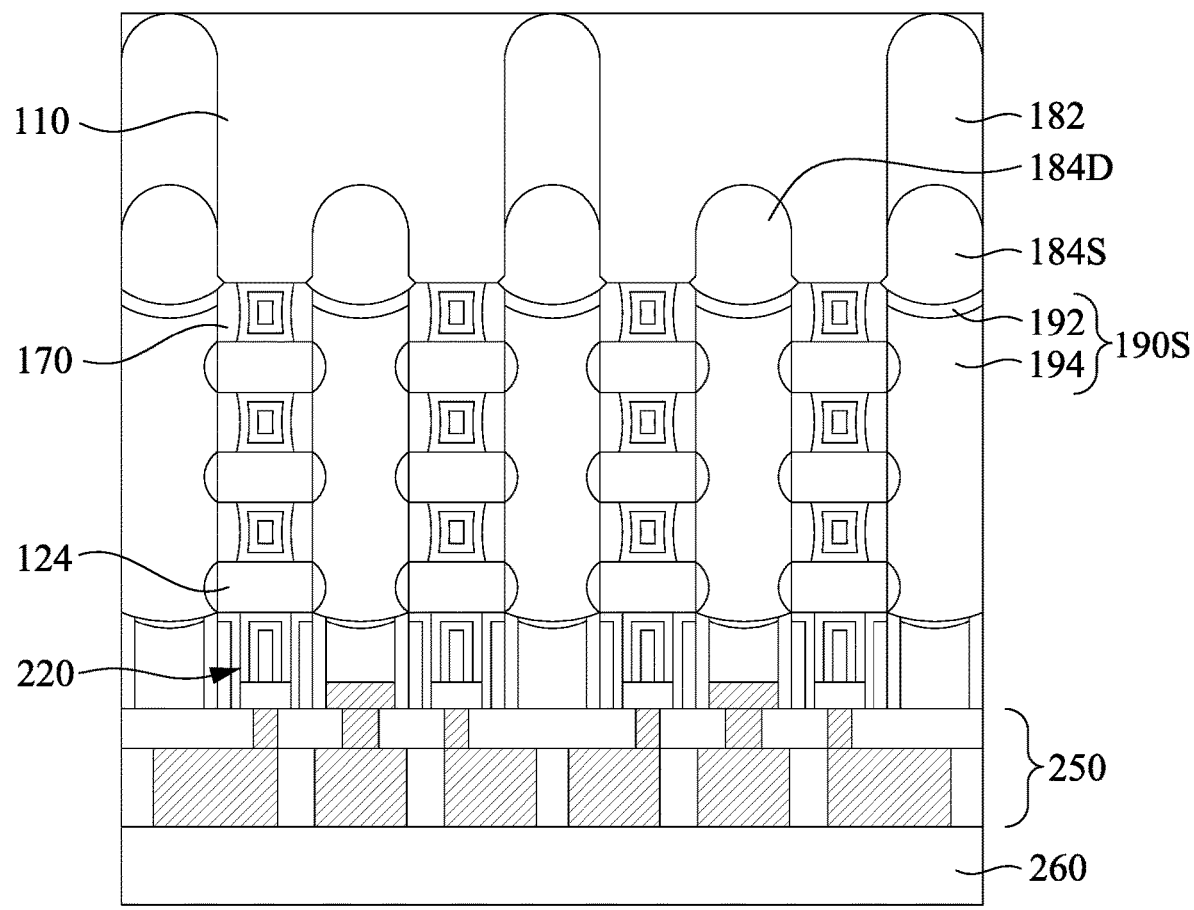

Referring to FIG. 21, the substrate 110 is thinned down. In some embodiments, thinning is accomplished by a CMP process, a grinding process, or the like. The thinning may be performed such that the sacrificial epitaxial plugs 182 are exposed.

Figure 22:
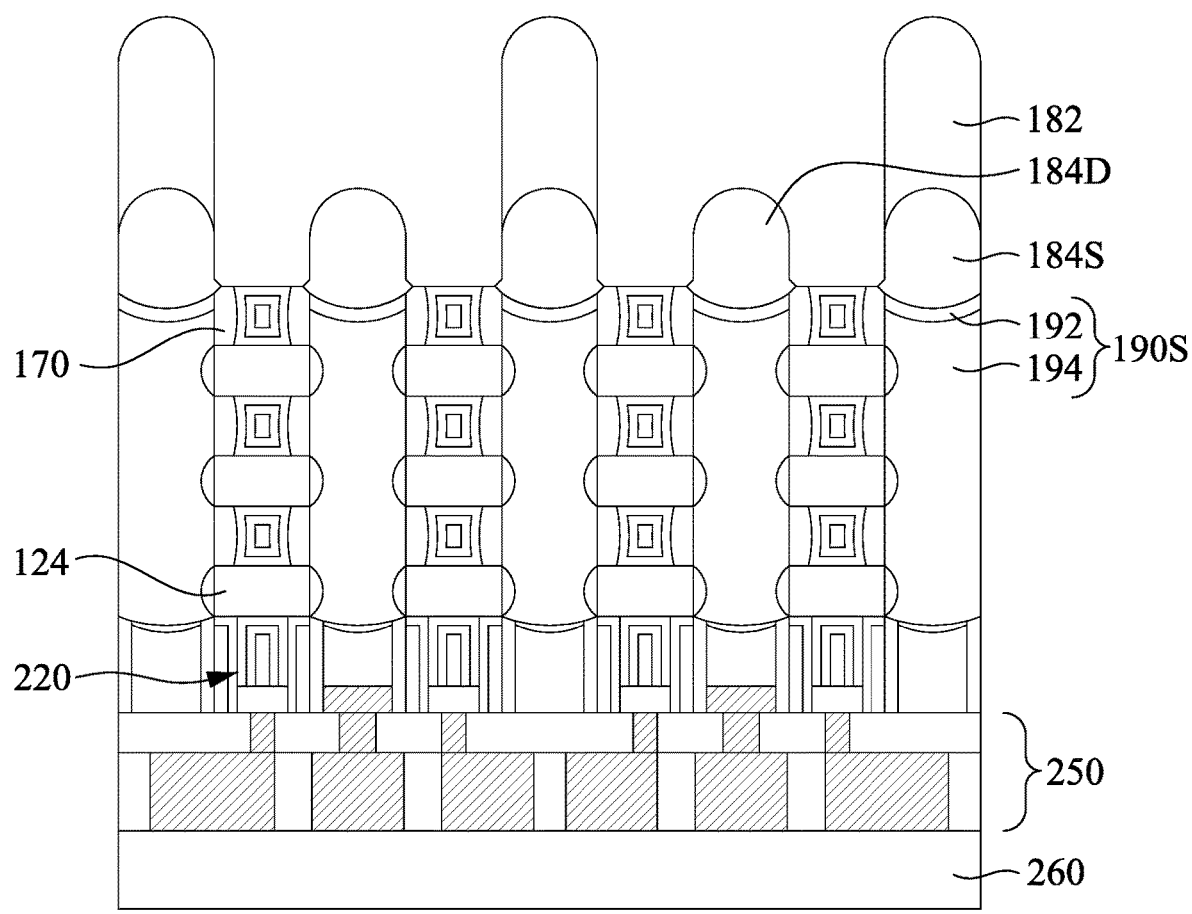

Referring to FIG. 22, the substrate 110 (referring to FIG. 21) is removed by using a selective etching process that etches Si at a faster etch rate than it etches the sacrificial epitaxial plugs 182. In some embodiments, the selective etching process for selectively removing the Si substrate 110 may be a wet etching process using an wet etching solution such as tetramethylammonium hydroxide (TMAH), potassium hydroxide (KOH), NH$_4$OH, the like or combinations thereof. As a result of the selective etching process, the sacrificial epitaxial plugs 182 and the epitaxial features 184S protrude from backsides of the source epitaxial structure 190S, and the epitaxial features 184D from backsides of the drain epitaxial structure 190D.

Figure 23:
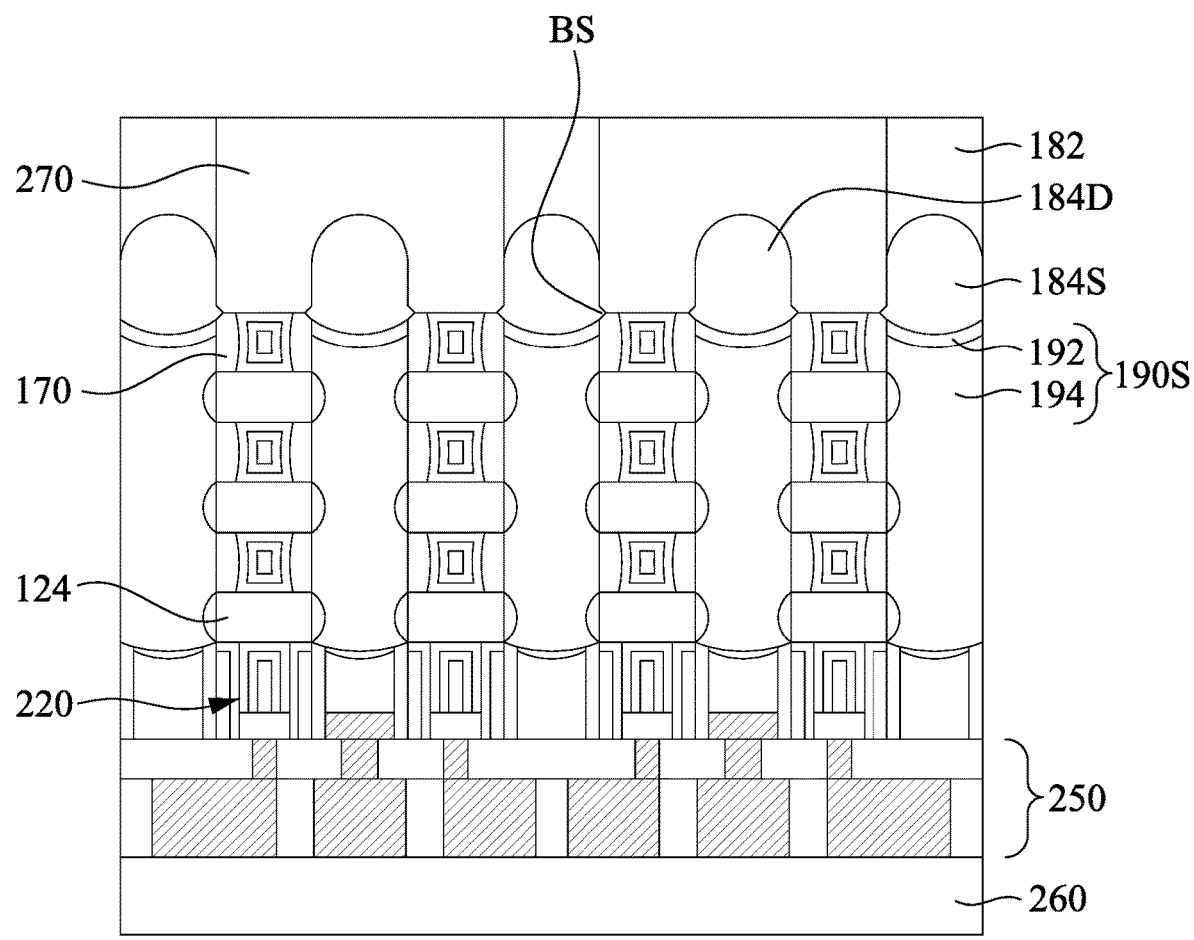

Referring to FIG. 23, a backside ILD layer 270 is formed around the sacrificial epitaxial plugs 182. For example, one or more dielectric materials is deposited over the sacrificial epitaxial plugs 182 and the epitaxial features 184S and 184D by using suitable deposition techniques such as a conform deposition technique like CVD. Subsequently, the deposited dielectric material is thinned down by using, for example, an etch back process, a planarization process (e.g., a CMP process) or the like, until the sacrificial epitaxial plugs 182 are exposed from the backside ILD layer 270. In some embodiments, since the sacrificial epitaxial plugs 182 are not deeper than the STI features 142 (referring to FIGS. 11 and 12), for exposing the sacrificial epitaxial plugs 182, the CMP process may remove a portion of the STI features 142. The ILD layer 270 is referred to as a "backside" ILD layer in this context because it is formed on a backside of the multi-gate transistors opposite to the front-side of the multi-gate transistors that replacement gate structures 220 protrude from source/drain regions 190S/190D.

In some embodiments, the backside ILD layer 270 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. In some embodiments, the backside ILD layer 270 has a same material as the front-side ILD layer 210. Through the steps shown in FIGS. 22 and 23, the substrate 110 (referring to FIG. 21) is replaced with the backside ILD layer 270.

Figure 24:
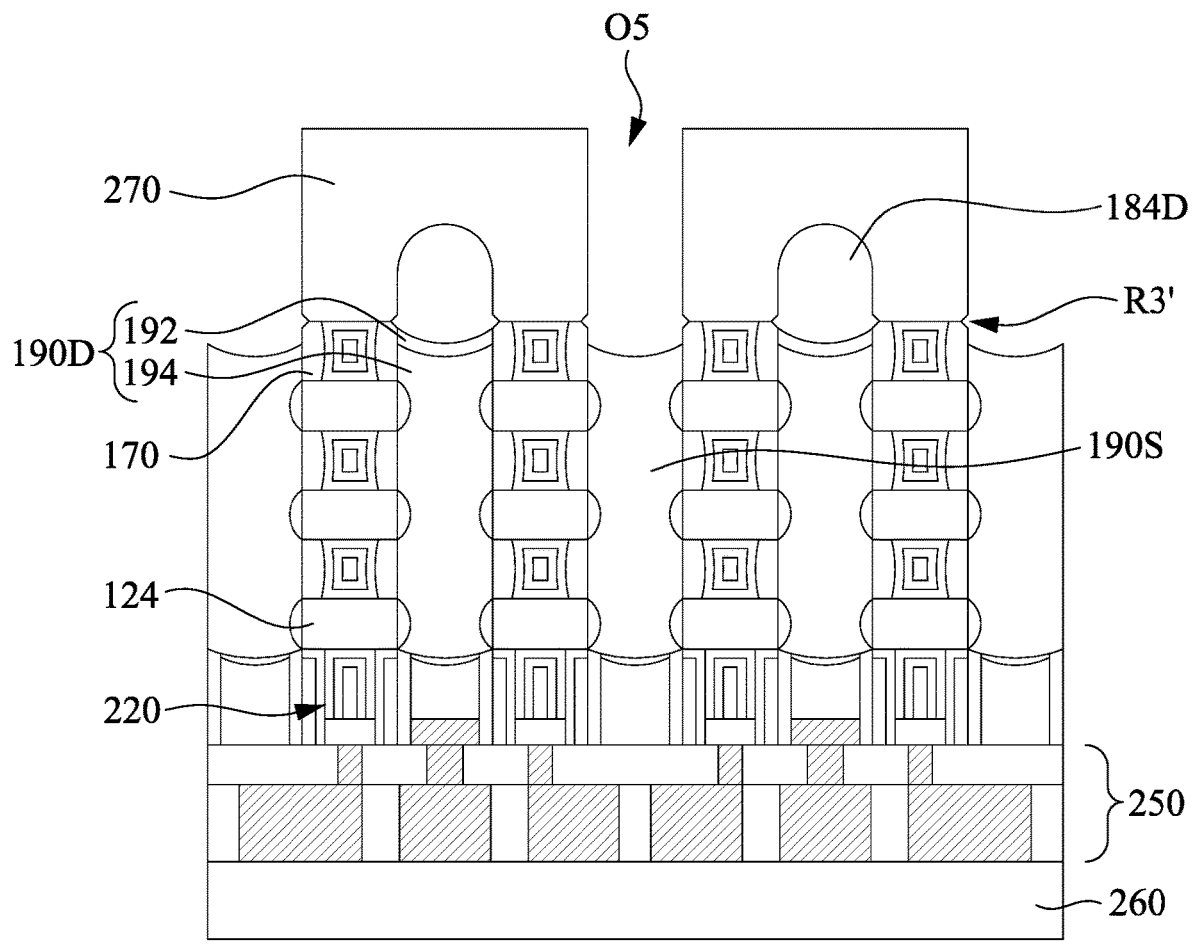

Referring to FIGS. 23 and 24, the sacrificial epitaxial plugs 182 and the epitaxial features 184S are removed to form backside via openings O5 extending through the backside ILD layer 270 to expose backsides of the source epitaxial structures 190S. In some embodiments, the sacrificial epitaxial plugs 182 are removed by using a selective etching process that etches SiGe of the sacrificial epitaxial plugs 182 and the epitaxial features 184S at a faster etch rate than it etches the dielectric material of the backside ILD layer 270. Stated another way, the selective etching process uses an etchant that attacks SiGe, and hardly attacks the backside ILD layer 270. By way of example and not limitation, the sacrificial epitaxial plugs 182 and the epitaxial features 184S are removed by a selective wet etching such as an APM etch (e.g., ammonia hydroxide-hydrogen peroxide-water mixture) that selectively etches SiGe at a faster etch rate than it etches dielectric materials. In some embodiments, the epitaxial features 184D are not removed by the selective etching process due to the coverage of the backside ILD layer 270.

As discussed previously, the epitaxial features 184S has a lower germanium atomic concentration than the sacrificial epitaxial plugs 182, thus allowing for different etch selectivity between the sacrificial epitaxial plugs 182 and the epitaxial features 184S. As a result, in some embodiments the SiGe selective etching process can etch the epitaxial features 184S at a slower etch rate than it etching the sacrificial epitaxial plugs 182. Therefore, the epitaxial features 184S can slow down the SiGe selective etching recess and thus acts as a detectable etch end point in the SiGe selective etching process, so as to prevent the source epitaxial structures 190S from being attacked by the SiGe selective etching process. In this way, the source epitaxial structures 190S may remain substantially intact after the SiGe selective etching process in some embodiments of the present disclosure. In some embodiments, backsides of the source epitaxial structures 190S are recessed due to the SiGe selective etching process. In that case, a portion of the first epitaxial layers 192 of the source epitaxial structures 190S at bottoms of the backside via openings O5 may be etched through and removed, such that the second epitaxial layers 194 (which have higher P % or Ge % than the first epitaxial layers 192) may be exposed at the bottoms of the backside via openings O5. In some other embodiments, the first epitaxial layers 192 of the source epitaxial structures 190S may not be etched through, and the first epitaxial layers 192 may remain at the backside of the second epitaxial layers 192.

Furthermore, the epitaxial features 184S have a beak portion BS, which enlarges the cross-sectional area of the epitaxial features 184S. The beak portion BS can enlarge the process window for stop etching the backside via openings O5. In some embodiments, the etching process for forming the backside via openings O5 may remove at least a portion of the beak portion BS of the epitaxial features 184S (referring to FIG. 23), thereby forming side recesses R3' between the backside ILD layer 270 and the inner spacers 170. In some embodiments, the side recesses R3' may have a shape of bird's beak. For example, a size of the side recesses R3' shrinks as approaching the gate structure 220. In some embodiments, the side recesses R3 may not expose the gate structure 220. Alternatively, in some other embodiments the side recesses R3 may expose the gate structure 220.

In some embodiments, as shown in the figure, the etching process for forming the backside via openings O5 may entirely remove the beak portion BS of the epitaxial features 184S (referring to FIG. 23), such that the side recesses R3' may expose the backside ILD layer 270 and the inner spacers 170. In some other embodiments, the etching process for forming the backside via openings O5 may not entirely remove the beak portion BS of the epitaxial features 184S (referring to FIG. 23), such that the side recesses R3' may be formed in a remaining portion of the epitaxial features 184S (referring to FIG. 23). In some other embodiments, the etching process for forming the backside via openings O5 may not remove the beak portion BS of the epitaxial features 184S (referring to FIG. 23), such that no side recess R3' is formed.

Figure 25:
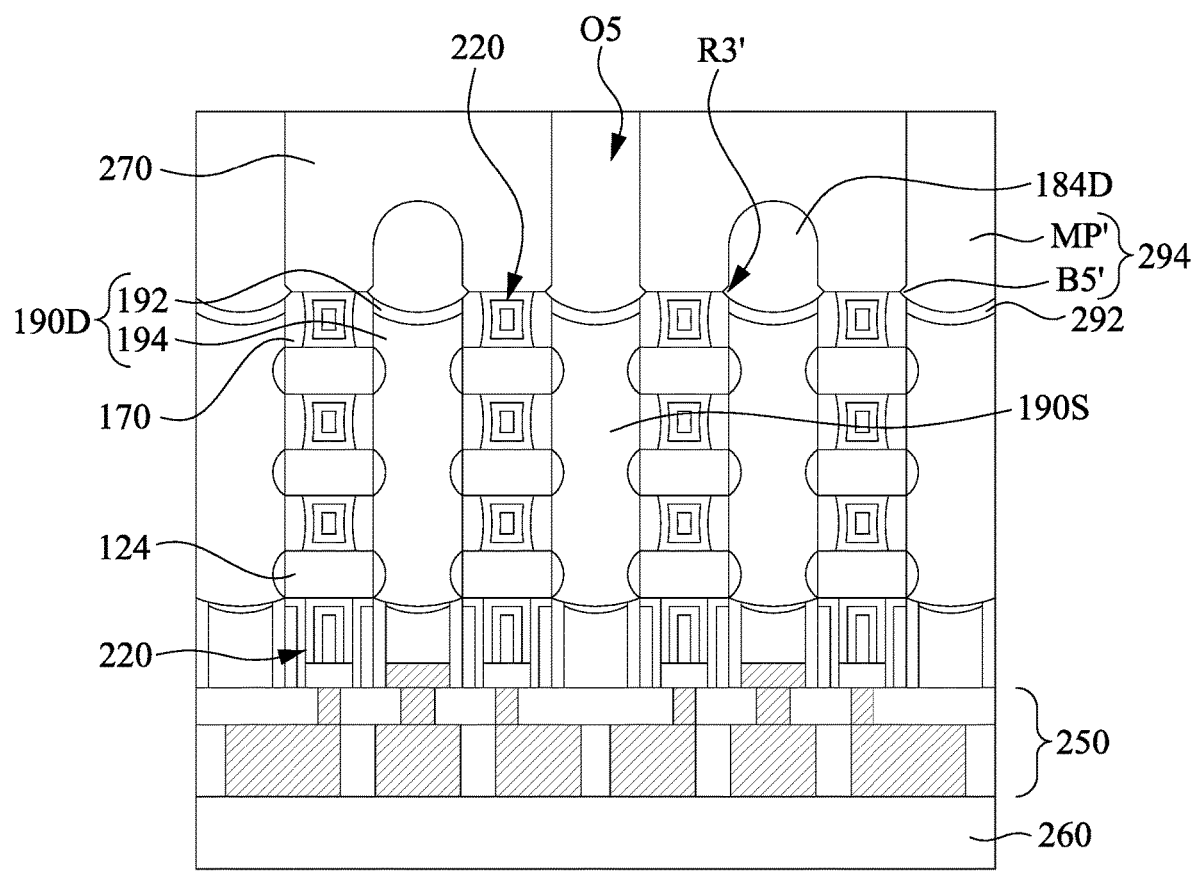

Referring to FIG. 25, backside vias 294 are formed in the backside via openings O5. In some embodiments, a source silicide region 292 is formed on the backside of each of the source epitaxial structures 190S by using a silicidation process, followed by forming a source contact (e.g., backside vias 294) over the source silicide region 292. Silicidation process may be performed by depositing a metal layer (e.g., titanium layer, nickel layer, or cobalt layer) over the exposed backsides of source epitaxial structures 190S, annealing the metal layer such that the metal layer reacts with silicon (and germanium if present) in the source epitaxial structures 190S to form the metal silicide region 292 (e.g., titanium silicide, nickel silicide or cobalt silicide), and thereafter removing the non-reacted metal layer. The backside vias 294 may be formed by depositing one or more metal materials (e.g., tungsten, cobalt, copper, the like or combinations thereof) to fill the drain contact hole by using suitable deposition techniques (e.g., CVD, PVD, ALD, the like or combinations thereof), followed by a CMP process to remove excess metal materials outside the source contact (e.g., backside vias 294).

In the present embodiments, the backside via 294 may have a beak portion BS' filling the side recess R3' (referring to FIG. 24) between the backside ILD layer 270 and the inner spacer 170. For example, each of the backside via 294 has a body portion MP' in the backside via openings O5, and the beak portion BS' is connected to the body portion MP' and tapers away from the body portion MP'. In some other embodiments wherein the etching process for forming the backside via openings O5 may not remove the beak portion BS of the epitaxial features 184S (referring to FIG. 23), no side recess R3' is formed, which in turn will result in the backside via 294 does not have a beak portion BS' between the backside ILD layer 270 and the inner spacer 170.

In the present embodiments, the first epitaxial layers 192 of the source epitaxial structures 190S may be etched through, such that the source silicide regions 292 are in contact with the second epitaxial layers 194. The first epitaxial layers 192 of the source epitaxial structures 190S are illustrated as being entirely removed in the present embodiments. In some other embodiment wherein the first epitaxial layers 192 of the source epitaxial structures 190S may not be entirely removed, and portions of the first epitaxial layers 192 may be between the source silicide regions 292 and the second epitaxial layers 194.

In some embodiments, since the backside via 294 is formed by replacing a germanium-containing feature (e.g., epitaxial plugs 182 and epitaxial features 184S), germanium atoms in the germanium-containing feature may diffuse into the backside ILD layer 270. The diffusion may result in a germanium residue at an interface between the backside via 294 and the backside ILD layer 270 may be observed or detectable in products. For example, in some embodiments, a germanium atomic concentration in the backside ILD layer 270 may increases as approaching the backside via 294. Also, a germanium residue at an interface between the backside via 294 and the STI features 142 (referring to FIG. 6) may be observed or detectable in products. For example, in some embodiments, a germanium atomic concentration in the STI features 142 (referring to FIG. 6) may increases as approaching the backside via 294.

Figure 26:
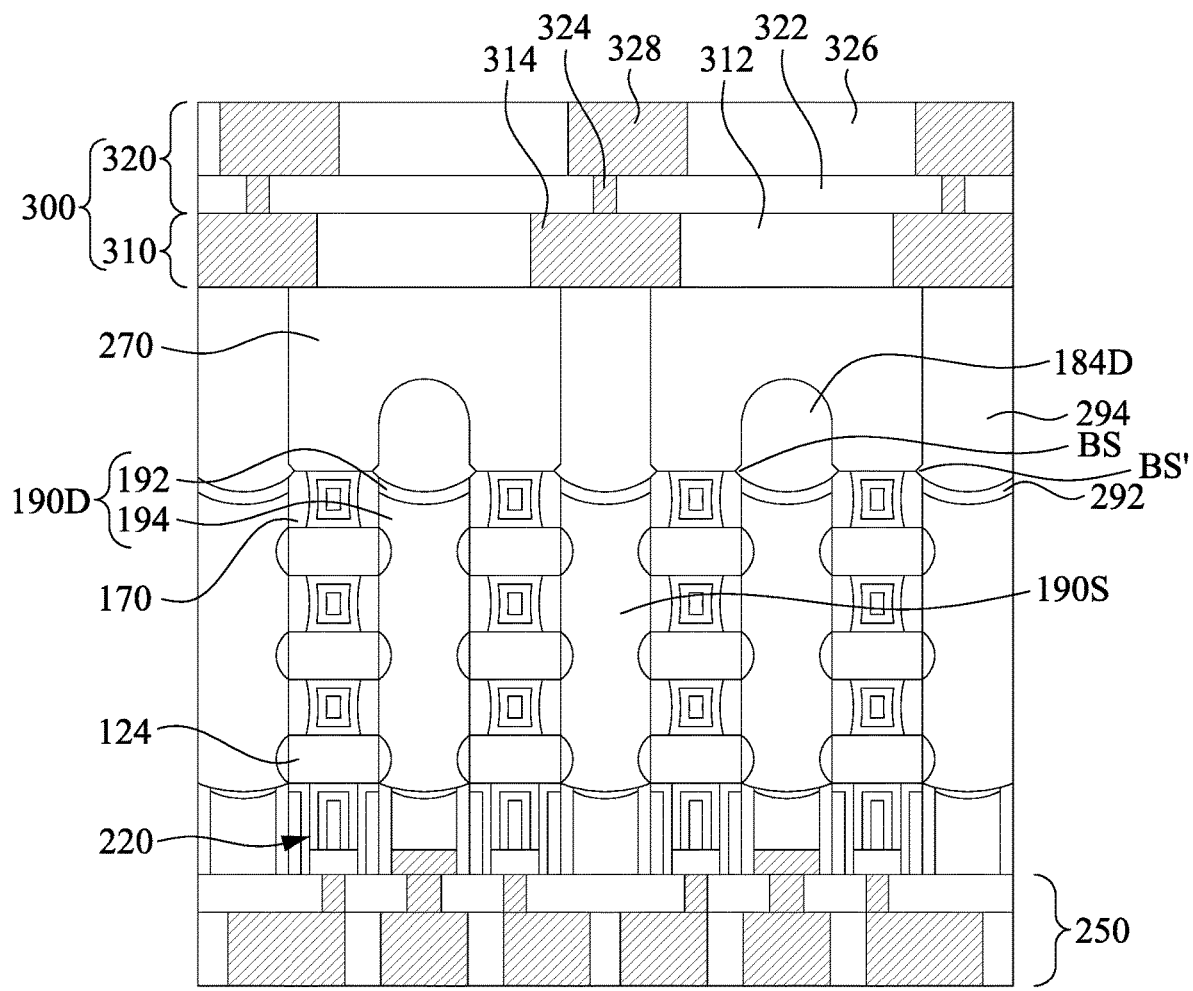

Referring to FIG. 26, a backside MLI structure 300 is formed over the backside vias 294 and the backside ILD layer 270. The backside MLI structure 300 may comprise a bottommost metallization layer 310 and a plurality of upper backside metallization layers 320 over the bottommost backside metallization layer 310. The number of upper backside metallization layers 320 may vary according to design specifications of the integrated circuit structure. Only one backside metallization layer 320 (also called backside M1 layer) is illustrated in FIG. 26 for the sake of simplicity.

The bottommost backside metallization layer 310 (also called backside M0 layer) comprises a backside IMD layer 312 over the backside ILD layer 270 and one or more horizontal interconnects, such as backside metal lines 314, respectively extending horizontally or lateralling in the backside IMD layer 312. A metal line 314 in the bottommost backside metallization layer 310 is a power rail that extends across and is in contact with one or more source backside vias 294, so as to make electrical connection to one or more source epitaxial structures 190S. Because the power rail is formed in the backside MLI structure 300, more routing space can be provided for the integrated circuit structure.

The backside metallization layer (e.g., backside M1 layer) 320 each comprise a first backside inter-metal dielectric (IMD) layer 322 and a second backside IMD layer 326 formed over the first backside IMD layers 322. The backside metallization layers 320 comprise one or more horizontal interconnects, such as backside metal lines 328, respectively extending horizontally or laterally in the second backside IMD layers 326 and vertical interconnects, such as backside vias 324, respectively extending vertically in the first backside IMD layers 322.

Through the configuration, an IC structure includes an ILD layer 270, a semiconductor layer 124, a gate structure 220, spacers 170, source/drain epitaxial structure 190S/190D, a backside via 294, and an epitaxial feature 184D. The semiconductor layer 124 is over the ILD layer 270. The gate structure 220 is over the ILD layer 270 and the semiconductor layer 124. The spacers 170 are on opposite sides of the gate structure 220. The source/drain epitaxial structures 190S/190D are respectively on opposite sides of the gate structure 220. The backside via 294 extends through the ILD layer 270 to the source/drain epitaxial structure 190S. The epitaxial feature 184D is between the source/drain epitaxial structure 190D and the ILD layer 270. In some embodiments, the backside via 294 has a portion (e.g., the beak portion BS') between the ILD layer 270 and the spacers 170. In some embodiments, the epitaxial feature 184D has a portion (e.g., the beak portion BS) between the ILD layer 270 and the spacers 170. In some embodiments, the semiconductor layer 124, the gate structure 220, and the source/drain epitaxial structure 190S/190D form an n-type device, and a SiGe feature (e.g., the SiGe epitaxial feature 184D) can be found in the n-type device.

Figure 27A:
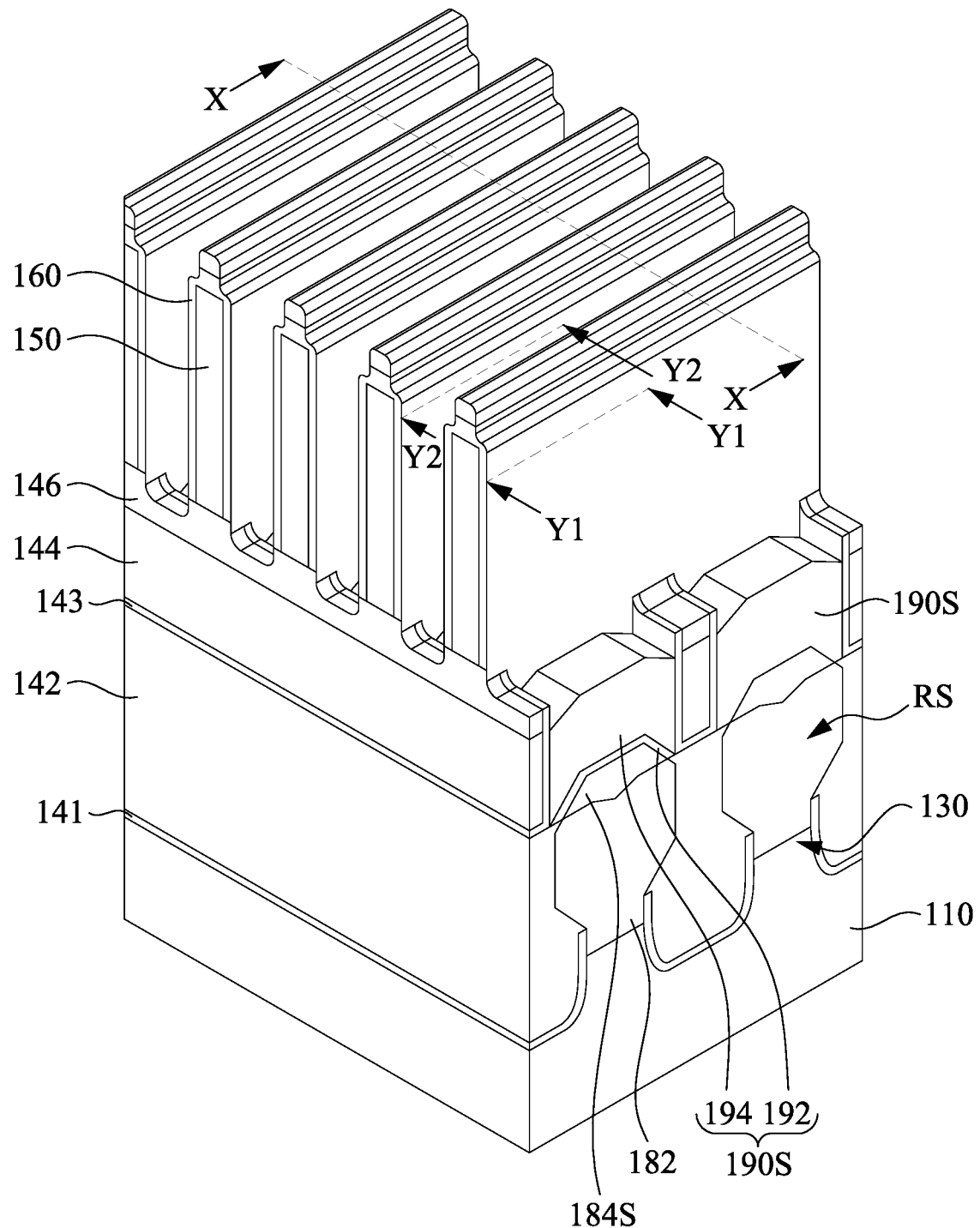
FIGS. 27A to 28C illustrate a semiconductor device at various stages of manufacturing in accordance with some embodiments of the present disclosure.
Figure 27B:
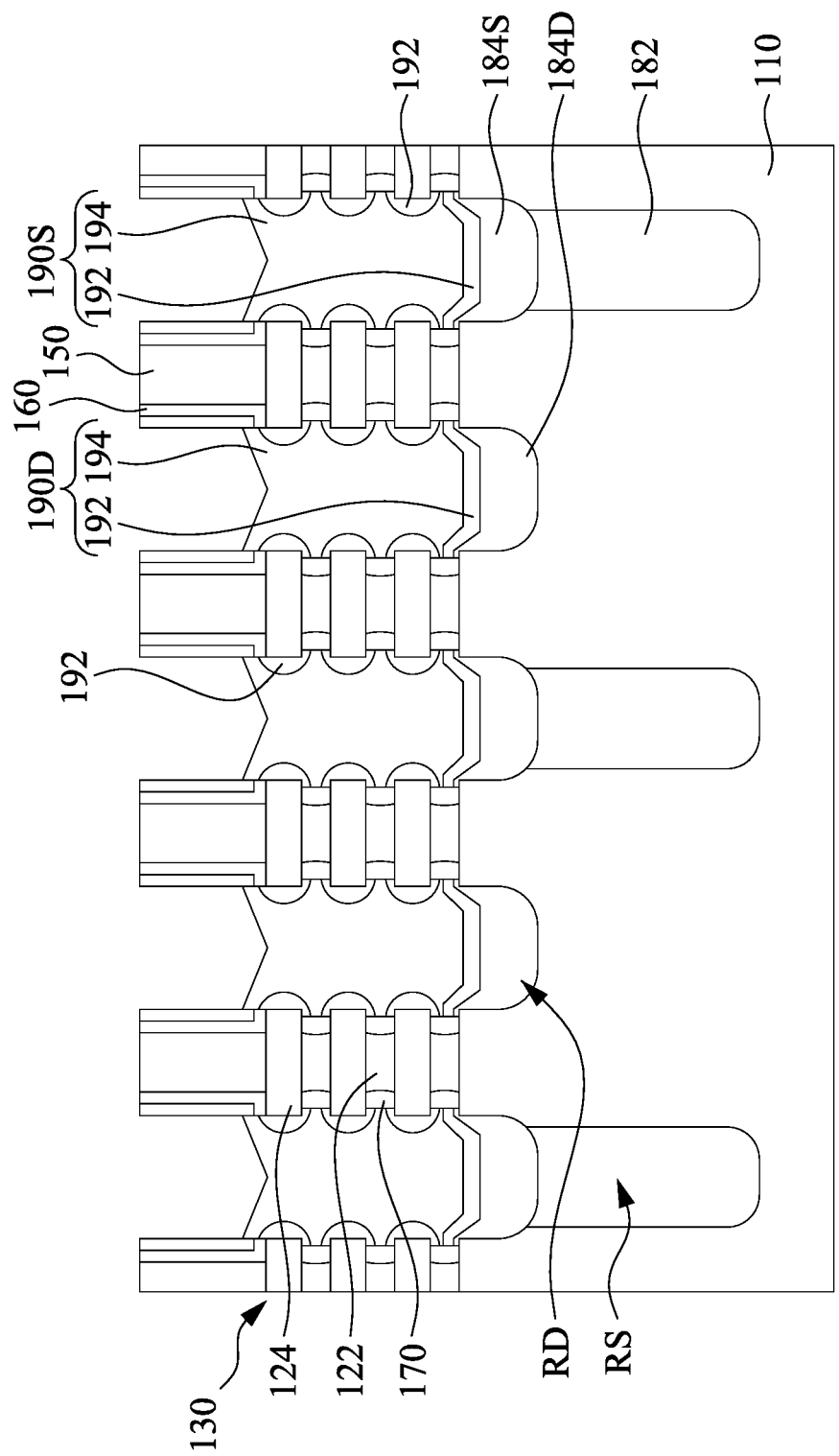
Figure 27D:
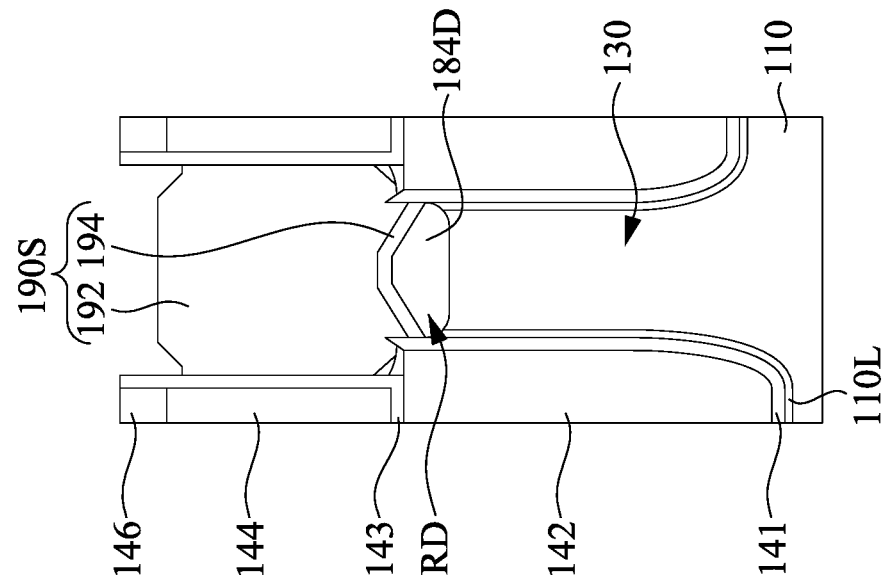
Figure 27C:
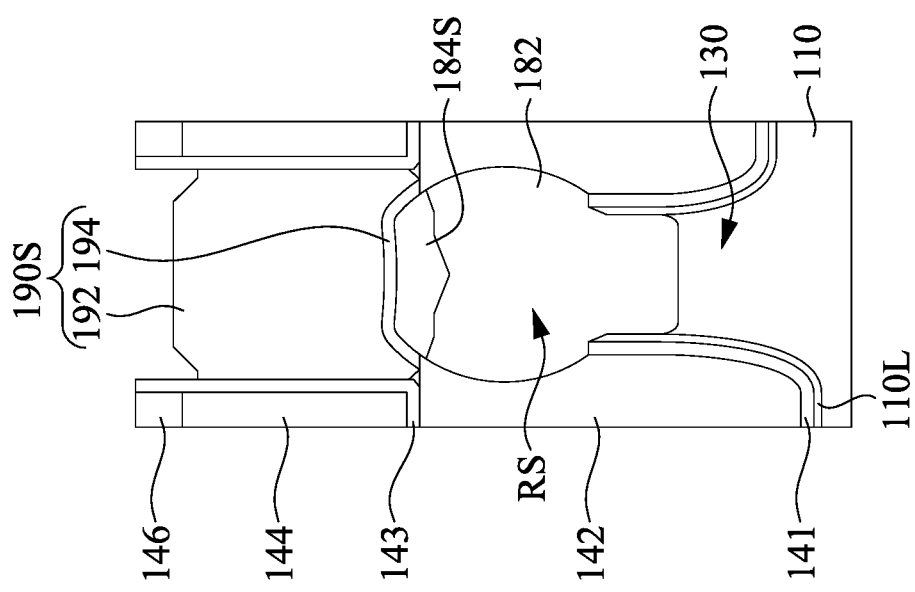
Figure 28A:
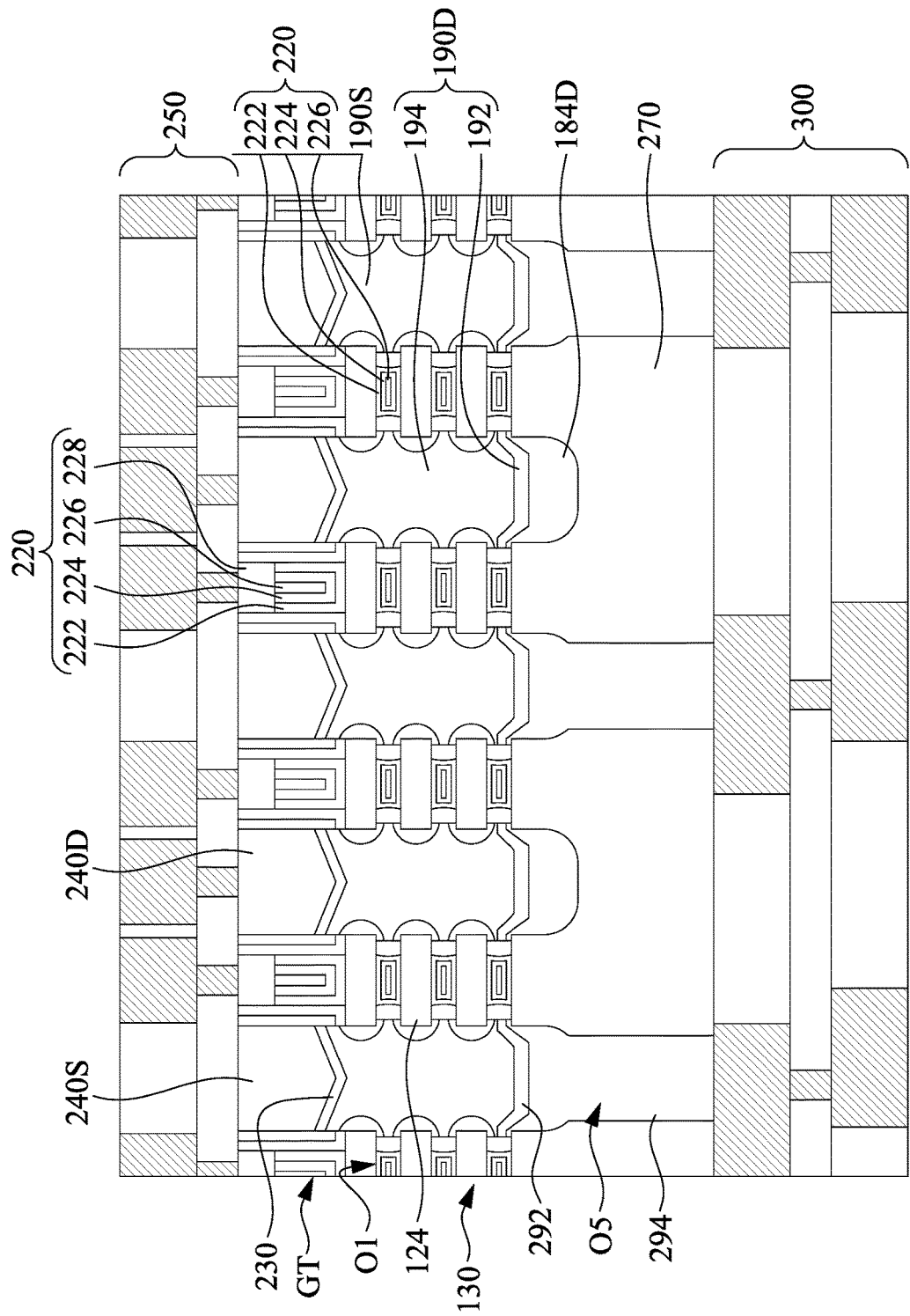
Figure 28C:
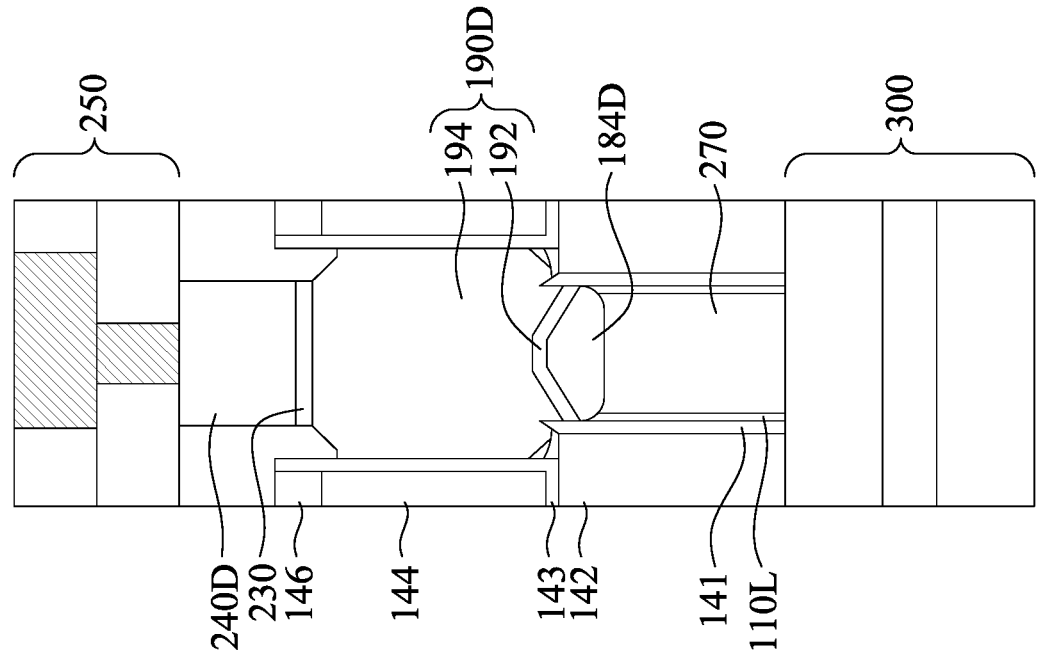

FIGS. 27A to 28C illustrate a semiconductor device at various stages of manufacturing in accordance with some embodiments of the present disclosure. FIG. 27A is a perspective view of an integrated circuit structure having multi-gate devices at intermediate stages of a manufacturing method in accordance with some embodiments of the present disclosure. FIGS. 27B and 28A are cross-sectional views of the integrated circuit structure at intermediate stages of the manufacturing method along a first cut (e.g., cut X-X in FIG. 27A), which is along a lengthwise direction of the channel and perpendicular to a top surface of the substrate. FIGS. 27C and 28B are cross-sectional views of the integrated circuit structure at intermediate stages of the manufacturing method along a second cut (e.g., cut Y1-Y1 in FIG. 27A), which is in the source region and perpendicular to the lengthwise direction of the channel. FIGS. 27D and 28C are cross-sectional views of the integrated circuit structure at intermediate stages of the manufacturing method along a second cut (e.g., cut Y2-Y2 in FIG. 27A), which is in the drain region and perpendicular to the lengthwise direction of the channel.

It is understood that additional operations can be provided before, during, and after processes shown by FIGS. 27A to 28C, and some of the operations described below can be replaced or eliminated, for additional embodiments of the method. The order of the operations/processes may be interchangeable. The same or similar configurations, materials, processes and/or operation as described with FIGS. 1-26 may be employed in the following embodiments, and the detailed explanation may be omitted. One of the differences between the present embodiments and the embodiments of FIGS. 1-26 is the configuration of the sacrificial epitaxial plugs 182, the epitaxial features 184S and 184D, and the source and drain epitaxial structures 190S and 190D.

FIGS. 27A to 27D illustrate a semiconductor device after the formation of the source/drain epitaxial structures 190S/190D, as the step illustrated in FIG. 14. The sacrificial epitaxial plugs 182 may have a width greater than a fin width of the semiconductor fins 130 due to the recess deepening process (as illustrated in FIG. 11). For example, the recess deepening process may remove a portion of the STI features 142 adjacent to the recess RS, thereby expanding the recess RS.

In the present embodiments, referring to FIG. 27B, the epitaxial features 184S and 184D have a concave top surface along the lengthwise direction of the channel, and the source and drain epitaxial structures 190S and 190D also have a concave top surface along the lengthwise direction of the channel. Referring to FIGS. 27C and 27D, the epitaxial features 184S and 184D have a convex top surface along the direction perpendicular to the lengthwise direction of the channel, and the source and drain epitaxial structures 190S and 190D also have a convex top surface along the direction perpendicular to the lengthwise direction of the channel.

In the present embodiments, dielectric liners 141 may be formed prior to the formation of the STI features 142. Therefore, the dielectric liners 141 may respectively surround the STI features 142. In the present embodiments, native oxides 110L may be formed prior to the formation of the dielectric liners 141, and the native oxides 110L may be between the dielectric liners 141 and substrate 110. In the present embodiments, dielectric liners 143 may be formed prior to the formation of the dielectric fin structures 144 and mask layers 146. Therefore, the dielectric liners 143 may respectively surround the dielectric fin structures 144 and mask layers 146.

Figure 28B:
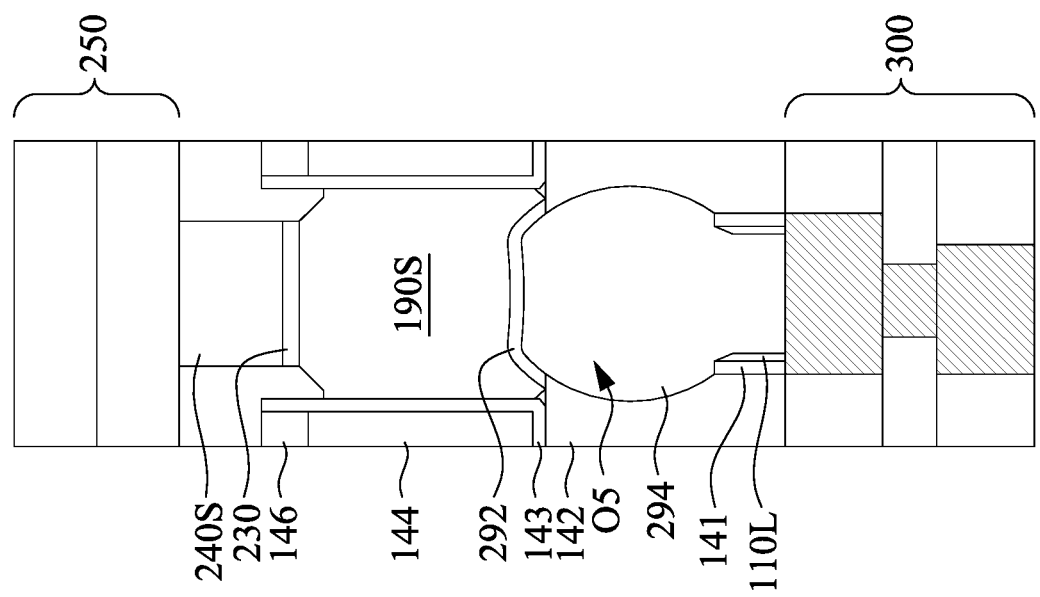

Referring to FIGS. 28A to 28C, the dummy gate structures 150 (as shown in FIGS. 27A to 27B) are removed first, and then the sacrificial layers 122 (as shown in FIG. 27B) are removed. Subsequently, replacement gate structures 220 are respectively formed in the gate trenches GT and openings O1 to surround each of the channel layers 124 suspended. As aforementioned, the replacement gate structures 220 may include a interfacial layer 222 formed around the channel layers 124, a high-k dielectric layer 224 formed around the interfacial layer 222, a work function metal layer 226 formed around the high-k dielectric layer 224, and a fill metal 228 formed around the work function metal layer 226 and filling a remainder of gate trenches GT.

Drain contacts 240D and dummy source contacts 240S may be respectively formed over the epitaxial structures 190D and 190S, and then a front-side multilayer interconnection (MLI) structure 250 is formed over the substrate 110. The dummy source contacts 240S are not connected with a metallization pattern in the front-side MLI structure 250. In some embodiments, dummy source contacts 240S may be omitted. The substrate 110 is then replaced with a backside ILD layer 270. The sacrificial epitaxial plugs 182 and the epitaxial features 184S (as shown in FIGS. 27A to 27C) are removed to form backside via openings O5, and backside vias 294 are formed in the backside via openings O5.

In some embodiments, since the backside via 294 is formed by replacing a germanium-containing feature (e.g., the sacrificial epitaxial plugs 182 and epitaxial features 184S), germanium atoms in the germanium-containing feature may diffuse into the backside ILD layer 270. The diffusion may result in a germanium residue at an interface between the backside via 294 and the backside ILD layer 270, and the germanium residue may be observed or detectable in products. For example, in some embodiments, a germanium atomic concentration in the backside ILD layer 270 may increases as approaching the backside via 294. Also, a germanium residue at an interface between the backside via 294 and the STI features 142 or an interface between the backside via 294 and the dielectric liners 141 may be observed or detectable in products. For example, in some embodiments, a germanium atomic concentration in the STI features 142 and the dielectric liners 141 may increases as approaching the backside via 294.

Subsequently, a backside MLI structure 300 is formed over the backside vias 294 and the backside ILD layer 270. The backside vias 294 is connected with a metallization pattern in the backside MLI structure 300. Other details of the present embodiments are similar to those aforementioned (referring to the embodiments of FIGS. 1 to 26), and therefore not repeated herein.

Figure 29:
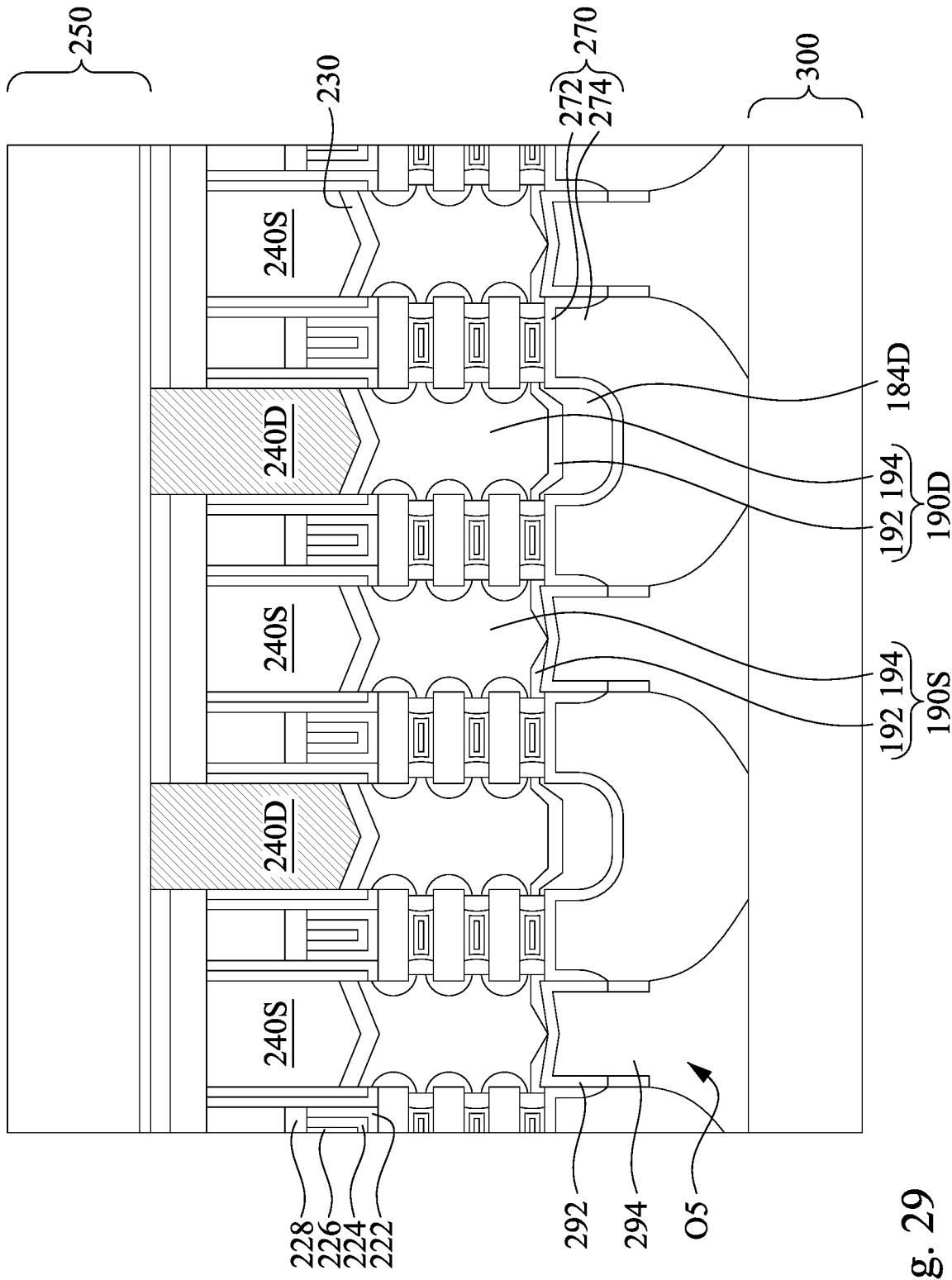
FIG. 29 illustrates a semiconductor device in accordance with some embodiments of the present disclosure.

FIG. 29 illustrates a semiconductor device in accordance with some embodiments of the present disclosure. The present embodiments may be similar as those shown in FIG. 26. One of the differences between the embodiments of FIG. 29 and the embodiments of FIG. 26 is that the backside vias 294 has a larger width facing away from the multi-gate device, and a smaller width facing the multi-gate device.

In some embodiments, the backside ILD layer 270 may include a conformal dielectric layer 272, and a filling dielectric material 274 over the conformal dielectric layer 272. In some embodiments, the conformal dielectric layer 272 of the backside ILD layer 270 is deposited over the sacrificial epitaxial plugs 182 and the epitaxial features 184S and 184D (referring to FIGS. 22 and 23) by using suitable conformal deposition techniques such as ALD or conformal CVD. In some embodiments, the filling dielectric material 274 of the backside ILD layer 270 is deposited over the conformal dielectric layer 272 by using suitable filling deposition techniques such as CVD. In some embodiments, a selective etching process is performed to remove the sacrificial epitaxial plugs 182 and the epitaxial features 184S (referring to FIG. 24) and form the backside via openings O5. The selective etching process may further remove portions of the backside ILD layer 270 (e.g., portions of the conformal dielectric layer 272 and filling dielectric material 274), such that the backside via openings O5 has a larger width facing away from the multi-gate device, and a smaller width facing the multi-gate device. The backside vias 294 are then formed in the backside via openings O5, and therefore have the shapes. In some embodiments, a source silicide region 292 is formed on the backside of each of the source epitaxial structures 190S by using a silicidation process, followed by forming a source contact (e.g., backside vias 294) over the source silicide region 292. Other details of the present embodiments are similar to those aforementioned, and therefore not repeated herein.

FIGS. 30 to 37 illustrate a semiconductor device at various stages of manufacturing in accordance with some embodiments of the present disclosure. It is understood that additional operations can be provided before, during, and after processes shown by FIGS. 30 to 37, and some of the operations described below can be replaced or eliminated, for additional embodiments of the method. The order of the operations/processes may be interchangeable. The same or similar configurations, materials, processes and/or operation as described with FIGS. 1-26 may be employed in the following embodiments, and the detailed explanation may be omitted. One of the differences between the present embodiments and the embodiments of FIGS. 1-26 is that: the multi-gate device is a FinFET in the present embodiments.

Figure 30:
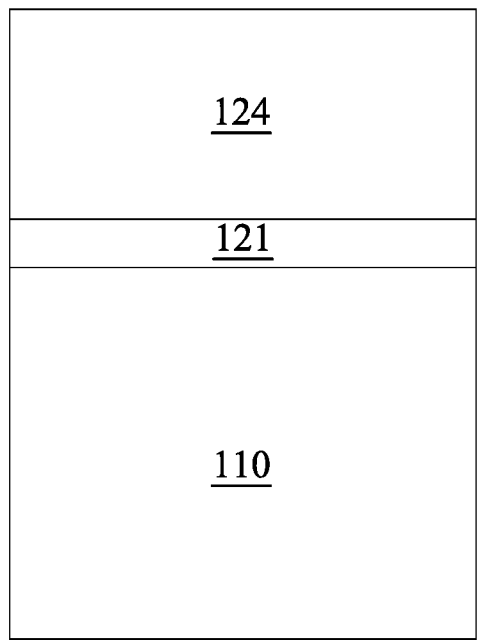
FIGS. 30 to 37 illustrate a semiconductor device at various stages of manufacturing in accordance with some embodiments of the present disclosure.

Referring to FIG. 30, a semiconductor barrier layer 121 and a semiconductor epitaxial layer 124 are formed over a substrate 110. The semiconductor barrier layer 121 and the semiconductor epitaxial layer 124 may include different materials or different compositions, for providing different oxidation rates and/or etch selectivity therebetween. For example, in some embodiments, the semiconductor barrier layer 121 is SiGe and the epitaxial layer 124 is silicon (Si). In some embodiments, the semiconductor barrier layer 121, the semiconductor epitaxial layer 124, and the substrate 110 may be patterned to form a semiconductor fin 130, and STI features may be formed interposing the semiconductor fins 130.

Figure 31:
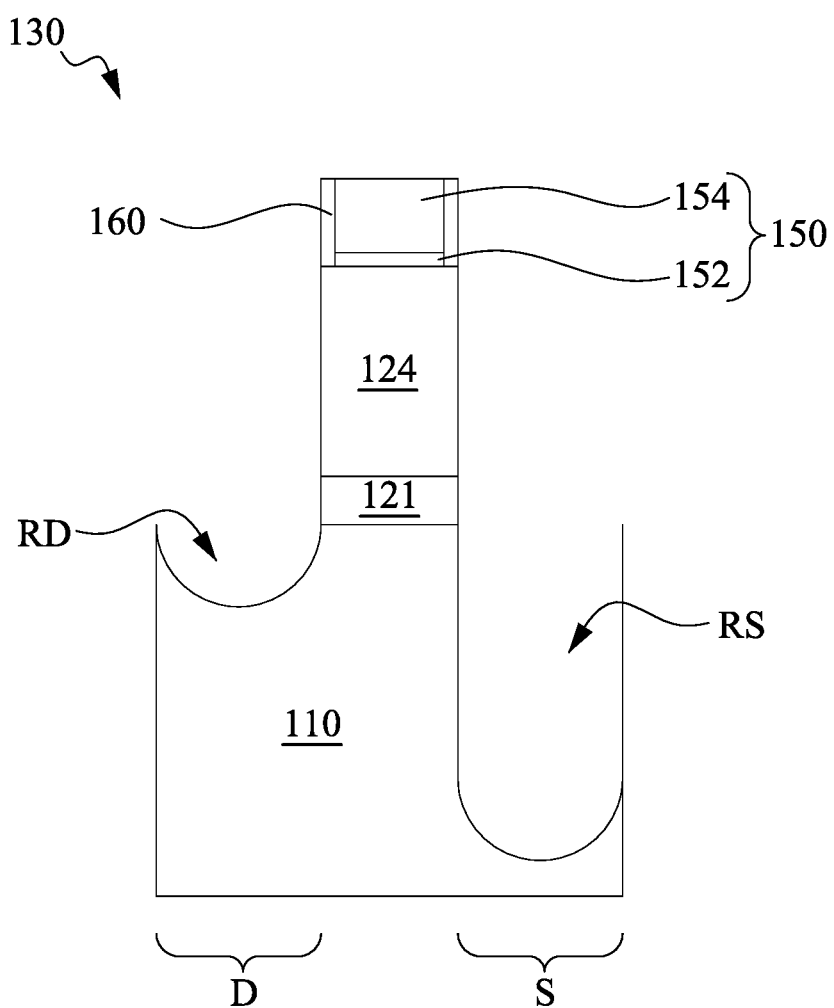

Referring to FIG. 31, a gate structure 150 is formed over a channel portion of the semiconductor fin 130. As aforementioned, the gate structure 150 includes a gate dielectric layer 152 and a gate electrode layer 154 over the gate dielectric layer 152. In some embodiments, the gate structure 150 may further includes a mask layer over the gate electrode layer 154. Gate sidewall spacers 160 are formed on sidewalls of the dummy gate structures 150. Subsequently, source regions S and drain regions D of the semiconductor fin 130 are recessed, thereby forming source-region recesses RS and drain-region recesses RD in the source and drain regions S and D, respectively. The source-region recesses RS may further be recessed and deepened.

Figure 32:
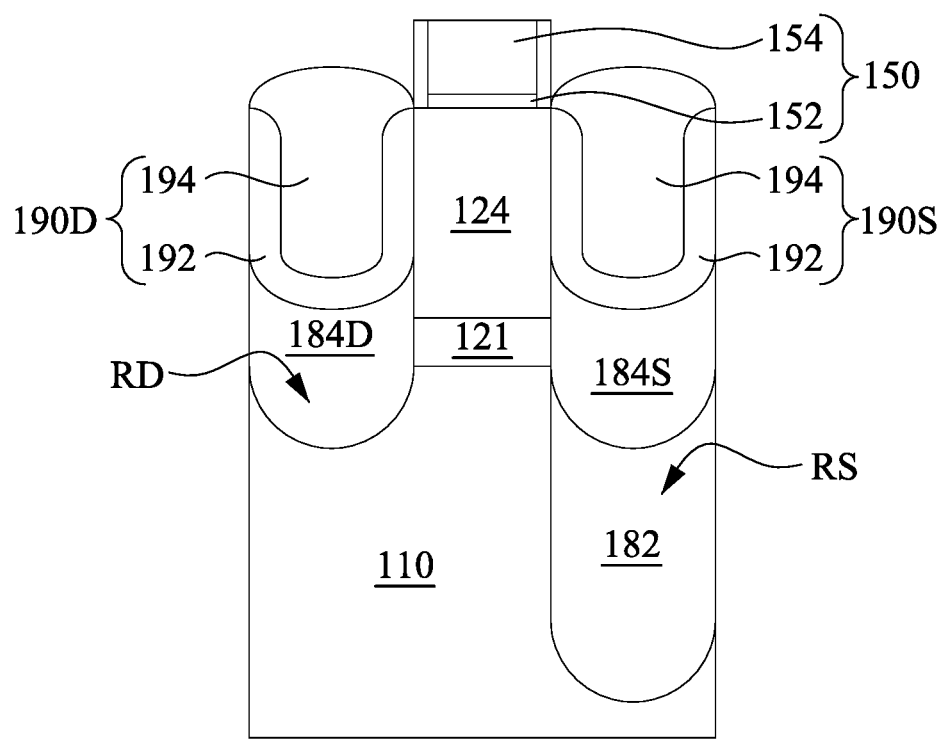

Referring to FIG. 32, a sacrificial epitaxial plug 182 is formed in the source-region recess RS, and then epitaxial features 184S and 184D are formed in the respective source-region recess RS and drain-region recess RD. Subsequently, epitaxial structures 190S and 190D are respectively formed over epitaxial features 184S and 184D. The source/drain epitaxial structures 190S/190D may each include a first epitaxial layer 192 and a second epitaxial layer 194 over the first epitaxial layer 192.

Figure 33:
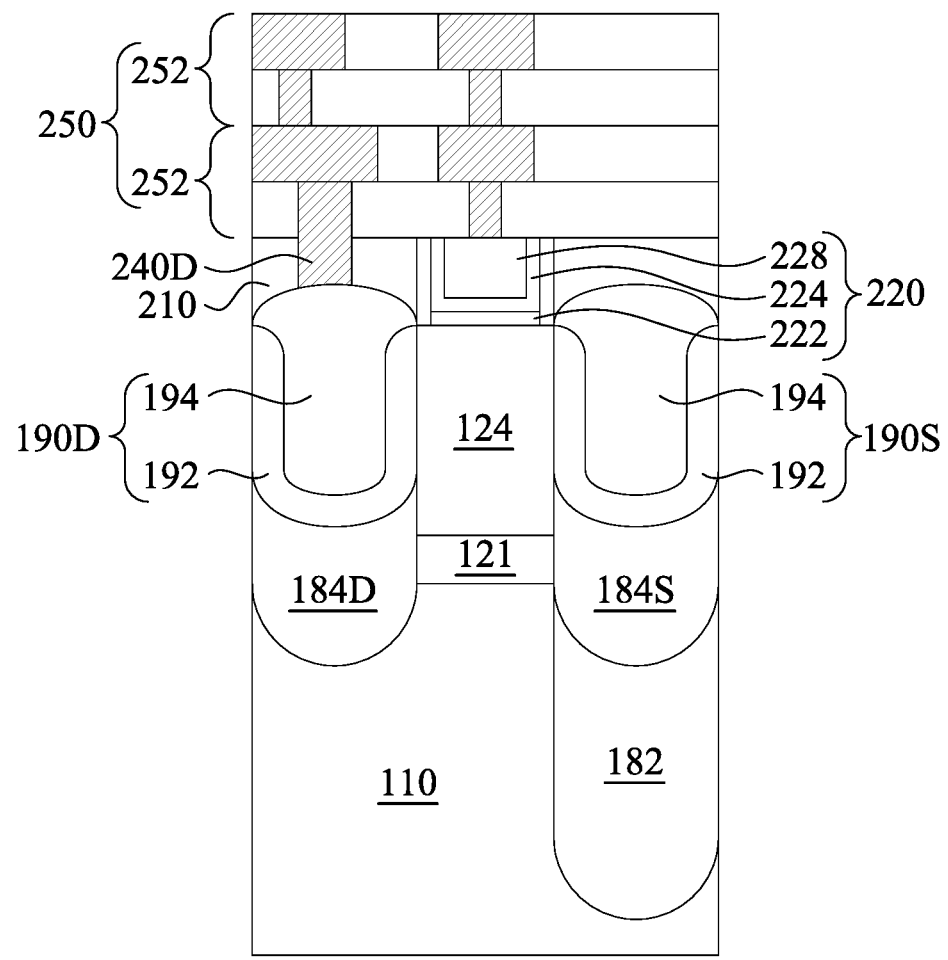

Referring to FIG. 33, a front-side ILD layer 210 is formed on the substrate 110. The dummy gate structures 150 (referring to FIG. 32) are replaced with replacement gate structures 220, in which the replacement gate structures 220 may include a gate interfacial layer 222, a high-k dielectric layer 224, a work function metal layer (not shown), and a fill metal 228. A drain contact 240D is formed over the drain epitaxial structure 190D. A front-side multilayer interconnection (MLI) structure 250 is formed over the substrate 110.

Figure 34:
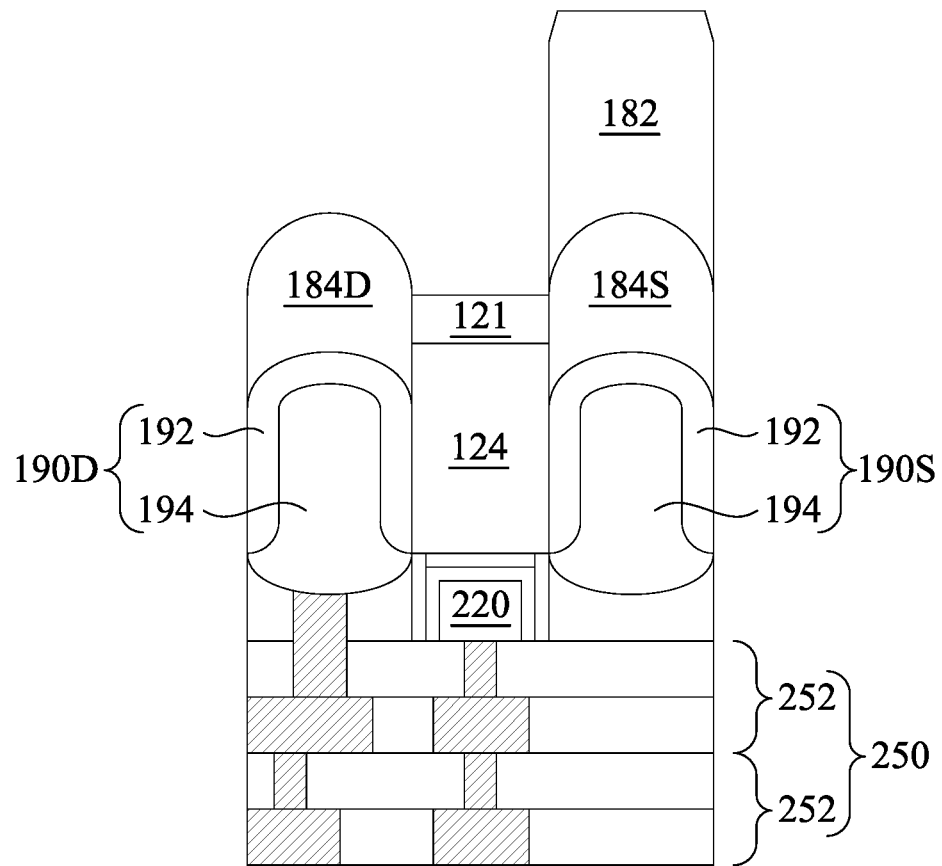

Referring to FIG. 34, the substrate 110 is removed by using a selective etching process that etches Si at a faster etch rate that it etches the sacrificial epitaxial plugs 182 and the semiconductor barrier layer 121.

Figure 35:
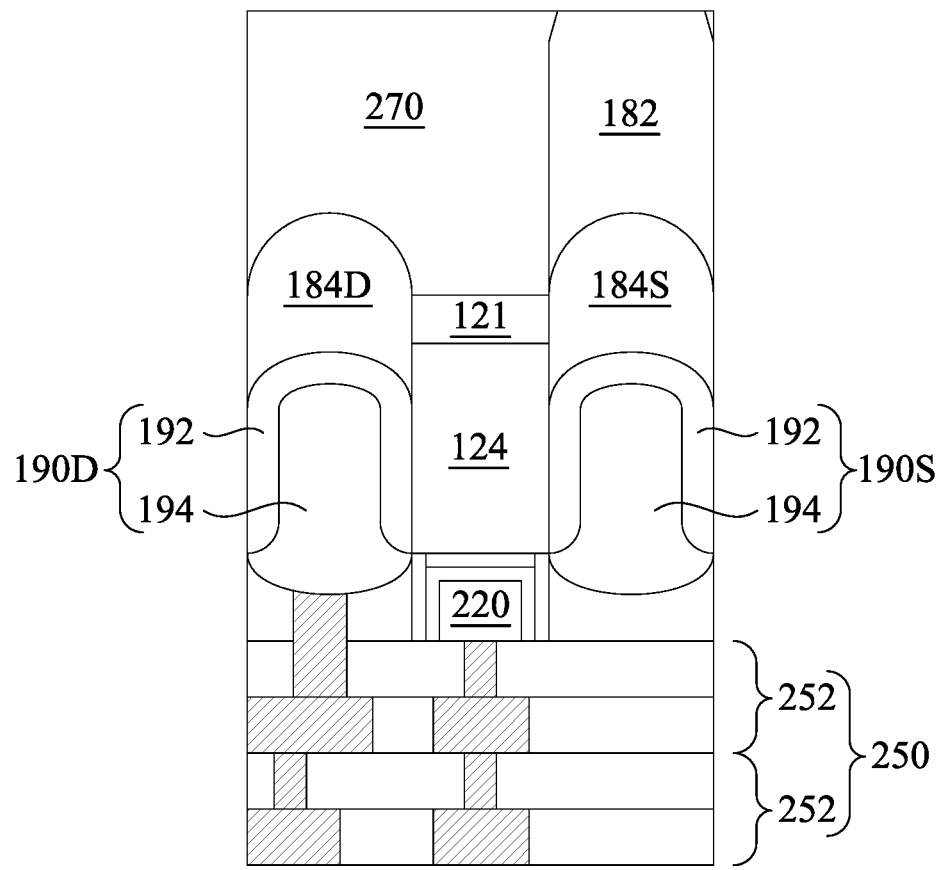

Referring to FIG. 35, a backside ILD layer 270 is formed over and around the sacrificial epitaxial plug 182 and the epitaxial features 184S and 184D. For example, one or more dielectric materials is deposited over the sacrificial epitaxial plugs 182 and the epitaxial features 184S and 184D by using suitable deposition techniques such as a conform deposition technique like CVD. Subsequently, the deposited dielectric material is thinned down by using, for example, an etch back process, a CMP process or the like, until the sacrificial epitaxial plugs 182 are exposed from the backside ILD layer 270.

Figure 36:
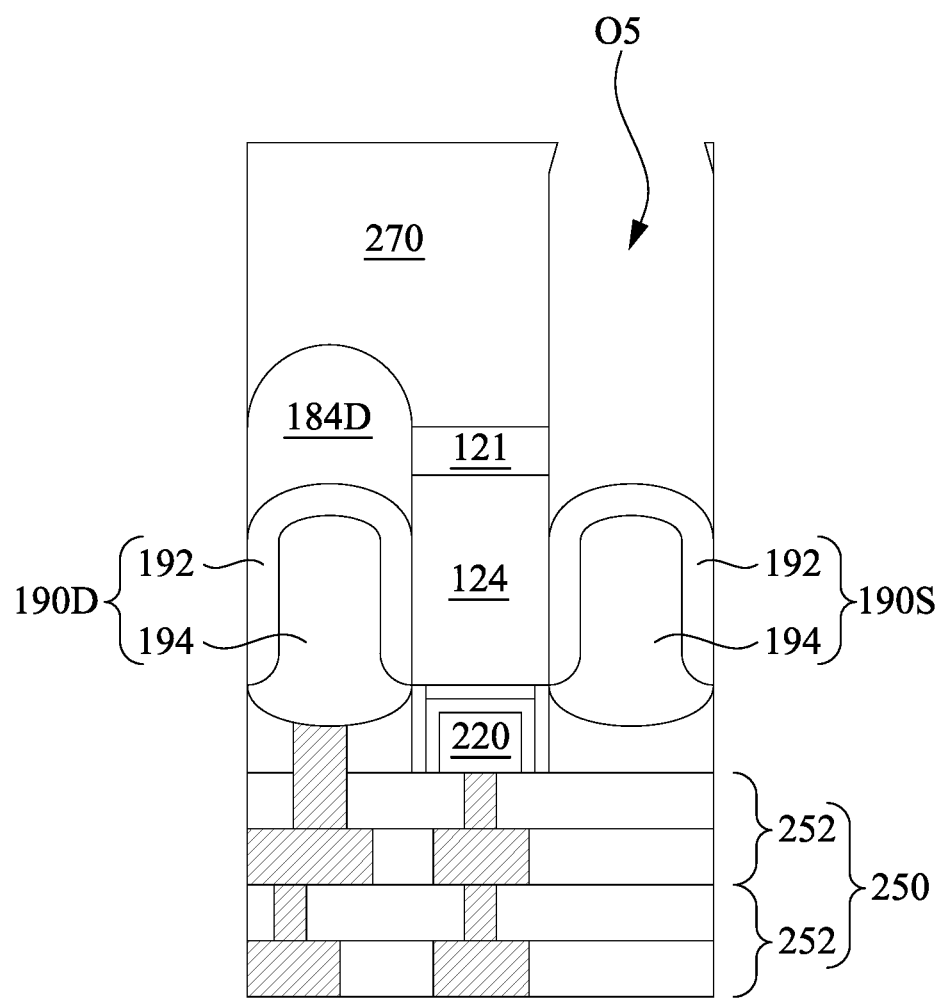

Referring to FIG. 36, the sacrificial epitaxial plugs 182 and the epitaxial features 184S (referring to FIG. 35) are removed to form backside via openings O5 extending through the backside ILD layer 270 to expose backsides of the source epitaxial structures 190S. In some embodiments, the sacrificial epitaxial plugs 182 are removed by using a selective etching process that etches SiGe of the sacrificial epitaxial plugs 182 and the epitaxial features 184S at a faster etch rate than it etches the dielectric material of the backside ILD layer 270.

In the present embodiments, the selective etching process may not etch through the first epitaxial layers 192 of the source epitaxial structures 190S, such that the first epitaxial layers 192 may remain at the backside of the second epitaxial layer 192. In some other embodiments, the selective etching process may etch through and remove the first epitaxial layer 192, such that the backside of the second epitaxial layer 192 is exposed.

Figure 37:
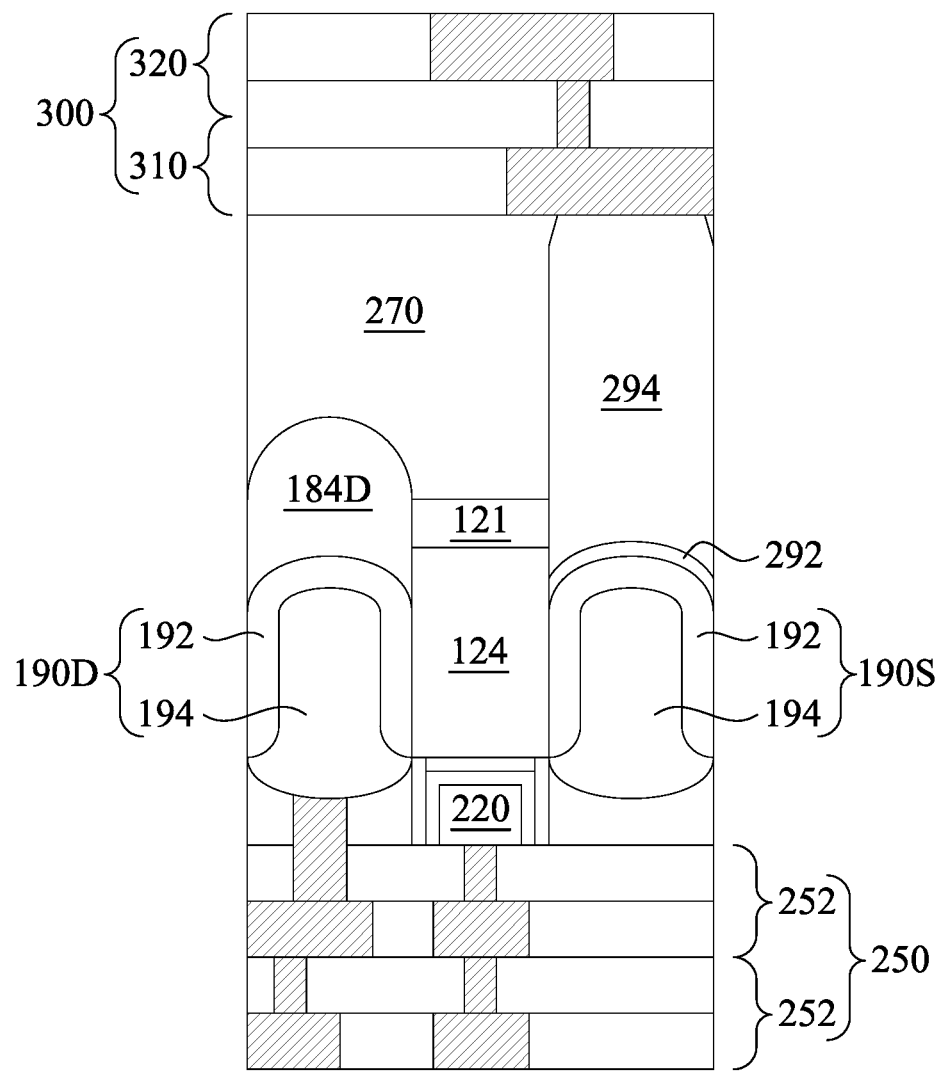

Referring to FIG. 37, backside vias 294 are formed in the backside via openings O5. In some embodiments, a source silicide region 292 is formed on the backside of each of the source epitaxial structures 190S by using a silicidation process, followed by forming a source contact (e.g., backside vias 294) over the source silicide region 292. Subsequently, a backside MLI structure 300 is formed over the backside vias 294 and the backside ILD layer 270. The backside MLI structure 300 may comprise a bottommost metallization layer 310 and a plurality of upper backside metallization layers 320 over the bottommost backside metallization layer 320. The number of upper backside metallization layers 320 may vary according to design specifications of the integrated circuit structure. In the present embodiments, the first epitaxial layer 192 is between the backside of the second epitaxial layer 192 and the source silicide region 292. In some other embodiments, the first epitaxial layer 192 may be omitted, and the source silicide region 292 is in direct contact with the source silicide region 292.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that backside vias and backside metal lines (e.g., backside power rails) can be formed on a backside of transistors, which in turn allows for more routing space and hence higher routing density. Another advantage is that the SiGe layer can be used for stop etching via opening, and the SiGe layer may have a beak portion according to the shape of the recess, which can enlarge etching stop process window. Still another advantage is that a germanium residue around interface between the backside via and the backside ILD layer may be observed in products.

According to some embodiments of the present disclosure, a method for manufacturing an IC structure is provided. The method includes: etching a first recess and a second recess in a substrate; forming a sacrificial epitaxial plug in the first recess in the substrate; forming a first epitaxial feature and a second epitaxial feature respectively in the first recess and the second recess, wherein the first epitaxial feature is over the sacrificial epitaxial plug; forming a first source/drain epitaxial structure and a second source/drain epitaxial structure over the first epitaxial feature and the second epitaxial feature respectively; forming a gate structure laterally between the first source/drain epitaxial structure and the second source/drain epitaxial structure; removing the sacrificial epitaxial plug and the first epitaxial feature to form a backside via opening exposing a backside of the first source/drain epitaxial structure; and forming a backside via in the backside via opening.

According to some embodiments of the present disclosure, a method for manufacturing an IC structure is provided. The method includes: forming a gate structure over a substrate; forming a plurality of spacers on opposite sides of the gate structure; etching a recess in the substrate and a side recess between the substrate and one of the inner spacers; forming a sacrificial epitaxial plug in the recess in the substrate; forming an epitaxial feature over the sacrificial epitaxial plug and filling the side recess; forming a source/drain epitaxial structure over the epitaxial feature; replacing the substrate with a dielectric layer; etching the sacrificial epitaxial plug and the epitaxial feature to form a backside via opening in the dielectric layer; and forming a backside via in the backside via opening.

According to some embodiments of the present disclosure, an IC structure includes a dielectric layer, a semiconductor layer, a gate structure, a first source/drain epitaxial structure, a second source/drain epitaxial structure, a backside via, and an epitaxial feature. The semiconductor layer is over the dielectric layer. The gate structure is over the dielectric layer and the semiconductor layer. The first source/drain epitaxial structure and the second source/drain epitaxial structure are respectively on opposite sides of the gate structure. The backside via extends through the dielectric layer to the first source/drain epitaxial structure. The epitaxial feature is between the second source/drain epitaxial structure and the dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing an integrated circuit (IC) structure, comprising:
    etching a first recess and a second recess in a substrate;
    forming a sacrificial epitaxial plug in the first recess in the substrate;
    forming a first epitaxial feature and a second epitaxial feature respectively in the first recess and the second recess, wherein the first epitaxial feature is over the sacrificial epitaxial plug;
    forming a first source/drain epitaxial structure and a second source/drain epitaxial structure over the first epitaxial feature and the second epitaxial feature respectively;
    forming a gate structure laterally between the first source/drain epitaxial structure and the second source/drain epitaxial structure;
    removing the sacrificial epitaxial plug and the first epitaxial feature to form a backside via opening exposing a backside of the first source/drain epitaxial structure; and
    forming a backside via in the backside via opening.

2. The method of claim 1, further comprising:
    deepening the first recess prior to forming the sacrificial epitaxial plug, such that the first recess is deeper than the second recess.

3. The method of claim 2, wherein deepening the first recess comprises:
    forming a mask layer over the second recess; and
    etching the first recess while the second recess is covered by the mask layer.

4. The method of claim 1, wherein removing the sacrificial epitaxial plug and the first epitaxial feature comprises:
    performing a selective etching process that etches the first epitaxial feature at a slower etch rate than etching the sacrificial epitaxial plug.

5. The method of claim 1, wherein forming the first epitaxial feature and the second epitaxial feature is performed such that the first epitaxial feature and the second epitaxial feature have a germanium atomic percentage different than the sacrificial epitaxial plug.

6. The method of claim 1, wherein removing the sacrificial epitaxial plug and the first epitaxial feature is performed such that the second epitaxial feature is not removed.

7. The method of claim 1, wherein forming the first epitaxial feature and the second epitaxial feature is performed such that the first epitaxial feature has a body portion in the first recess and a beak portion connected with the body portion, and the beak portion tapers away from the body portion.

8. The method of claim 1, further comprising:
    replacing the substrate with a dielectric layer prior to removing the sacrificial epitaxial plug and the first epitaxial feature, wherein removing the sacrificial epitaxial plug and the first epitaxial feature is performed such that the backside via opening is formed in the dielectric layer.

9. The method of claim 8, further comprising:
    planarizing the dielectric layer until the sacrificial epitaxial plug is exposed from the dielectric layer prior to removing the sacrificial epitaxial plug and the first epitaxial feature.

10. The method of claim 8, wherein removing the sacrificial epitaxial plug and the first epitaxial feature comprises a selective etching process that etches the sacrificial epitaxial plug at a faster etch rate than etching the dielectric layer.

11. The method of claim 8, wherein forming the backside via is performed such that the backside via has a portion between the dielectric layer and a spacer on a side of the gate structure.

12. The method of claim 8, wherein replacing the substrate with the dielectric layer comprises:
    removing the substrate such that the sacrificial epitaxial plug and the first epitaxial feature protrude from the backside of the first source/drain epitaxial structure, and the second epitaxial feature protrudes from a backside of the second source/drain epitaxial structure; and
    forming the dielectric layer over the sacrificial epitaxial plug, the first epitaxial feature, and the second epitaxial feature.

13. A method for manufacturing an IC structure, comprising:
    forming a gate structure over a substrate;
    forming a plurality of spacers on opposite sides of the gate structure;
    etching a recess in the substrate and a side recess between the substrate and one of the spacers;
    forming a sacrificial epitaxial plug in the recess in the substrate;
    forming an epitaxial feature over the sacrificial epitaxial plug and filling the side recess;
    forming a source/drain epitaxial structure over the epitaxial feature;

replacing the substrate with a dielectric layer;
etching the sacrificial epitaxial plug and the epitaxial feature to form a backside via opening in the dielectric layer; and
forming a backside via in the backside via opening.

14. The method of claim 13, wherein etching the sacrificial epitaxial plug and the epitaxial feature is performed such that the sacrificial epitaxial plug is etched at a faster etch rate than that of the epitaxial feature.

15. The method of claim 13, wherein forming the epitaxial feature is performed such that the epitaxial feature has a portion between the substrate and said one of the spacers.

16. The method of claim 13, wherein forming the backside via is performed such that the backside via has a portion between the dielectric layer and said one of the spacers.

17. The method of claim 13, further comprising:
replacing the gate structure with a metal gate structure prior to replacing the substrate with the dielectric layer.

18. A method for manufacturing an IC structure, comprising:
forming a gate structure over a substrate;
etching a recess in the substrate adjacent the gate structure;
forming a sacrificial epitaxial plug in the recess in the substrate;
forming a source/drain epitaxial structure over the sacrificial epitaxial plug, wherein the sacrificial epitaxial plug is between the source/drain epitaxial structure and a portion of the substrate in a vertical direction that is normal to a bottommost surface of the substrate;
replacing the gate structure with a metal gate structure; and
replacing the sacrificial epitaxial plug with a backside via.

19. The method of claim 18, further comprising:
replacing the substrate with a dielectric layer prior to replacing the sacrificial epitaxial plug with the backside via.

20. The method of claim 18, wherein the sacrificial epitaxial plug comprises SiGe, and the source/drain epitaxial structure is a n-type feature.

* * * * *